United States Patent
Shinohara et al.

(10) Patent No.: US 10,432,225 B2
(45) Date of Patent: Oct. 1, 2019

(54) DATA PROCESSING DEVICE AND DATA PROCESSING METHOD USING LOW DENSITY PARITY CHECK ENCODING FOR DECREASING SIGNAL-TO-NOISE POWER RATIO

(71) Applicant: SATURN LICENSING LLC, New York, NY (US)

(72) Inventors: Yuji Shinohara, Kanagawa (JP); Makiko Yamamoto, Tokyo (JP)

(73) Assignee: SATURN LICENSING LLC, New York, NY (US)

( * ) Notice: Subject to any disclaimer, the term of this patent is extended or adjusted under 35 U.S.C. 154(b) by 0 days.

(21) Appl. No.: 15/965,444

(22) Filed: Apr. 27, 2018

(65) Prior Publication Data

US 2018/0294822 A1 Oct. 11, 2018

Related U.S. Application Data

(63) Continuation of application No. 14/412,718, filed as application No. PCT/JP2014/064672 on Jun. 3, 2014, now abandoned.

(30) Foreign Application Priority Data

Jun. 12, 2013 (JP) ................................ 2013-124187

(51) Int. Cl.
*H03M 13/11* (2006.01)
*H03M 13/00* (2006.01)
(Continued)

(52) U.S. Cl.
CPC ....... *H03M 13/118* (2013.01); *H03M 13/036* (2013.01); *H03M 13/1165* (2013.01);
(Continued)

(58) Field of Classification Search
CPC ........... H03M 13/036; H03M 13/1102; H03M 13/116; H03M 13/1165; H03M 13/118;
(Continued)

(56) References Cited

U.S. PATENT DOCUMENTS 8,949,691 B2   2/2015  Shinohara et al.
2010/0275100 A1*  10/2010  Yokokawa ............ H04L 1/0057
                                                             714/763
(Continued)

FOREIGN PATENT DOCUMENTS

CN        1947368 A      4/2007
CN     101911505 A     12/2010
(Continued)

OTHER PUBLICATIONS

U.S. Appl. No. 13/818,709, filed Jun. 7, 2013, 2013-0254617, Shinohara, et al.
(Continued)

*Primary Examiner* — Kyle Vallecillo
(74) *Attorney, Agent, or Firm* — Oblon, McClelland, Maier & Neustadt, L.L.P.

(57) ABSTRACT

The present technology relates to a data processing apparatus and a data processing method that are able to provide an LDPC code with a good error rate.
An LDPC encoder performs coding by an LDPC code having a code length of 16200 bits and a code rate of 12/15. The LDPC code includes an information bit and a parity bit, and a parity check matrix H is configured with an information matrix portion corresponding to the information bit of the LDPC code and a parity matrix portion corresponding to the parity bit. An information matrix portion of the parity check matrix H is represented by a parity check matrix initial value table representing a position of an element of 1 in the information matrix portion at an interval of 360 columns. The present technology may be applied to a case of performing an LDPC coding and an LDPC decoding.

19 Claims, 53 Drawing Sheets

(51) Int. Cl.
| | | |
|---|---|---|
| *H03M 13/29* | (2006.01) | |
| *H03M 13/27* | (2006.01) | |
| *H03M 13/25* | (2006.01) | |
| *H03M 13/03* | (2006.01) | |
| *H03M 13/35* | (2006.01) | |
| *H04L 1/00* | (2006.01) | |
| *H03M 13/15* | (2006.01) | |

(52) U.S. Cl.
CPC ....... *H03M 13/255* (2013.01); *H03M 13/271* (2013.01); *H03M 13/2707* (2013.01); *H03M 13/2906* (2013.01); *H03M 13/356* (2013.01); *H03M 13/616* (2013.01); *H03M 13/6552* (2013.01); *H04L 1/0057* (2013.01); *H03M 13/152* (2013.01); *H04L 1/0071* (2013.01)

(58) Field of Classification Search
CPC ............. H03M 13/152; H03M 13/255; H03M 13/2707; H03M 13/271; H03M 13/2906; H03M 13/356; H03M 13/616; H03M 13/6552; H04L 1/0057; H04L 1/0071
See application file for complete search history.

(56) References Cited

U.S. PATENT DOCUMENTS

| | | | |
|---|---|---|---|
| 2010/0299572 | A1 | 11/2010 | Yokokawa et al. |
| 2013/0216001 | A1 | 8/2013 | Petrov |
| 2013/0227378 | A1 | 8/2013 | Yamamoto et al. |
| 2013/0254617 | A1 | 9/2013 | Shinohara et al. |
| 2013/0290816 | A1 | 10/2013 | Shinohara et al. |
| 2013/0297992 | A1 | 11/2013 | Yamamoto et al. |
| 2013/0305113 | A1 | 11/2013 | Shinohara et al. |
| 2013/0311850 | A1 | 11/2013 | Shinohara et al. |
| 2014/0040707 | A1 | 2/2014 | Shinohara et al. |
| 2014/0047295 | A1 | 2/2014 | Shinohara et al. |
| 2014/0082452 | A1 | 3/2014 | Shinohara et al. |
| 2015/0046765 | A1 | 2/2015 | Shinohara et al. |
| 2015/0046766 | A1 | 2/2015 | Shinohara et al. |
| 2015/0318868 | A1* | 11/2015 | Shinohara .......... H03M 13/2707 714/776 |
| 2016/0197625 | A1* | 7/2016 | Shinohara .......... H03M 13/1165 714/776 |
| 2016/0233889 | A1* | 8/2016 | Shinohara .......... H03M 13/1165 |

FOREIGN PATENT DOCUMENTS

| | | |
|---|---|---|
| CN | 101874352 B | 4/2013 |
| EP | 2 214 318 A1 | 8/2010 |
| EP | 2 560 310 A1 | 2/2013 |
| JP | 2011-176645 | 9/2011 |
| JP | 2011-176783 | 9/2011 |
| JP | 2012-235268 A | 11/2012 |
| JP | 6267655 B2 | 1/2018 |
| KR | 10-2010-0096098 | 9/2010 |
| KR | 10-2010-0096102 | 9/2010 |
| WO | WO 2012/090882 A1 | 7/2012 |
| WO | WO 2013/024584 A1 | 2/2013 |

OTHER PUBLICATIONS

U.S. Appl. No. 13/883,118, filed May 2, 2013, 2013-0227378, Yamamoto, et al.

U.S. Appl. No. 13/996,108, filed Jun. 20, 2013, 2013-0297992, Yamamoto, et al.

U.S. Appl. No. 13/997,695, filed Jun. 25, 2013, 2013-0290816, Shinohara, et al.

U.S. Appl. No. 13/997,853, filed Jun. 25, 2013, 2013-0305113, Shinohara, et al.

U.S. Appl. No. 13/982,494, filed Jul. 30, 2013, 2013-0311850, Shinohara, et al.

U.S. Appl. No. 14/111,045, filed Oct. 10, 2013, 2014-0040707, Shinohara, et al.

U.S. Appl. No. 14/112,972, filed Oct. 21, 2013, 2014-0047295, Shinohara, et al.

U.S. Appl. No. 14/386,868, filed Sep. 22, 2014, 2015-0046766, Shinohara, et al.

U.S. Appl. No. 14/386,830, filed Sep. 22, 2014, 2015-0046765, Shinohara, et al.

U.S. Appl. No. 14/116,231, filed Nov. 7, 2013, 2014-0082452, Shinohara, et al.

U.S. Appl. No. 14/760,658, filed Jul. 13, 2015, Shinohara, et al.

International Search Report dated Aug. 26, 2014 in PCT/JP2014/064672.

"ETSI EN 302 307", Digital Video Broadcasting (DVB); Second generation framing structure, channel coding and modulation systems for Broadcasting, Interactive Services, News Gathering and other broadband satellite applications (DVB-S2), vol. 1.3.1, 2013, 9 pages.

Xi Huang, et al., "Girth 4 and Low Minimum Weights' Problems of LDPC Codes in DVB-S2 and Solutions" Wireless Communications, Networking and Mobile Computing, 2009, 5 pages.

Fatma A. Newagy, et al., "Novel Technique for Scaling Down LDPC Code Lengths in DVB-T2 Standard" International Conference on Telecommunications and Multimedia (TEMU), 2012, pp. 180-184 and cover page.

Extended European Search Report dated Mar. 15, 2016 in Patent Application No. 14810530.7.

"Digital Video Broadcasting (DVB); Next Generation broadcasting system to Handheld, Physical layer specification (DVB-NGH)", DRAFT ETSI EN 303 105 V1.1.1, EBU-UER Digital Video Broadcasting, XP017840591, pp. 2-300 and cover page.

"New 16k LDPC Codes for DVB-NGH", DVB-NGH, Sony R&D Division, Semiconductor Business Group, XP017832619, 2010, pp. 2-27 and cover page.

"New LDPC Codes and 64APSK Proposal", Sony Corporation, XP017840336, 2013, pp. 1-19 and cover page.

Office Action cited in Korean Application No. 10-2015-7002737 dated Mar. 22, 2017.

Notice of Reasons for Rejection dated Dec. 27, 2018 in corresponding Japanese Patent Application No. 2017-245706 (with English Translation), 4 pages.

"Digital Video Broadcasting (DVB); Second Generation Framing Structure, Channel Coding and Modulation Systems for Broadcasting, Interactive Services, News Gathering and Other Broadband Satellite Applications (DVB-S2)", ETSI EN 302 307 V1.2.1, European Standard (Telecommunications series), Aug. 2009, pp. 1-78.

Office Action dated Oct. 31, 2018 in Chinese Patent Application No. 201480002051.6 with English translation, 30 pages.

* cited by examiner

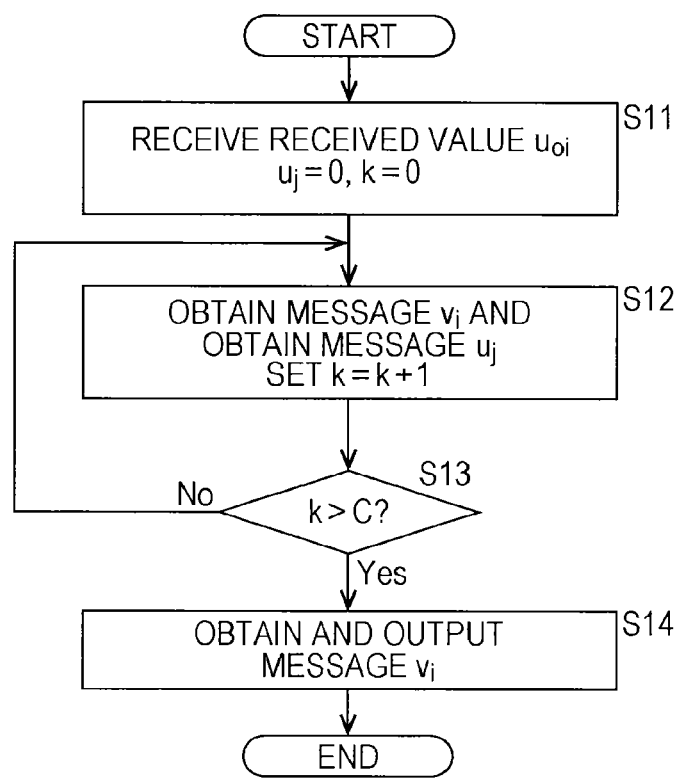

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

PARITY MATRIX $H_T$

FIG. 13

| Nominal CODE RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | — | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

NUMBER OF COLUMNS FOR EACH COLUMN WEIGHT

FIG. 29

| NECESSARY NUMBER mb OF MEMORY COLUMNS | b=1 (FIRST TO THIRD REPLACEMENT METHODS) | b=2 (FOURTH REPLACEMENT METHOD) | WRITE START POSITION OF RESPECTIVE mb COLUMNS ||||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 2 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 7 | 15 | 16 | 20 | 22 | 22 | 27 | 28 | 32 | | | | | | | | | |
| 20 | | 1024QAM | 0 | 1 | 3 | 4 | 5 | 6 | 6 | 9 | 13 | 14 | 14 | 16 | 21 | 21 | 23 | 25 | 26 | 28 | 30 | | | | | |
| 24 | | 4096QAM | 0 | 5 | 8 | 8 | 8 | 8 | 10 | 10 | 10 | 12 | 13 | 16 | 17 | 19 | 22 | 23 | 26 | 37 | 39 | 40 | 41 | 41 | 41 |

FIG. 30

| NECESSARY NUMBER mb OF MEMORY COLUMNS | b=1 (FIRST TO THIRD REPLACEMENT METHODS) | b=2 (FOURTH REPLACEMENT METHOD) | WRITE START POSITION OF RESPECTIVE mb COLUMNS ||||||||||||||||||||||||
|---|---|---|---|---|---|---|---|---|---|---|---|---|---|---|---|---|---|---|---|---|---|---|---|---|
|  |  |  | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK |  | 0 | 0 |  |  |  |  |  |  |  |  |  |  |  |  |  |  |  |  |  |  |  |  |  |  |
| 4 | 16QAM | QPSK | 0 | 2 | 3 | 3 |  |  |  |  |  |  |  |  |  |  |  |  |  |  |  |  |  |  |  |  |
| 6 | 64QAM |  | 0 | 0 | 2 | 3 | 7 | 7 |  |  |  |  |  |  |  |  |  |  |  |  |  |  |  |  |  |  |
| 8 | 256QAM | 16QAM | 0 | 0 | 0 | 1 | 7 | 20 | 20 | 21 |  |  |  |  |  |  |  |  |  |  |  |  |  |  |  |  |
| 10 | 1024QAM |  | 0 | 1 | 2 | 2 | 3 | 3 | 4 | 4 | 5 | 7 |  |  |  |  |  |  |  |  |  |  |  |  |  |  |
| 12 | 4096QAM | 64QAM | 0 | 0 | 0 | 2 | 2 | 2 | 3 | 3 | 3 | 6 | 7 | 7 |  |  |  |  |  |  |  |  |  |  |  |  |
| 20 |  | 1024QAM | 0 | 0 | 0 | 2 | 2 | 2 | 2 | 2 | 5 | 5 | 5 | 5 | 5 | 7 | 7 | 7 | 7 | 8 | 8 | 10 |  |  |  |  |
| 24 |  | 4096QAM | 0 | 0 | 0 | 0 | 0 | 0 | 0 | 1 | 1 | 1 | 2 | 2 | 2 | 3 | 7 | 9 | 9 | 9 | 10 | 10 | 10 | 10 | 10 | 11 |

FIG. 38

ILLUSTRATES ROW NUMBER OF PARITY CHECK MATRIX (CONFIGURATION MATRIX H$_A$)
FOR EVERY 360 COLUMNS FROM FIRST COLUMN

ROW NUMBER OF PARITY CHECK MATRIX →

FIRST COLUMN OF H$_A$ →
361-TH COLUMN OF H$_A$ →
721-TH COLUMN OF H$_A$ →
1081-TH COLUMN OF H$_A$ →

```
0  2084 1613 1548 1286 1460 3196 4297 2481 3369 3451 4620 2622
1  122 1516 3448 2880 1407 1847 3799 3529 373 971 4358 3108
2  259 3399 929 2650 864 3996 3833 107 5287 164 3125 2350
3  342 3529                        ↖h$_{3,5}$
4  4198 2147
5  1880 4836
6  3864 4910
7  243 1542
8  3011 1436
9  2167 2512
10 4606 1003
11 2835 705
12 3426 2365
13 3848 2474
14 1360 1743
0  163 2536
1  2583 1180
2  1542 509
3  4418 1005
4  5212 5117
5  2155 2922
6  347 2696
7  226 4296
8  1560 487
9  3926 1640
10 149 2928
11 2364 563
12 635 688
13 231 1684
14 1129 3894
```

PARITY CHECK MATRIX
INITIAL VALUE TABLE

FIG. 39

```
PARITY CHECK MATRIX INITIAL VALUE TABLE OF
N = 16200 AND r = 12/15
3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060
```

| CODE RATE | MINIMUM CYCLE LENGTH | PERFORMANCE THRESHOLD (Eb/No) |
|---|---|---|
| 12/15 | 6 | 4.269922 |

FIG. 44

| rate | X | KX | Y1 | KY1 | Y2 | KY2 | M |
|---|---|---|---|---|---|---|---|
| 12/15 | 14 | 2160 | 4 | 720 | 3 | 10080 | 3240 |

FIG. 49

DATA PROCESSING DEVICE AND DATA PROCESSING METHOD USING LOW DENSITY PARITY CHECK ENCODING FOR DECREASING SIGNAL-TO-NOISE POWER RATIO

CROSS-REFERENCE TO RELATED APPLICATIONS

The present application is a continuation of U.S. application Ser. No. 14/412,718, filed Jan. 5, 2015 which is based on PCT Application No. PCT/JP2014/064672, filed Jun. 3, 2014, and claims priority to Japanese Patent Application 2013-124187, filed on Jun. 12, 2013, the entire contents of each of which is incorporated herein by reference.

TECHNICAL FIELD

The present technology relates to a data processing apparatus and a data processing method, and in particular, relates to a data processing apparatus and a data processing method which are able to secure good communication quality in data transmission using, for example, an LDPC code.

BACKGROUND ART

A low density parity check (LDPC) code has a high error correction ability, and has been widely adopted in a transmission scheme including digital broadcasting such as, for example, European digital video broadcasting (DVB)-S.2, DVB-T.2, and DVB-C.2 in recent years (for example, see NPL 1).

Recent studies show that the LDPC code has a performance close to the Shannon limit, similar to turbo codes or the like, with an increase in a code length. In addition, since the LDPC code has properties of a minimum distance being proportional to the code length, the LDPC code has an advantage in which a block error probability characteristic is good and a so-called error floor phenomenon observed as a decoding property of the turbo code or the like hardly occurs, as properties.

CITATION LIST

Non Patent Literature

NPL 1: DVB-S.2: ETSI EN 302 307 V1.2.1 (2009-08)

SUMMARY OF INVENTION

Technical Problem

In data transmission using an LDPC code, for example, the LDPC code is formed into a symbol of quadrature modulation (digital modulation) such as quadrature phase shift keying (QPSK) (is symbolized), and the symbol is transmitted by being mapped to the signal point of quadrature modulation.

Such data transmission using the LDPC code becomes widespread worldwide, and securing good communication quality has been requested.

The present technology has been made in view of such circumstances, and an object is to secure good communication quality in data transmission using an LDPC code.

Solution to Problem

A first data processing apparatus/a data processing method of the present technology includes a coding unit/step that encodes an information bit into an LDPC code having a code length of 16200 bits and a code rate of 12/15, based on a parity check matrix of a low density parity check (LDPC) code, in which the LDPC code includes an information bit and a parity bit, the parity check matrix includes an information matrix portion corresponding to the information bit and a parity matrix portion corresponding to the parity bit, the information matrix portion is represented by a parity check matrix initial value table, the parity check matrix initial value table is a table representing positions of elements of 1 in the information matrix portion at an interval of 360 columns, and is 3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060.

In the first data processing apparatus/data processing method, an information bit is encoded into an LDPC code having a code length of 16200 bits and a code rate of 12/15, based on a parity check matrix of a low density parity check (LDPC) code. The LDPC code includes an information bit and a parity bit, the parity check matrix includes an information matrix portion corresponding to the information bit and a parity matrix portion corresponding to the parity bit, the information matrix portion is represented by a parity check matrix initial value table, the parity check matrix initial value table is a table representing positions of elements of 1 in the information matrix portion at an interval of 360 columns, and is 3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060.

A second data processing apparatus/data processing method of the present technology includes a decoding unit/step that decodes an LDPC code which is obtained from data transmitted from a transmission apparatus including a coding unit that encodes an information bit into an LDPC code having a code length of 16200 bits and a code rate of 12/15, based on a parity check matrix of a low density parity check (LDPC) code, in which the LDPC code includes an information bit and a parity bit, the parity check matrix includes an information matrix portion corresponding to the information bit and a parity matrix portion corresponding to the parity bit, the information matrix portion is represented by a parity check matrix initial value table, the parity check matrix initial value table is a table representing positions of elements of 1 in the information matrix portion at an interval of 360 columns, and is 3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060.

In the second data processing apparatus/data processing method, an LDPC code which is obtained from data transmitted from a transmission apparatus is decoded, in which the transmission apparatus includes a coding unit/step that encodes an information bit into an LDPC code having a code length of 16200 bits and a code rate of 12/15, based on a parity check matrix of a low density parity check (LDPC) code, in which the LDPC code includes an information bit and a parity bit, the parity check matrix includes an information matrix portion corresponding to the information bit and a parity matrix portion corresponding to the parity bit, the information matrix portion is represented by a parity check matrix initial value table, the parity check matrix initial value table is a table representing positions of elements of 1 in the information matrix portion at an interval of 360 columns, and is 3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654

678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060.

A third data processing apparatus of the present technology includes a decoding unit that decodes an LDPC code having a code length of 16200 bits and a code rate of 12/15, based on a parity check matrix of a low density parity check (LDPC) code, in which the LDPC code includes an information bit and a parity bit, the parity check matrix includes an information matrix portion corresponding to the information bit and a parity matrix portion corresponding to the parity bit, the information matrix portion is represented by a parity check matrix initial value table, the parity check matrix initial value table is a table representing positions of elements of 1 in the information matrix portion at an interval of 360 columns, and is 3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060.

In the third data processing apparatus, an LDPC code having a code length of 16200 bits and a code rate of 12/15 is decoded, based on a parity check matrix of a low density parity check (LDPC) code. The LDPC code includes an information bit and a parity bit, the parity check matrix includes an information matrix portion corresponding to the information bit and a parity matrix portion corresponding to the parity bit, the information matrix portion is represented by a parity check matrix initial value table, the parity check matrix initial value table is a table representing positions of elements of 1 in the information matrix portion at an interval of 360 columns, and is 3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060.

In addition, the data processing apparatus may be an independent apparatus or may be an internal block configuring one apparatus.

Advantageous Effects of Invention

According to the present invention, it is possible to secure good communication quality in data transmission using an LDPC code.

In addition, the effects described herein are merely illustrative, the effects of the present technology are not intended to be limited to the effects which are described herein, and there may be additional effects.

BRIEF DESCRIPTION OF DRAWINGS

FIG. 1 is a diagram describing a parity check matrix H of an LDPC code.

FIG. 2 is a flowchart illustrating a decoding procedure of the LDPC code.

FIG. 3 is a diagram illustrating an example of a parity check matrix of the LDPC code.

FIG. 13 is a diagram describing the parity check matrix of the LDPC code which is defined in the DVB-S.2 standard.

FIG. 29 is a diagram illustrating the number of columns and an address of a write start position of a memory 31 required for column twist interleave.

FIG. 30 is a diagram illustrating the number of columns and an address of a write start position of the memory 31 required for column twist interleave.

FIG. 38 is a diagram describing a method of obtaining a parity check matrix H from the parity check matrix initial value table.

FIG. 39 is a diagram illustrating an example of a parity check matrix initial value table of a 16k code with r=12/15.

FIG. 44 is a diagram describing a parity check matrix of 16k code with r=12/15.

FIG. 49 is a diagram illustrating an example of a parity check matrix of an LDPC code.

DESCRIPTION OF EMBODIMENTS

Figure 4:
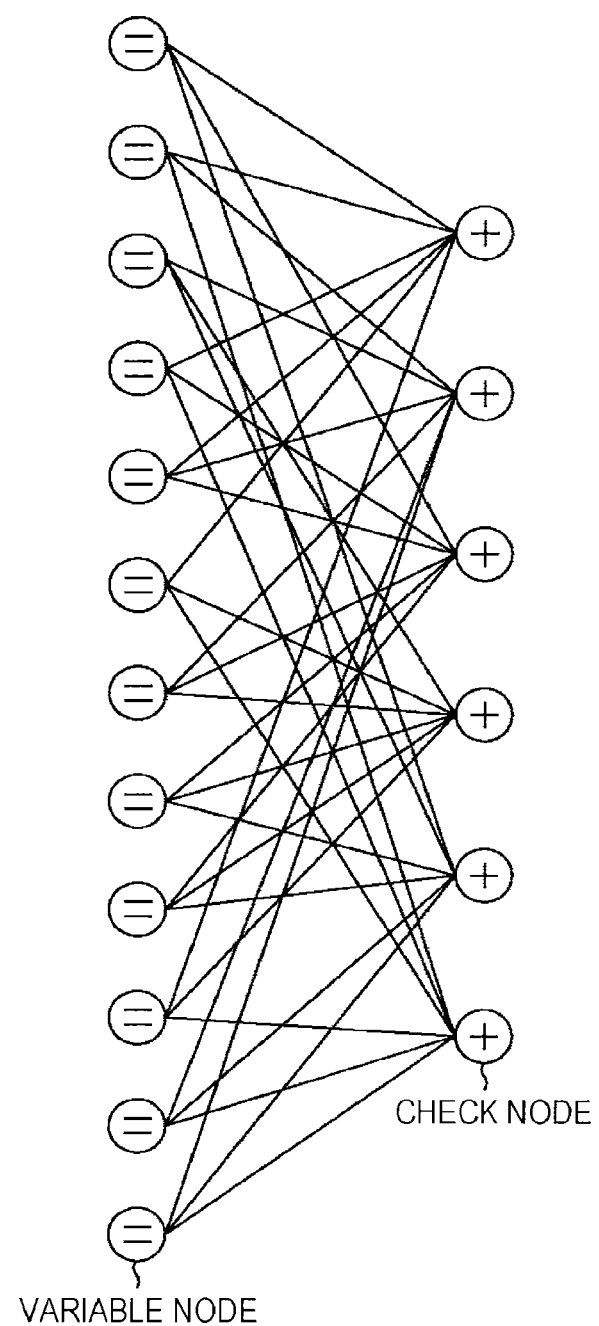
FIG. 4 is a diagram illustrating a Tanner graph of the parity check matrix.

Hereinafter, an LDPC code will be described before a description of embodiments of the present technology.

<LDPC Code>

Further, the LDPC code is a linear code, and does not need to be binary, but here, a description will be given assuming that the LDPC code is binary.

The most significant feature of the LDPC code is that a parity check matrix defining the LDPC code is a sparse matrix. Here, the sparse matrix is a matrix in which the number of "1" elements of the matrix is very small (most elements in the matrix are 0).

FIG. 1 is a diagram illustrating a parity check matrix H of the LDPC code.

In the parity check matrix H of FIG. 1, a weight of each column (a column weight) (the number of "1") (a weight) is set to "3", and a weight of each row (a row weight) is set to "6".

In the coding using the LDPC code (LDPC coding), for example, a generation matrix G is generated based on the parity check matrix H, and a codeword (LDPC code) is generated by multiplying the generation matrix G with a binary information bit.

Specifically, a coding device which performs LDPC coding first calculates a generation matrix G in which an equation $GH^T=0$ is established between the parity check matrix H and the transposed matrix $H^T$ thereof. Here, when the generation matrix G is a K×N matrix, the coding device multiplies a bit sequence (vector u) of an information bit formed of K bits with the generation matrix G so as to generate a codeword c (=uG) formed of N bits. The codeword (LDPC code) generated by the coding device is received on the receiving side through a predetermined communication path.

The decoding of the LDPC code is an algorithm that is proposed and referred to as probabilistic decoding by Gallager, and the algorithm may be performed by a message passing algorithm by belief propagation on a so-called Tanner graph which is configured with a variable node (also referred to as a message node) and a check node. Here, hereinafter, as appropriate, the variable node and the check node are simply referred to as a node.

FIG. 2 is a flowchart illustrating a decoding procedure of the LDPC code.

Further, hereinafter, as appropriate, a real number (received LLR), which is obtained by representing the "0" likelihood of a value of the i-th code bit of the LDPC code (1 codeword) received on the receiving side as a log likelihood ratio, is referred to as a received value $u_{0i}$. Further, the message output from the check node is assumed to be $u_j$, and the message output from the variable node is assumed to be $v_i$.

First, in decoding of the LDPC code, as illustrated in FIG. 2, in step S11, the LDPC code is received, the message (check node message) $u_j$ is initialized to "0", a variable k which is an integer as a counter of an iterative process is initialized to "0", and the process proceeds to step S12. In step S12, the message (variable node message) $v_i$ is obtained by performing the calculation (variable node calculation) shown in Equation (1) based on the received value $u_{0i}$ obtained by receiving the LDPC code, and the message $u_j$ is obtained by performing the calculation (check node calculation) shown in Equation (2), based on the message $v_i$.

[Math. 1]

$$v_i = u_{0i} + \sum_{j=1}^{d_v-1} u_j \quad (1)$$

[Math. 2]

$$\tanh\left(\frac{u_j}{2}\right) = \prod_{i=1}^{d_c-1} \tanh\left(\frac{v_i}{2}\right) \quad (2)$$

Here, $d_v$ and $d_c$ in the equation (1) and the equation (2) are respectively parameters indicating the number of "1" in the vertical direction (column) and the horizontal direction (row) of the parity check matrix H, which can be arbitrarily selected. For example, in the case of the LDPC code shown in FIG. 1 in which the column weight is 3 and the row weight is 6 ((3, 6) LDPC code), it is established that $d_v=3$ and $d_c=6$.

In addition, in the variable node calculation of the equation (1) and the check node calculation of the equation (2), a message which is input from an edge (a line connecting the variable node and the check node) from which a message is to be output is not used as a target of calculation, and thus a calculation range is 1 to $d_v-1$ or 1 to $d_c-1$. Further, the check node calculation of the equation (2) is performed actually by previously creating a table of a function $R(v_1, v_2)$ shown in equation (3) which is defined as one output for two inputs $v_1$ and $v_2$ and continuously (recursively) using the table as shown in equation (4).

[Math. 3]

$$x = 2\tanh^{-1}\{\tanh(v_1/2)\tanh(v_2/2)\} = R(v_1, v_2) \quad (3)$$

[Math. 4]

$$u_j = R(v_1, R(v_2, R(v_3, \ldots R(v_{d_c-2}, v_{d_c-1})))) \quad (4)$$

In step S12, the variable k is incremented by "1", and the process proceeds to step S13. In step S13, it is determined whether or not the variable k is greater than a predetermined iterative decoding number C. In step S13, if the variable k is determined not to be greater than C, the process returns to step S12, and the same process is repeated.

Further, in step S13, if the variable k is determined to be greater than C, the process proceeds to step S14, a message $v_i$ as a decoding result to be finally output is obtained and output by performing the calculation shown in the equation (5), and the decoding process of the LDPC code is ended.

[Math. 5]

$$v_i = u_{0i} + \sum_{j=1}^{d_v} u_j \quad (5)$$

Here, the calculation of the equation (5) is different from the variable node calculation of the equation (1), and is performed by using the message $u_j$ from all edges coupled to the variable node.

FIG. 3 is a diagram illustrating an example of a parity check matrix H of (3, 6) LDPC code (code rate of 1/2, code length of 12).

In the parity check matrix H of FIG. 3, a column weight is set to 3 and a row weight is set to 6, similarly to FIG. 1.

FIG. 4 is a diagram illustrating a Tanner graph of the parity check matrix H in FIG. 3.

Here, in FIG. 4, check nodes are indicated by plus "+", and variable nodes are indicated by equal "=". The check nodes and the variable nodes respectively correspond to the rows and the columns of the parity check matrix H. The connection lines between the check nodes and the variable nodes are edges, and the edges corresponds to "1" elements in the parity check matrix.

In other words, if the element in the j-th row and the i-th column of the parity check matrix is 1, in FIG. 4, the i-th variable node (node of "=") from the top and the j-th and the check node (node of "+") from the top are coupled by an edge. The edge represents that the code bit corresponding to the variable node has constraints corresponding to the check node.

In a sum product algorithm which is a decoding method of the LDPC code, the variable node calculation and the check node calculation are repeatedly performed.

Figure 5:
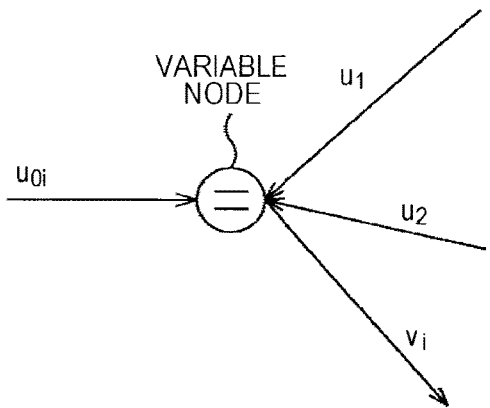
FIG. 5 is a diagram illustrating a variable node.

FIG. 5 is a diagram illustrating a variable node calculation performed at a variable node.

In the variable node, a message $v_1$ corresponding to an edge to be calculated is obtained by the variable node calculation of equation (1) using messages $u_1$ and $u_2$ from the remaining edges which are connected to the variable node and a received value $u_{0i}$. The messages corresponding to other edges are obtained in the same manner.

Figure 6:
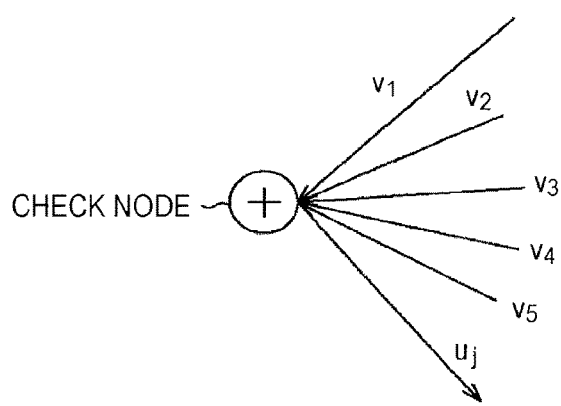
FIG. 6 is a diagram illustrating a check node.

FIG. 6 is a diagram illustrating a check node calculation performed at the check node.

Here, the check node calculation of the equation (2) may be rewritten into an equation (6) by using a relationship of an equation $a \times b = \exp\{\ln(|a|) + \ln(|b|)\} \times \text{sign}(a) \times \text{sign}(b)$. Here, $\text{sign}(x)$ is 1 when $x \geq 0$, and $\text{sign}(x)$ is $-1$ when $x < 0$.

[Math. 6]

$$u_j = 2\tanh^{-1}\left(\prod_{i=1}^{d_c-1} \tanh\left(\frac{v_i}{2}\right)\right) \quad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

When $x \geq 0$, if a function $\varphi(x)$ is defined as an equation $\varphi(x) = \text{Ln}(\tan h(x/2))$, it is established that an equation $\varphi^{-1}(x) = 2\tan h^{-1}(e^{-x})$, such that the equation (6) can be deformed to the equation (7).

[Math. 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

In the check node, the check node calculation of the equation (2) is performed according to the equation (7).

In other words, in the check node, as illustrated in FIG. 6, a message $U_j$ corresponding to an edge to be calculated is obtained by the check node calculation of the equation (7) using messages $v_1$, $v_2$, $v_3$, $v_4$, and $v_5$ from the remaining edges which are connected to the check node. The messages corresponding to other edges are obtained in the same manner.

In addition, a function $\varphi(x)$ of the equation (7) can be represented as an equation $\varphi(x) = \ln((e^x+1)/(e^x-1))$, when $x > 0$, $\varphi(x) = \varphi^{-1}(x)$. When the functions $\varphi(x)$ and $\varphi^{-1}(x)$ are implemented in hardware, the functions may be implemented by using look up tables (LUTs) in some cases, but the LUTs are the same.

<Configuration Example of Transmission System to which the Present Technology is Applied>

Figure 7:
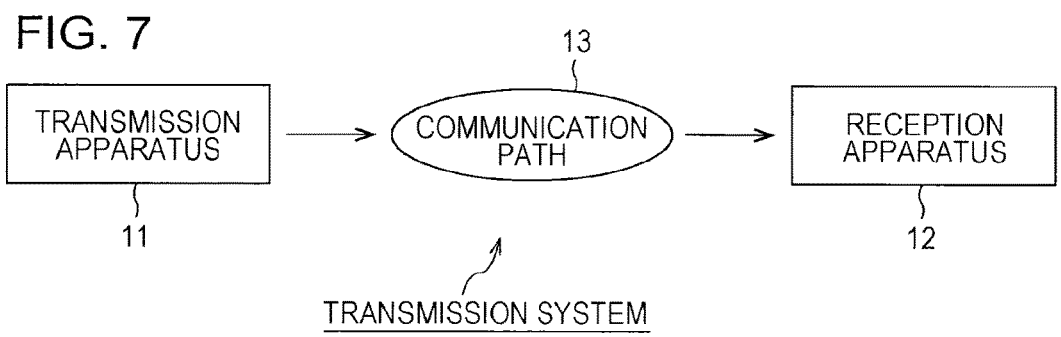
FIG. 7 is a diagram illustrating a configuration example of an embodiment of a transmission system to which the present technology is applied.

FIG. 7 is a diagram illustrating a configuration example of an embodiment of a transmission system to which the present technology is applied (the system refers to those in which a plurality of devices are assembled logically, and it does not matter whether the constituent devices are in the same housing).

In FIG. 7, the transmission system includes a transmission apparatus 11 and a reception apparatus 12.

The transmission apparatus 11 performs transmission (broadcasting) (sending) of, for example, programs and the like of television broadcasting. In other words, the transmission apparatus 11 encodes, for example, target data which is a target of transmission such as image data and audio data as a program into an LDPC code, and transmits the encoded target data through a communication path 13 such as, for example, satellite lines, terrestrial waves, cables (wired lines).

The reception apparatus 12 receives the LDPC code which is transmitted from the transmission apparatus 11 through the communication path 13, decodes the LDPC code into target data, and outputs the data.

Here, it has been known that the LDPC code used in the transmission system of FIG. 7 exerts a significantly high capacity in an Additive White Gaussian Noise (AWGN) communication path.

Meanwhile, the communication path 13 may generate a burst error or erasure. For example, in particular, when the communication path 13 is terrestrial waves, in an Orthogonal Frequency Division Multiplexing (OFDM) system, in a multipath environment in which a Desired to Undesired Ratio (D/U) is 0 dB (power of Undesired=echo is equal to power of Desired=main path), the power of a certain symbol becomes 0 (erasure) according to the delay of echo (a path other than the main path).

Further, even in flutter (a communication path in which delay is 0 and an echo due to a dopper frequency is added), if the D/U is 0 dB, the power of all OFDM symbols at a specific time may become 0 (erasure) due to the Doppler frequency.

Further, a burst error may occur due to the status of the wiring from a reception unit (not shown) such as an antenna which receives signals from the transmission apparatus 11 on the reception apparatus 12 to the reception apparatus 12, and the instability of power of the reception apparatus 12.

Meanwhile, in the decoding of the LDPC code, in the column of the parity check matrix H and the variable node corresponding to the code bit of the LDPC code, as illustrated in FIG. 5, since the variable node calculation of the equation (1) with the addition of the code bit (the received value $u_{0i}$ thereof) of the LDPC code is performed, if an error occurs in the code bit used in the variable node calculation, the accuracy of the obtained message is reduced.

Then, in the decoding of the LDPC code, since the check node calculation of the equation (7) in the check node is performed by using the message that is obtained in the variable node that is connected to the check node, if the number of check nodes, in which a plurality of variable nodes connected thereto (code bit of the LDPC code corresponding thereto) simultaneously become error state (including erasure), is increased, the performance of decoding is degraded.

In other words, for example, if two or more of variable nodes connected to the check node are simultaneously erased, the check node returns a message in which a probability of having a value 0 and a probability of having a value 1 are the same in all variable nodes. In this case, the check node that returns the message of the equal probability does not contribute to one decoding process (one set of variable node calculation and check node calculation), as a result, a lot number of iterations of the decoding process is required, the decoding performance is deteriorated, and the power consumption of the reception apparatus 12 that decodes the LDPC code increases.

Thus, the transmission system of FIG. 7 enables improvement in resistance to the burst error and erasure while maintaining the performance at the AWGN communication path (AWGN channel).

<Configuration Example of Transmission Apparatus 11>

Figure 8:
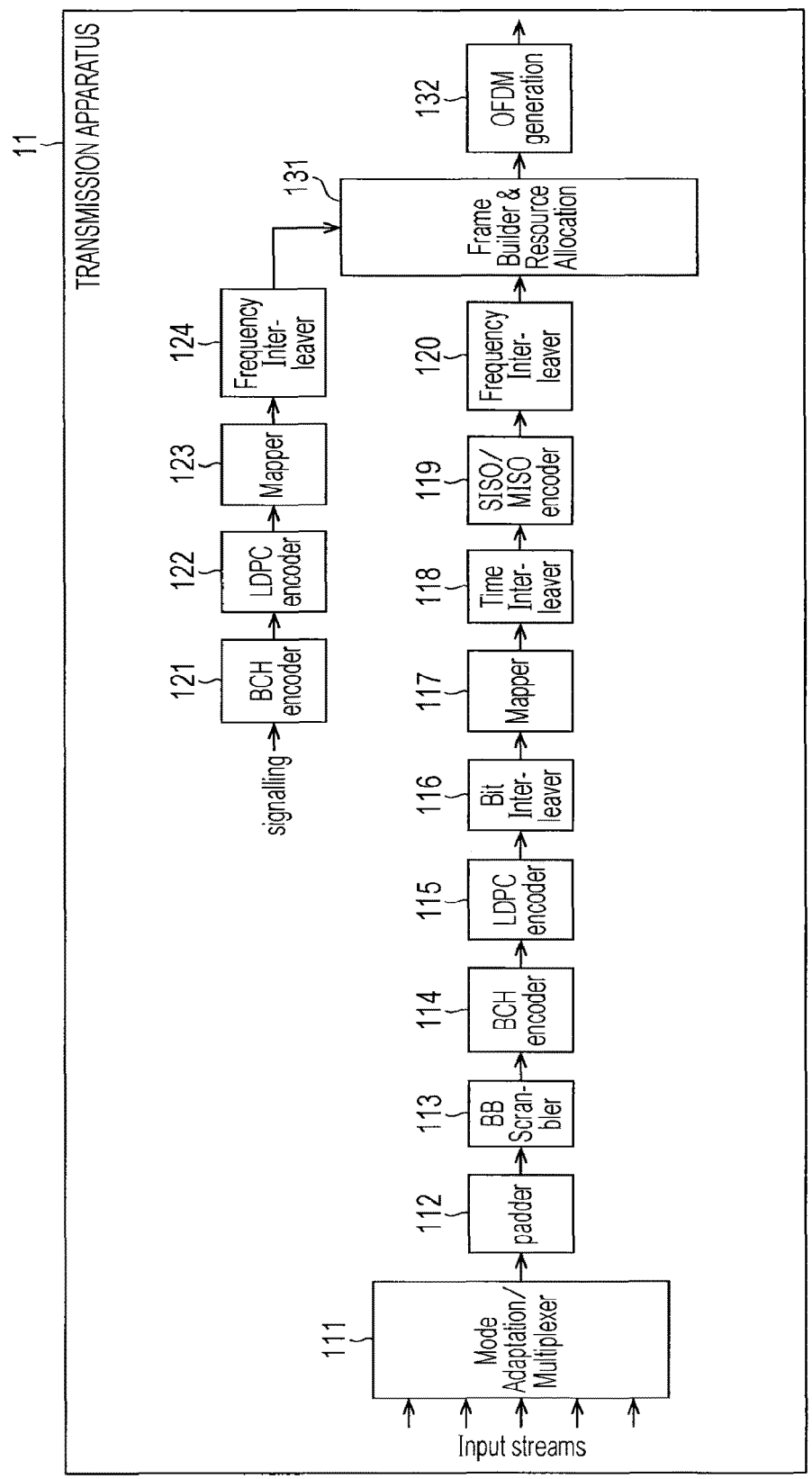
FIG. 8 is a diagram illustrating a configuration example of a transmission apparatus 11.

FIG. 8 is a block diagram illustrating a configuration example of the transmission apparatus 11 in FIG. 7.

In the transmission apparatus 11, input streams of one or more as target data are supplied to a mode adaptation/multiplexer 111.

The mode adaptation/multiplexer 111 performs a process such as mode selection and multiplexing of one or more input streams supplied thereto, as necessary, and supplies the resulting data to a padder 112.

The padder 112 performs necessary zero padding (null insertion) on the data from the mode adaptation/multiplexer 111, and supplies the resulting data to a BB scrambler 113.

The BB scrambler 113 performs Base-Band Scrambling (BB scrambling) on the data from the padder 112, and supplies the resulting data to a BCH encoder 114.

The BCH encoder 114 performs BCH coding on the data from the BB scrambler 113, and supplies the resulting data as the LDPC target data which is the target of LDPC coding, to an LDPC encoder 115.

The LDPC encoder 115 performs LDPC coding according to the parity check matrix in which the parity matrix which is a portion corresponding to parity bits of the LDPC code has a staircase structure, on the LDPC target data from the BCH encoder 114, and outputs the LDPC code with the LDPC target data as an information bit.

In other words, the LDPC encoder 115 performs LDPC coding which encodes the LDPC target data into an LDPC code (corresponding to the parity check matrix) which is defined in predetermined standards such as, for example, DVB-S.2, DVB-T.2, and DVB-C.2, or an LDPC code (corresponding to the parity check matrix) which is determined in advance, and outputs the resulting LDPC code.

Here, the LDPC code which is defined in standards such as DVB-S.2, DVB-T.2, and DVB-C.2 is an Irregular Repeat accumulate (IRA) code, and the parity matrix in the parity check matrix of the LDPC code has a staircase structure. The parity matrix and the stair structure will be described later. Further, the IRA code is described in, for example, "Irregular Repeat-accumulate Codes," H. Jin, A. Khandekar, and R. J. McEliece, in Proceedings of 2nd International Symposium on Turbo codes and Related Topics, pp. 1-8, September 2000.

The LDPC code output from the LDPC encoder 115 is supplied to a bit interleaver 116.

The bit interleaver 116 performs a bit interleave which will be described later, on the LDPC code from the LDPC encoder 115, and supplies the LDPC code after the bit interleave to a mapper 117.

The mapper 117 performs a quadrature modulation (multilevel modulation) by mapping the LDPC code from the bit interleaver 116 to a signal point representing one symbol of the quadrature modulation, in a unit of code bit of one bit or more of the LDPC code (symbol unit).

In other words, the mapper 117 performs quadrature modulation by mapping the LDPC code from the bit interleaver 116 to the signal points which are determined in a modulation scheme which performs the quadrature modulation of the LDPC code, on an IQ plane (IQ constellation) which is defined as an I axis representing an I component which is in-phase with a carrier wave and a Q axis representing a Q component which is orthogonal to the carrier wave.

Here, an example of a modulation scheme of the quadrature modulation performed in the mapper 117 includes for example, a modulation scheme which is defined in standards such as DVB-S.2, DVB-T.2, and DVB-C.2, the other modulation schemes, in other words, for example, binary phase shift keying (BPSK), quadrature phase shift keying (QPSK), 8 phase shift keying (PSK), 16 amplitude phase-shift keying (APSK), 32 APSK, 16 quadrature amplitude modulation (QAM), 64QAM, 256QAM, 1024QAM, 4096QAM, and 4 pulse amplitude modulation (PAM). In the mapper 117, a modulation scheme by which quadrature modulation is performed is set in advance, for example, according to an operator's operation of the transmission apparatus 11.

The data which is obtained by a process in the mapper 117 (a mapping result obtained by mapping a symbol into a signal point) is supplied to a time interleaver 118.

The time interleaver 118 performs time interleave (interleave in a time direction) in a unit of symbol, on the data from the mapper 117, and supplies the resulting data to a Single Input Single Output/Multiple Input Single Output (SISO/MISO) encoder 119.

The SISO/MISO encoder 119 performs space-time coding on the data from the time interleaver 118, and supplies the resulting data to a frequency interleaver 120.

The frequency interleaver 120 performs frequency interleave (interleave in a frequency direction) in a unit of symbol, on the data from the SISO/MISO encoder 119, and supplies the resulting data to a frame builder/resource allocation unit 131.

Meanwhile, for example, control data for transmission control such as Base Band Signaling (BB signaling) (BB Header) is supplied to a BCH encoder 121.

The BCH encoder 121, similarly to the BCH encoder 114, performs BCH coding on the control data supplied thereto, and supplies the resulting data to an LDPC encoder 122.

The LDPC encoder 122, similarly to the LDPC encoder 115, performs LDPC coding on the data from the BCH encoder 121 as the LDPC target data, and supplies the resulting LDPC code to a mapper 123.

The mapper 123, similarly to the mapper 117, performs a quadrature modulation by mapping the LDPC code from the LDPC encoder 122 to a signal point representing one symbol of the quadrature modulation, in a unit of code bit of one bit or more of the LDPC code (symbol unit), and supplies the resulting data to a frequency interleaver 124.

The frequency interleaver 124, similarly to the frequency interleaver 120, performs a frequency interleave in a symbol unit on the data from the mapper 123, and supplies the resulting data to the frame builder/resource allocation unit 131.

The frame builder/resource allocation unit 131 inserts a pilot symbol in a necessary position of data (symbol) from the frequency interleavers 120 and 124, makes a frame formed of symbols of a predetermined number (for example, a Physical Layer (PL) frame, a T2 frame, a C2 frame, and the like) from the resulting data (symbol), and supplies the frame to an OFDM generation unit 132.

The OFDM generation unit 132 generates an OFDM signal corresponding to the frame, from the frame from the frame builder/resource allocation unit 131, and transmits the OFDM signal through the communication path 13 (FIG. 7).

In addition, the transmission apparatus 11 may be configured without providing some of the blocks shown in FIG. 8 such as, for example, the time interleaver 118, the SISO/MISO encoder 119, the frequency interleaver 120, and the frequency interleaver 124.

Figure 9:
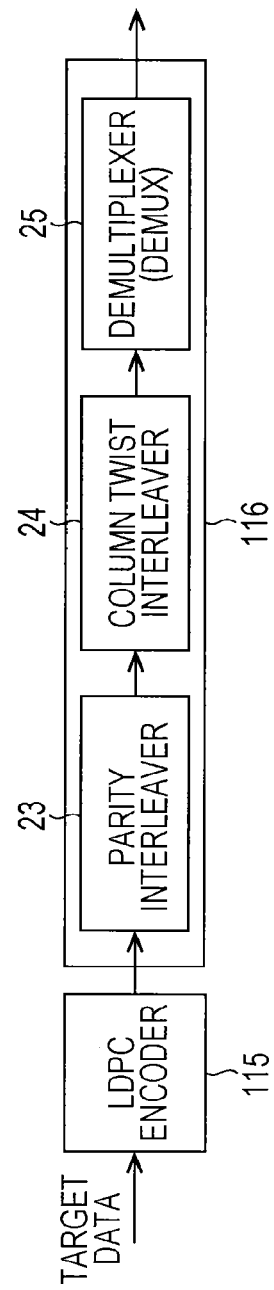
FIG. 9 is a block diagram illustrating a configuration example of a bit interleaver 116.

FIG. 9 illustrates a configuration example of a bit interleaver 116 in FIG. 8.

The bit interleaver 116 has a function of interleaving data, and is configured with a parity interleaver 23, a column twist interleaver 24, and a demultiplexer (DEMUX) 25. In addition, the bit interleaver 116 may be configured without providing one or both of the parity interleaver 23 and the column twist interleaver 24.

The parity interleaver 23 performs parity interleave which interleaves the parity bit of the LDPC code from the LDPC encoder 115 in the position of another parity bit, and supplies the LDPC code after the parity interleave to the column twist interleaver 24.

The column twist interleaver 24 performs the column twist interleave on the LDPC code from the parity interleaver 23, and supplies the LDPC code after the column twist interleave to the demultiplexer 25.

In other words, the LDPC code is transmitted while the code bits of one bit or more of the LDPC code are mapped to a signal point representing one symbol of the quadrature modulation by the mapper 117 in FIG. 8.

In the column twist interleaver 24, for example, a column twist interleave, which will be described later, is performed as a rearrangement process of rearranging the code bits of the LDPC code from the parity interleaver 23 such that a plurality of code bits of an LDPC code corresponding to any 1 in any one row of the parity check matrix used in the LDPC encoder 115 are not included in one symbol.

The demultiplexer 25 obtains an LDPC code having enhanced resistance to AWGN and the like by performing a replacing process of replacing the position of two or more code bits of the LDPC code which is a symbol, on the LDPC code from the column twist interleaver 24. Then, the demultiplexer 25 supplies the two or more code bits of the LDPC code which is obtained by the replacing process, as a symbol, to the mapper 117 (FIG. 8).

Figure 10:
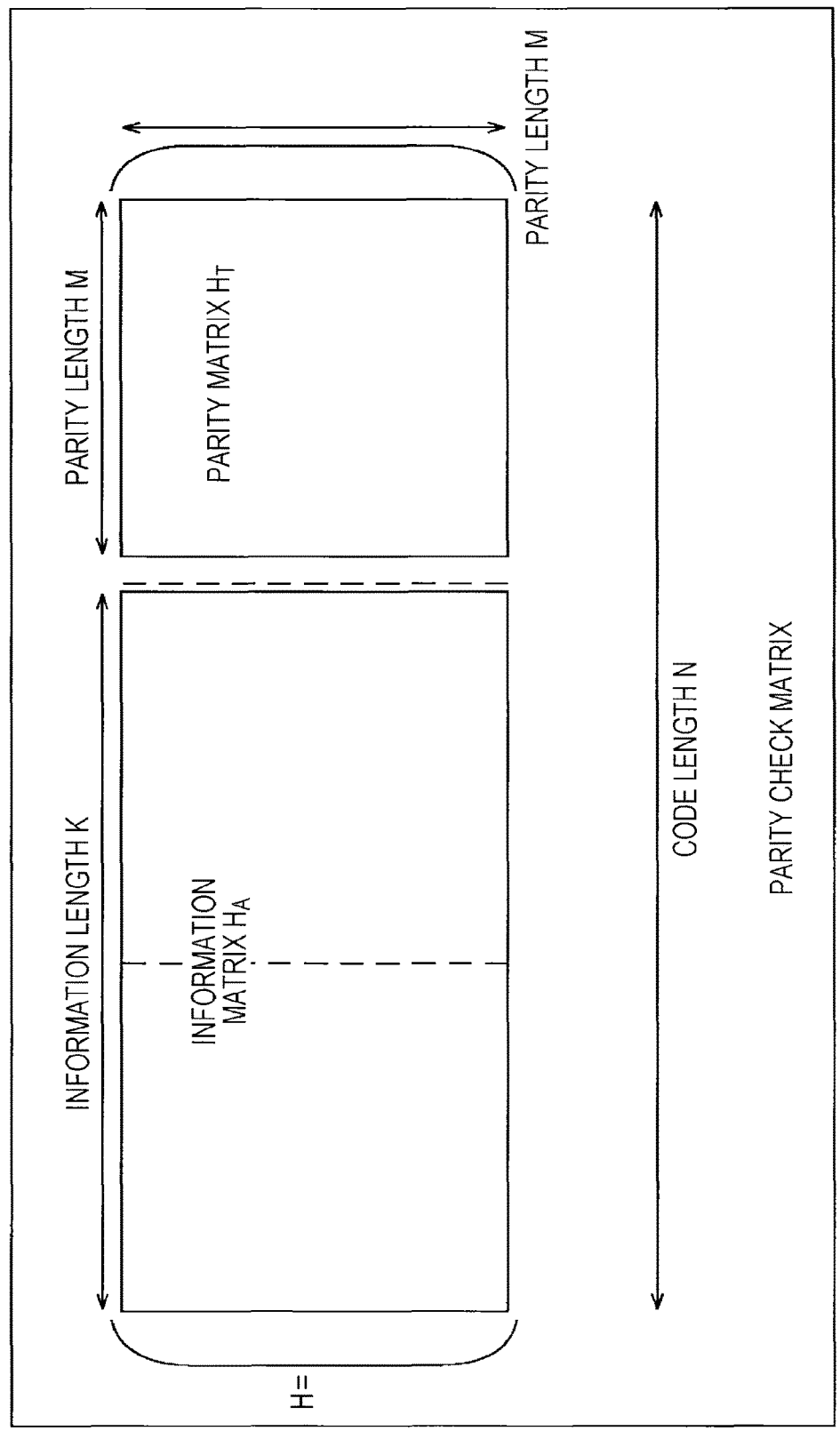
FIG. 10 is a diagram illustrating a parity check matrix.

FIG. 10 is a diagram illustrating the parity check matrix H used in LDPC coding in the LDPC encoder 115 in FIG. 8.

The parity check matrix H has a Low-Density Generation Matrix (LDGM) structure, and can be represented by an equation $H=[H_A|H_T]$ (a matrix in which the elements of an information matrix $H_A$ are left elements and the elements of a parity matrix $H_T$ are right elements) by the information matrix $H_A$ of parts corresponding to the information bit and the parity matrix $H_T$ of parts corresponding to the parity bit, out of code bits of the LDPC code.

Here, the number of bits of the information bit and the number of bits of the parity bit out of code bits of one LDPC code (1 codeword) are respectively referred to as an information length K and a parity length M, and the number of code bits of one LDPC code is referred to as a code length N(=K+M).

The information length K and the parity length M for the LDPC code of a certain code length N are determined by a code rate. Further, the parity check matrix H is a matrix of row×column M×N. Then, the information matrix $H_A$ is a matrix of M×K, and the parity matrix $H_T$ is a matrix of M×M.

Figure 11:
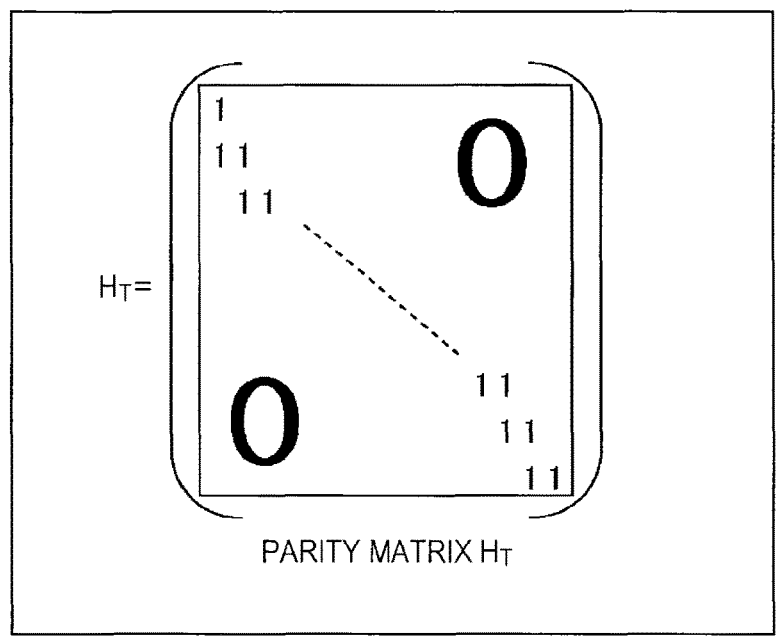
FIG. 11 is a diagram illustrating a parity matrix.

FIG. 11 shows the parity matrix $H_T$ of the parity check matrix H of the LDPC code which is defined in the standard of DVB-S.2, DVB-T.2, and DVB-C.2.

As illustrated in FIG. 11, the parity matrix $H_T$ of the parity check matrix H of the LDPC code which is defined in the standard such as DVB-T.2 is a matrix of a staircase structure in which elements of 1 are arranged in a staircase shape (lower bidiagonal matrix). The row weight of the parity matrix $H_T$ is 1 in a first row, and is 2 in all remaining rows. Further, the column weight is 1 in a last column, and is 2 in all remaining columns.

As described above, it is possible to easily generate the LDPC code of the parity check matrix H of which the parity matrix $H_T$ has a staircase structure, by using the parity check matrix H.

In other words, the LDPC code (one codeword) is represented by a row vector c, and a column vector obtained by transporting the row vector is represented by $c^T$. Further, the information bit part is represented by a row vector c, and the parity bit part is represented by a row vector T, in the row vector c which is the LDPC code.

In this case, the row vector c is represented by an equation c=[A|T] (a row vector in which elements of the row vector A are left elements and elements of the row vector T are right elements) by using the row vector A as the information bit and the row vector T as the parity bit.

It is necessary for the parity check matrix H and the row vector c=[A|T] as the LDPC code to satisfy an equation $Hc^T=0$, and if the parity matrix $H_T$ of the parity check matrix $H=[H_A|H_T]$ has the staircase structure shown in FIG. 11, the row vector T as the parity bits configuring the row vector c=[A|T] satisfying the equation $Hc^T=0$ can be obtained sequentially (in order) by making the element of each row 0 from the element of the first row of the column vector $Hc^T$ in order in the equation $Hc^T=0$.

Figure 12:
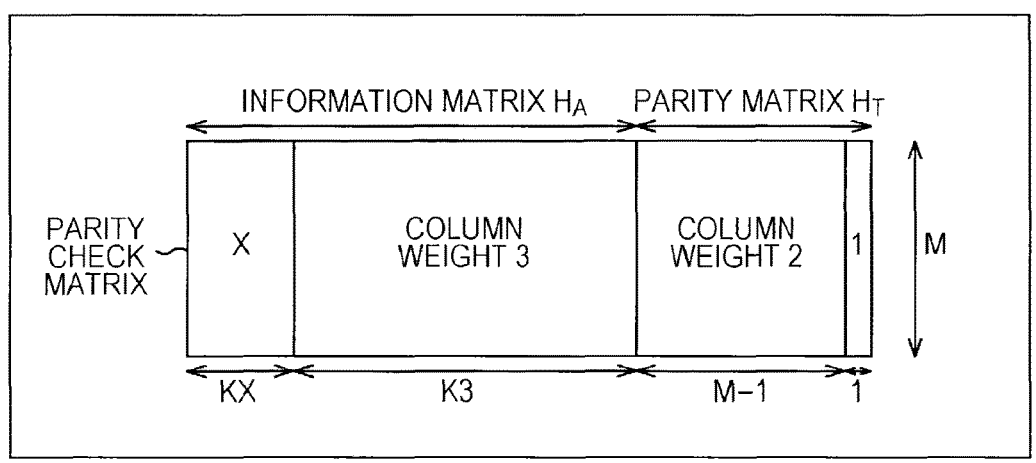
FIG. 12 is a diagram illustrating a parity check matrix of the LDPC code which is defined in the DVB-S.2 standard.

FIG. 12 is a diagram describing the parity check matrix H of the LDPC code which is defined in the standard of DVB-T.2.

In the parity check matrix H of the LDPC code which is defined in the standard of DVB-T.2, the column weight X is given to the first column to a KX-th column, and the column weight 3 is given to the subsequent K3 columns, the column weight 2 is given to the subsequent M−1 columns, and the column weight 1 is given to the last column.

Here, KX+K3+M−1+1 is equal to the code length N.

FIG. 13 is a diagram illustrating the number of columns KX, K3, and M, and a column weight X for each code rate of the LDPC code which is defined in the standards of DVB-T.2 and the like.

In the standards of DVB-T.2 and the like, the LDPC codes of the code length N of 64800 bits and 16200 bits are defined.

Then, 11 code rates (nominal rates) 1/4, 1/3, 2/5, 1/2, 3/5, 2/3, 3/4, 4/5, 5/6, 8/9, and 9/10 are defined for the LDPC code of the code length N of 64800 bits, and 10 code rates 1/4, 1/3, 2/5, 1/2, 3/5, 2/3, 3/4, 4/5, 5/6, and 8/9 are defined for the LDPC code of the code length N of 16200 bits.

Here, the code length N of 64800 bits is referred to as 64 kbits and the code length N of 16200 bits is referred to as 16 kbits.

For the LDPC code, the code bit corresponding to the column having a large column weight of the parity check matrix H is likely to have a low error rate.

In the parity check matrix H which is defined in the standard of DVB-T.2 and the like shown in FIG. 12 and FIG. 13, the closer to the first side (left side) the column is, the larger the column weight is likely to be, therefore, for the LDPC code corresponding to the parity check matrix H, the code bit on the start side is likely to be strong in error (having a resistance to error), and the code bit on the end side is likely to be weak in error.

Figure 14:
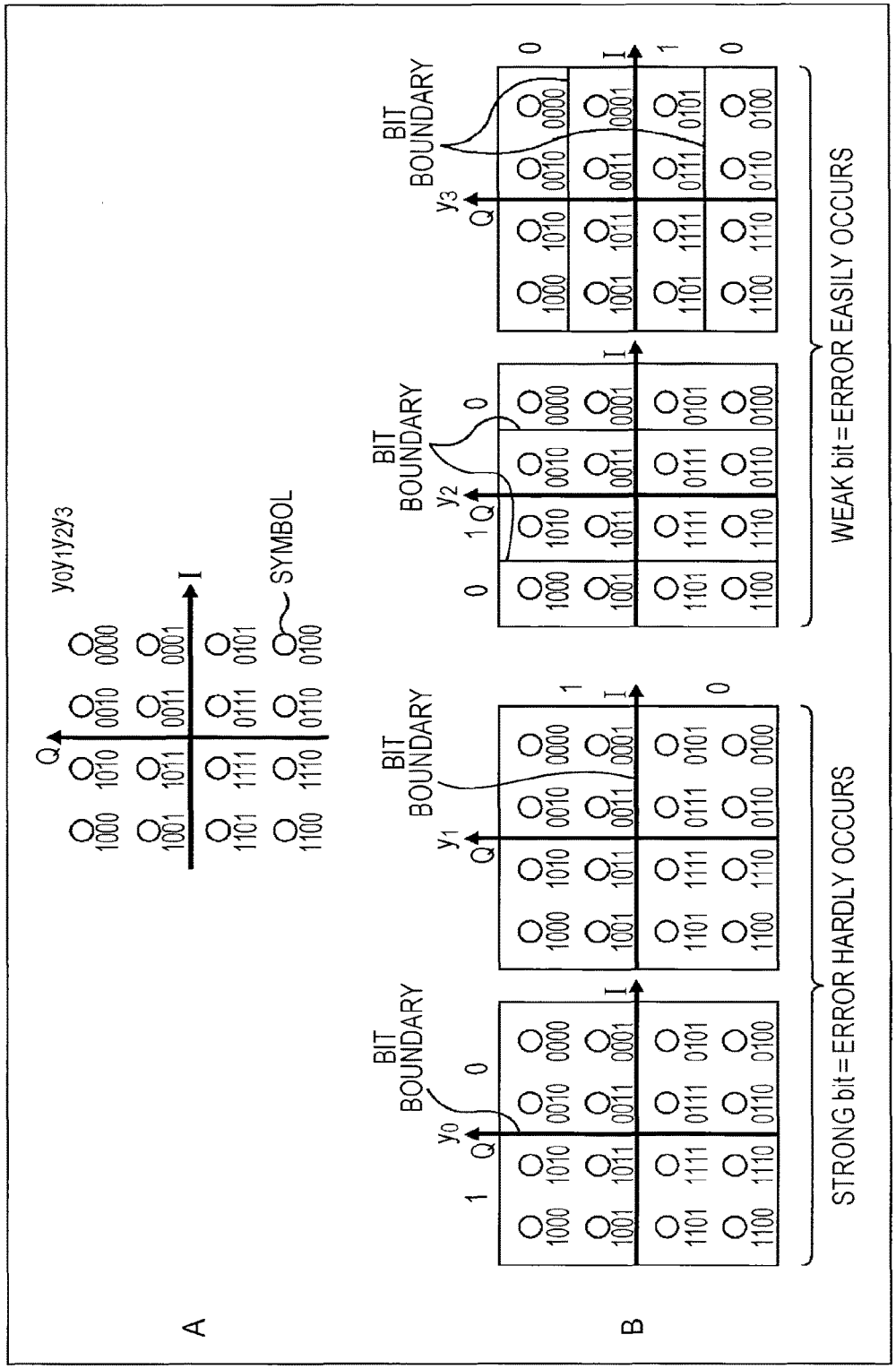
FIG. 14 is a diagram illustrating a signal point arrangement of 16QAM.

FIG. 14 illustrates an arrangement example of 16 symbols (signal points corresponding thereto) on the IQ plane when 16QAM is performed by the mapper 117 in FIG. 8.

In other words, A of FIG. 14 shows symbols (signal points corresponding thereto) of 16QAM of DVB-T.2.

In 16QAM, one symbol is represented by four bits, and there are 16 ($=2^4$) symbols. Then, 16 symbols are arranged so as to form a 4×4 square in the I direction×the Q direction, with an origin of the IQ plane as a center.

Now, if the (i+1)-th bit from the most significant bit in a bit sequence represented by one symbol are represented as a bit $y_i$, the four bits that represents one bit of 16QAM can be represented as bits $y_0$, $y_1$, $y_2$, and $y_3$ from the most significant bit in order. If a modulation scheme is 16QAM, four bits of the code bits of the LDPC code become (symbolized into) a symbol (symbol values) of four bits $y_0$ to $y_3$.

B of FIG. 14 shows bit boundaries for the symbol bit $y_i$ four bits (hereinafter, referred to as a symbol bit) $y_0$ to $y_3$ represented by symbols of 16QAM.

Here, the bit boundary for the symbol bit $y_i$ (in FIG. 14, i=0, 1, 2, and 3) means a boundary between a symbol of which the symbol bit $y_i$ is 0 and a symbol of which the symbol bit $y_i$ is 1.

As illustrated in B of FIG. 14, for the top symbol bit y0 out of four symbol bits $y_0$ to $y_3$ represented by symbols of 16QAM, one place on the Q-axis in the IQ plane is a bit boundary, and for the second (second from the most significant bit) symbol bit $y_1$, only one place on the I-axis in the IQ plane is a bit boundary.

Further, for the third symbol bit $y_2$, the bit boundaries are located between the first column and the second column and between the third column and the fourth column from the left, out of 4×4 symbols.

Further, for the fourth symbol bit $y_3$, the bit boundaries are located between the first row and the second row and between the third row and the fourth row from the top, out of 4×4 symbols.

With respect to the symbol bit $y_i$ represented by the symbols, the more symbols are away from the bit boundary, the less error occurs (error probability is low), and the more symbols are close to the symbol bit boundary, the more error occurs (error probability is high).

Now, if a bit in which error hardly occurs (strong in error) is referred to as "strong bit", and a bit in which error easily occurs (weak in error) is referred to as "weak bit", for the four symbol bits $y_0$ to $y_3$ of a symbol of 16QAM, the top symbol bit $y_0$ and the second symbol bit $y_1$ are strong bits, and the third symbol bit $y_2$ and the fourth symbol bit $y_3$ are weak bits.

Figure 15:
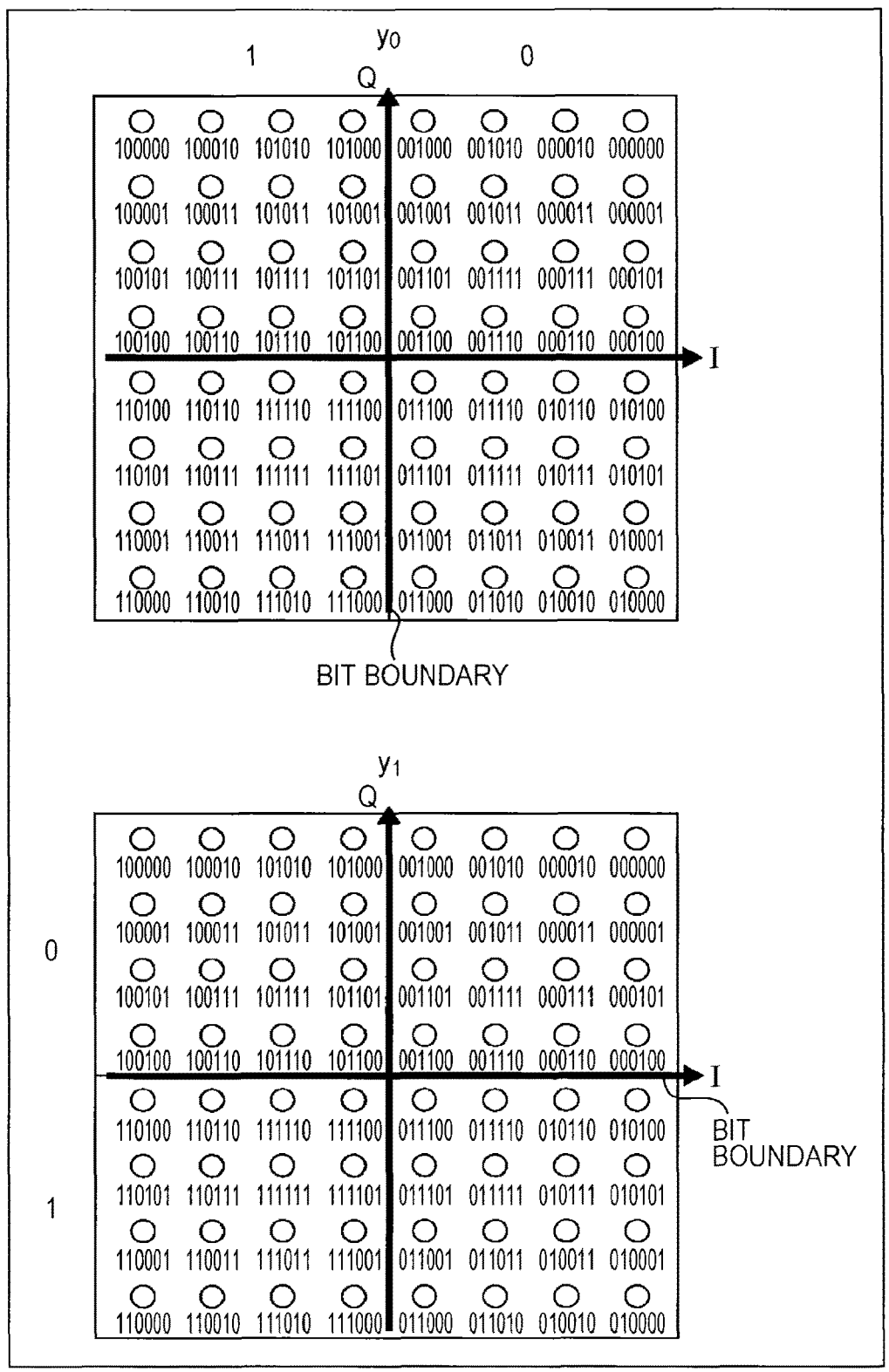
FIG. 15 is a diagram illustrating a signal point arrangement of 64QAM.
Figure 16:
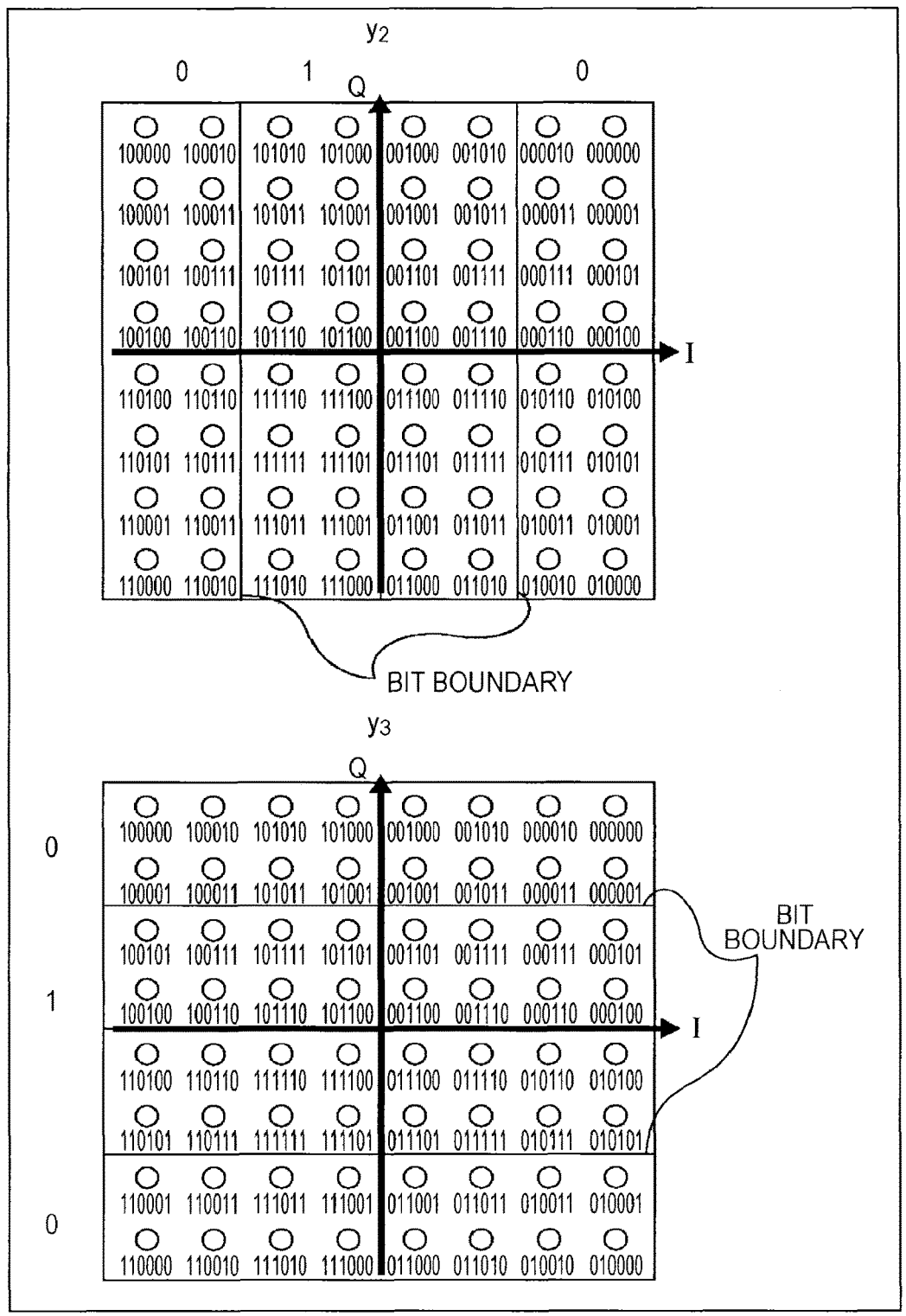
FIG. 16 is a diagram illustrating a signal point arrangement of 64QAM.
Figure 17:
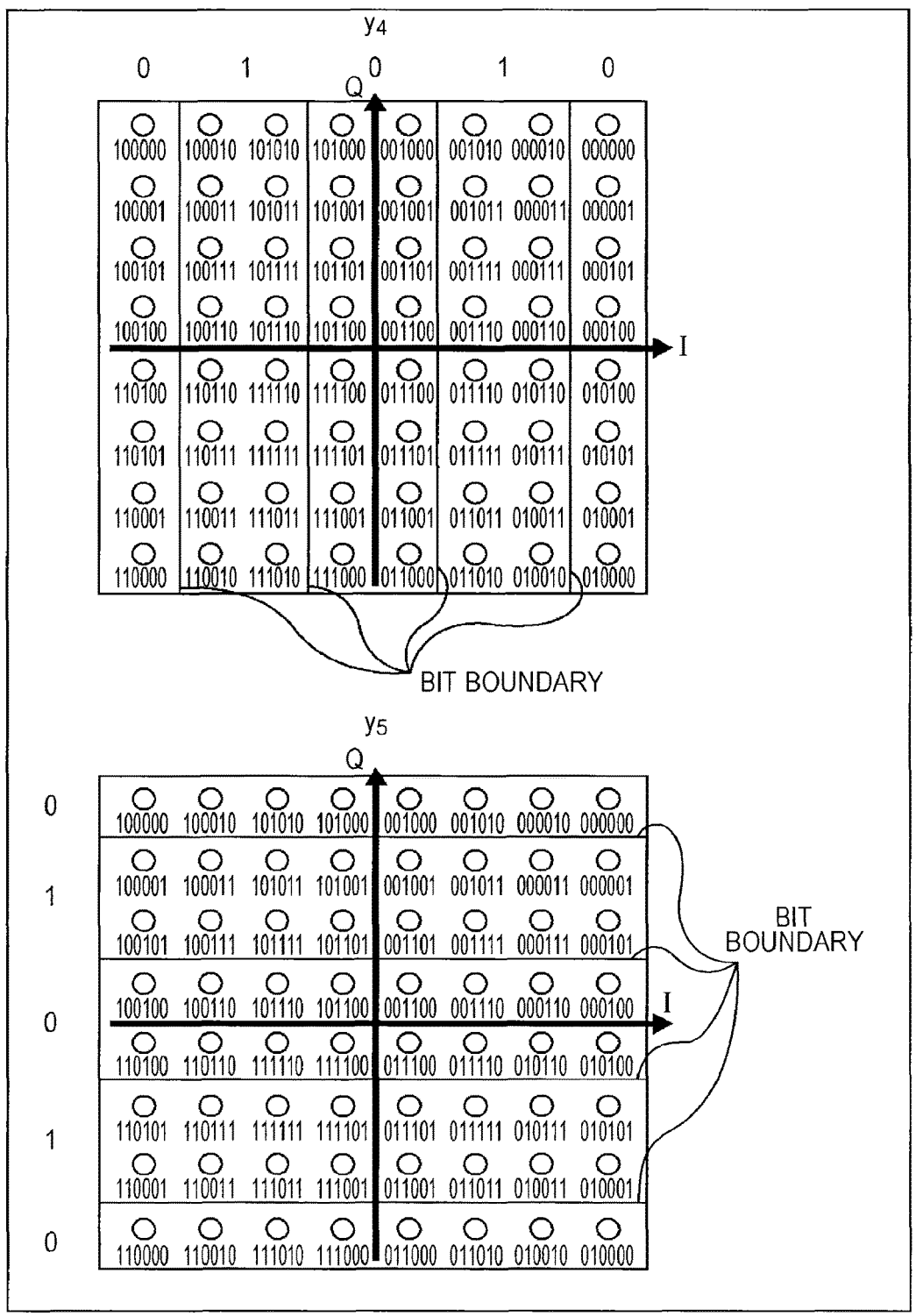
FIG. 17 is a diagram illustrating a signal point arrangement of 64QAM.

FIG. 15 to FIG. 17 illustrate an arrangement example of 64 symbols (signal points corresponding thereto), in other words, symbols of 16QAM of DVB-T.2 on the IQ plane when 64QAM is performed by the mapper 117 in FIG. 8.

In 64QAM, one symbol is represented by six bits, and there are 64 ($=2^6$) symbols. Then, 64 symbols are arranged so as to form an 8×8 square in the I direction×the Q direction, with an origin of the IQ plane as a center.

The symbol bits of one symbol of 64QAM can be represented as bits $y_0$, $y_1$, $y_2$, $y_3$, $y_4$, and $y_5$ from the most significant bit in order. If a modulation scheme is 64QAM, six bits of the code bits of the LDPC code are a symbol of symbol bits $y_0$ to $y_5$ of six bits.

Here, FIG. 15 illustrates the bit boundary for each of the top symbol bit $y_0$ and the second symbol bit $y_1$, FIG. 16 illustrates the bit boundary for each of the third symbol bit $y_2$ and the fourth symbol bit $y_3$, and FIG. 17 illustrates the bit boundary for each of the fifth symbol bit $y_4$ and the sixth symbol bit $y_5$, among the symbol bits $y_0$ to $y_5$ of the symbol of 64QAM.

As shown in FIG. 15, the number of bit boundaries for each of the top symbol bit y0 and the second symbol bit $y_1$ is one. Further, as shown in FIG. 16, the number of bit boundaries for each of the third symbol bit $y_2$ and the fourth symbol bit $y_3$ is two, and as shown in FIG. 17, the number of bit boundaries for each of the fifth symbol bit $y_4$ and the sixth symbol bit $y_5$ is four.

Therefore, for the symbol bits $y_0$ to $y_5$ of the symbol of 64QAM, the top symbol bit $y_0$ and second symbol bit $y_1$ are the strongest bits, and the third symbol bit $y_2$ and the fourth symbol bit $y_3$ are the second strongest bits. Then, the fifth symbol bit $y_4$ and the sixth symbol bit $y_5$ are weak bits.

It can be seen from FIG. 14, and FIG. 15 to FIG. 17 that an upper bit is likely to be a strong bit and a lower bit is likely to be a weak bit, for the symbol bits of the symbol of the quadrature modulation.

Figure 18:
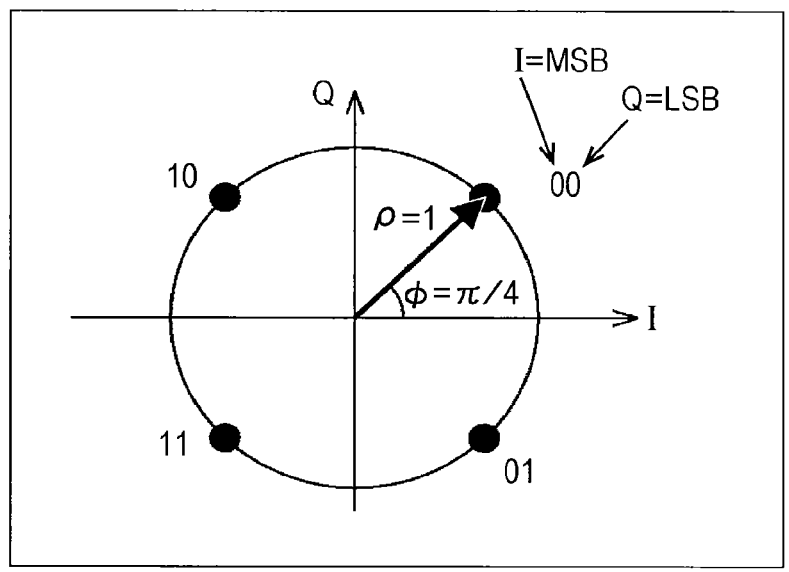
FIG. 18 is a diagram illustrating a signal point arrangement which is defined in the DVB-S.2 standard.

FIG. 18 illustrates an arrangement example of four symbols (signal points corresponding thereto) on an IQ plane, in other words, for example, signal point arrangement of QPSK of DVB-S.2, when a satellite line is employed as the communication path 13 (FIG. 7) and QPSK is performed by the mapper 117 in FIG. 8.

In the QPSK of DVB-S.2, the symbol is mapped to one of four signal points on the circumference of a circle having a radius ρ of 1 with an origin of the IQ plane as a center.

Figure 19:
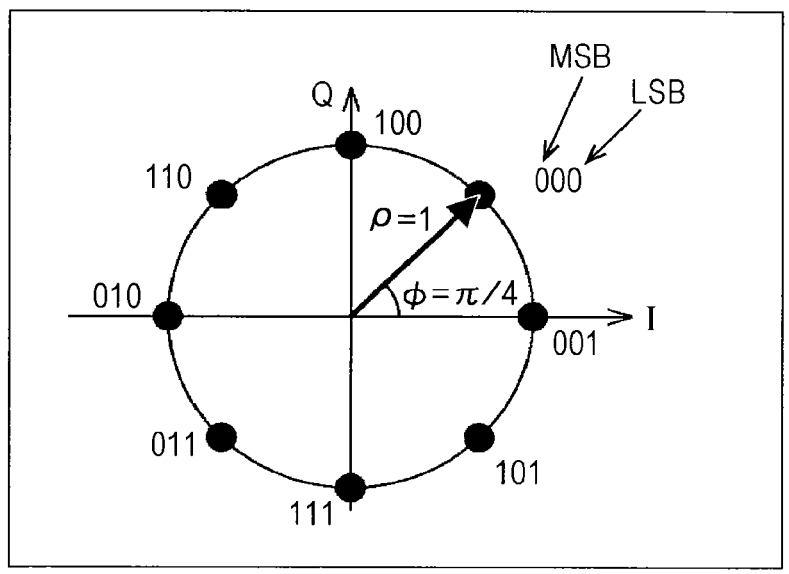
FIG. 19 is a diagram illustrating a signal point arrangement which is defined in the DVB-S.2 standard.

FIG. 19 illustrates an arrangement example of eight symbols on an IQ plane, in other words, for example, signal point arrangement of 8PSK of DVB-S.2, when a satellite line is employed as the communication path 13 (FIG. 7) and 8PSK is performed by the mapper 117 in FIG. 8.

In the 8PSK of DVB-S.2, the symbol is mapped to one of eight signal points on the circumference of a circle having a radius ρ of 1 with an origin of the IQ plane as a center.

Figure 20:
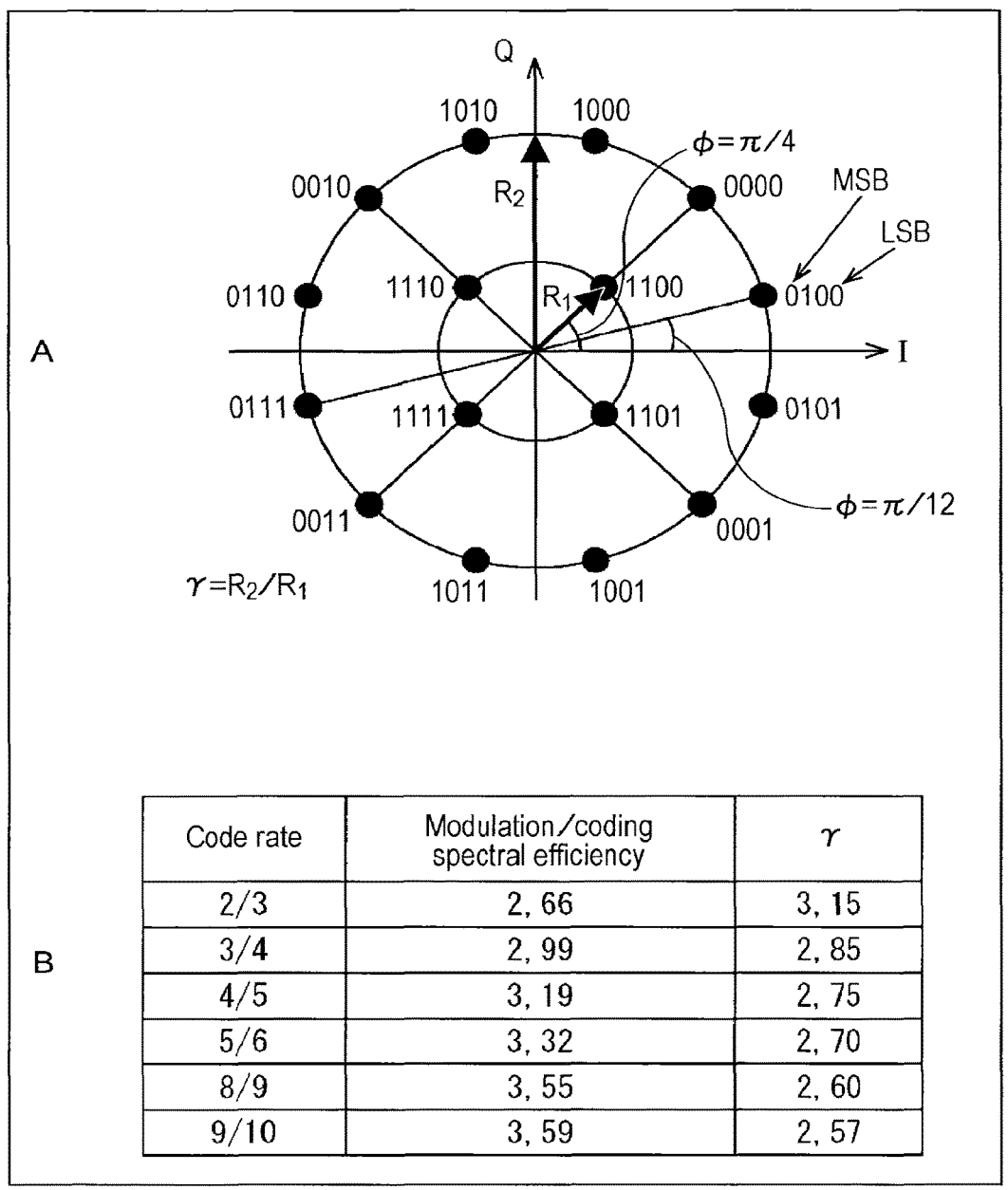
FIG. 20 is a diagram illustrating a signal point arrangement which is defined in the DVB-S.2 standard.

FIG. 20 illustrates an arrangement example of 16 symbols on an IQ plane, in other words, for example, signal point arrangement of 16APSK of DVB-S.2, when a satellite line is employed as the communication path 13 (FIG. 7) and 16APSK is performed by the mapper 117 in FIG. 8.

A in FIG. 20 shows constellation of 16APSK of DVB-S.2.

In the 16APSK of DVB-S.2, the symbol is mapped to one of a total of 16 signal points including four signal points on the circumference of a circle having a radius $R_1$ and 12 signal points on the circumference of a circle having a radius $R_2$ ($>R_1$), with an origin of the IQ plane as a center.

B in FIG. 20 shows a ratio $\gamma=R_2/R_1$ of the radius $R_2$ to the radius $R_1$ in the constellation of 16APSK of DVB-S.2.

The ratio γ of the radius $R_2$ to the radius $R_1$ changes depending on the code rate, in the constellation of 16APSK of DVB-S.2.

Figure 21:
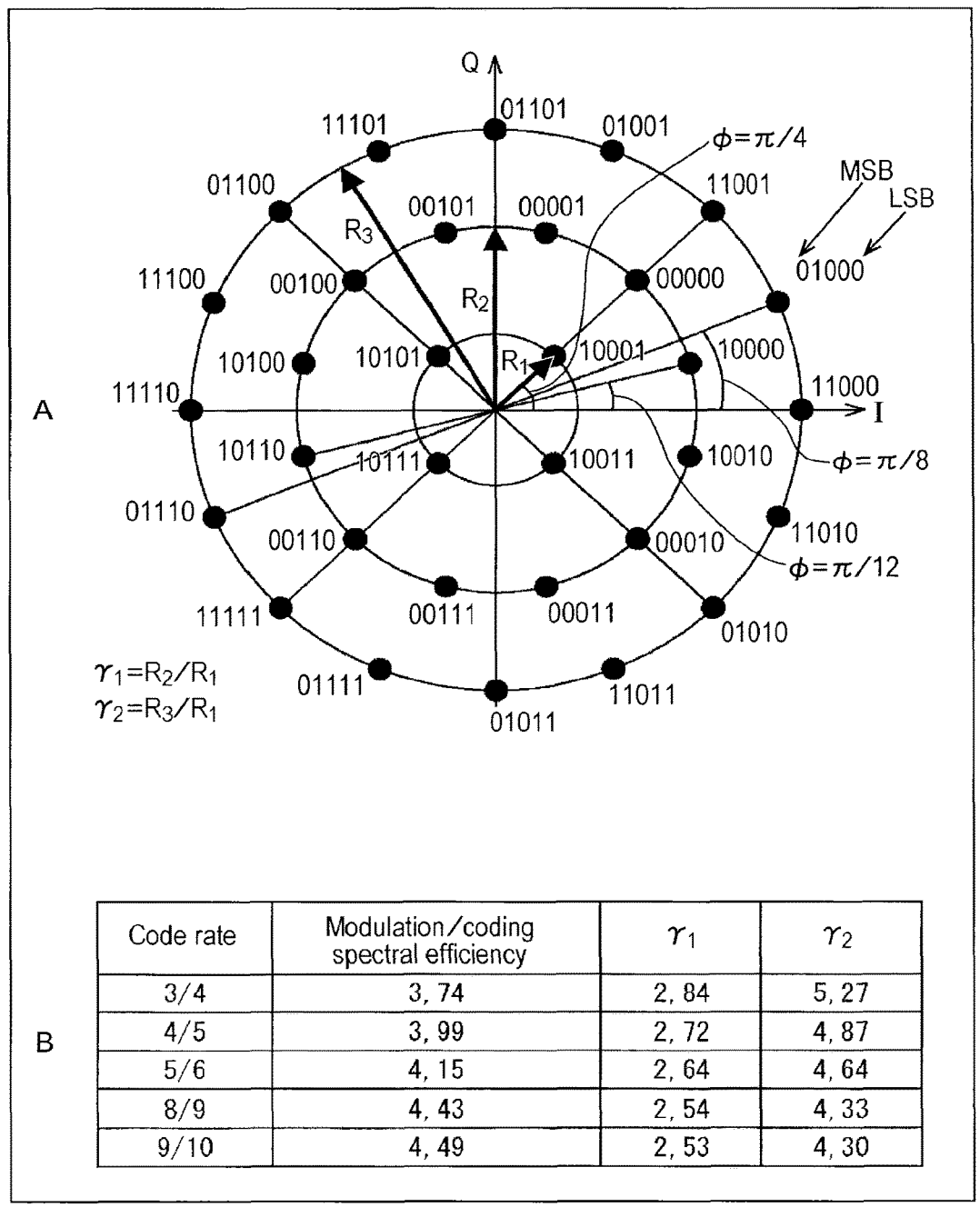
FIG. 21 is a diagram illustrating a signal point arrangement which is defined in the DVB-S.2 standard.

FIG. 21 illustrates an arrangement example of 32 symbols on an IQ plane, in other words, for example, signal point arrangement of 32APSK of DVB-S.2, when a satellite line is employed as the communication path 13 (FIG. 7) and 32APSK is performed by the mapper 117 in FIG. 8.

A of FIG. 21 shows constellation of 32APSK of DVB-S.2.

In the 32APSK of DVB-S.2, the symbol is mapped to one of a total of 32 signal points including four signal points on the circumference of a circle having a radius $R_1$, 12 signal points on the circumference of a circle having a radius $R_2$ ($>R_1$), and 16 signal points on the circumference of a circle having a radius $R_3$ ($>R_2$), with an origin of the IQ plane as a center.

B of FIG. 21 shows a ratio $\gamma 1 = R_2/R_1$ of the radius $R_2$ to the radius $R_1$ and a ratio $\gamma 2 = R_3/R_1$ of the radius $R_3$ to the radius $R_1$, in the constellation of 32APSK of DVB-S.2.

The ratio γ1 of the radius $R_2$ to the radius $R_1$ and the ratio γ2 of the radius $R_3$ to the radius $R_1$ change depending on code rate, in the constellation of 32APSK of DVB-S.2.

There are strong bits and weak bits even for the symbol bits of the symbols of respective types of quadrature modulations (QPSK, 8PSK, 16APSK, and 32APSK) of DVB-S.2 of which constellations are shown in FIG. 18 to FIG. 21, similarly to the case of FIG. 14 to FIG. 17.

Here, as illustrated in FIG. 12 and FIG. 13, there are code bits which are weak in error and code bits which are strong in error, for the LDPC code that the LDPC encoder 115 (FIG. 8) outputs.

Further, as illustrated in FIG. 14 to FIG. 21, there are strong bits and weak bits for the symbol bits of a symbol of the quadrature modulation performed by the mapper 117.

Therefore, if a code bit which is weak in error of the LDPC code is allocated to a weak symbol bit of a quadrature modulation symbol, as a whole, the resistance to error is reduced.

Thus, as a trend of allocating the code bit which is weak in error, of the LDPC code to a strong bit (symbol bit) of a quadrature modulation symbol, an interleaver of interleaving the code bit of the LDPC code is proposed.

The demultiplexer 25 in FIG. 9 can perform the process of the interleaver.

Figure 22:
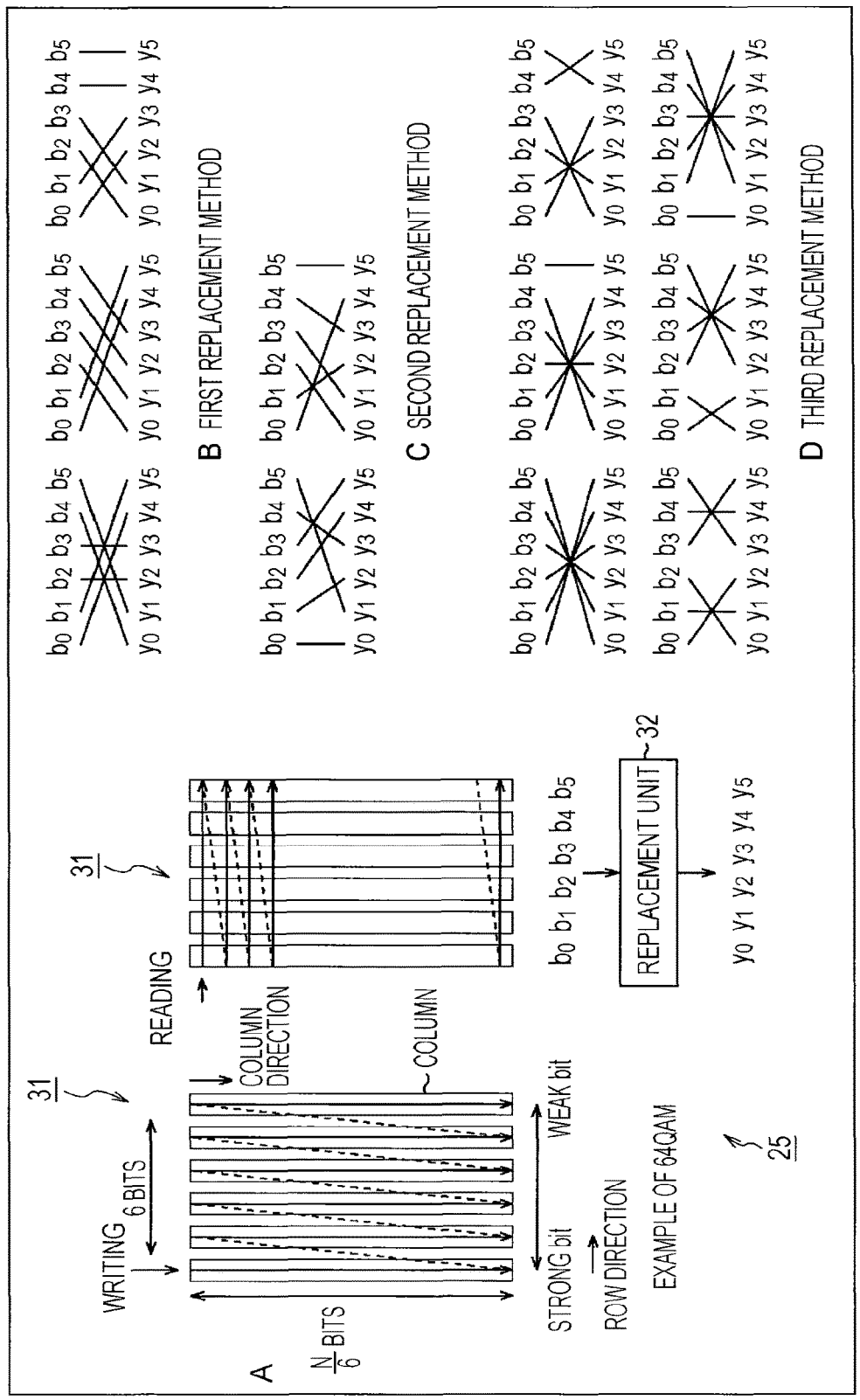
FIG. 22 is a diagram describing a process of a demultiplexer 25.

FIG. 22 is a diagram describing the process of the demultiplexer 25 in FIG. 9.

In other words, A of FIG. 22 shows a functional configuration example of the demultiplexer 25.

The demultiplexer 25 is configured with a memory 31 and a replacement unit 32.

The LDPC code from the LDPC encoder 115 is supplied to the memory 31.

The memory 31 has a storage capacity for storing mb bits in a row (horizontal) direction and N/(mb) bits in a column (vertical) direction, and supplies the replacement unit 32 with the code bit of the LDPC code supplied thereto, by writing the code bit in the column direction and reading the code bit in the row direction.

Here, N (=information length K+parity length M) represents the code length of the LDPC code, as described above.

Further, m represents the number of bits of code bit of the LDPC code as one symbol, b represents a predetermined positive integer, and m is a multiple used for integer multiplying. The demultiplexer 25 forms (symbolizes) the code bit of the LDPC code into a symbol, in a unit of the predetermined number of bits m, and the multiple b represents the number of symbols obtained by one time of symbolizing by the demultiplexer 25.

A of FIG. 22 illustrates a configuration example of the demultiplexer 25 in which a modulation scheme is 64QAM which maps a symbol to any of 64 signal points, and therefore, the number m of bits of code bit of the LDPC code which is one symbol is six bits.

Further, of A in FIG. 22, the multiple b is 1, therefore, the memory 31 has a storage capacity of N/(6×1)×(6×1) bits in the column direction×row direction.

Here, a storage area of the memory 31 which has one bit in the row direction and extends in the column direction, hereinafter, as appropriate, is referred to as a column. In A of FIG. 22, the memory 31 is configured with 6 (=6×1) columns.

In the demultiplexer 25, the writing of the code bit of the LDPC code in a direction from the top to the bottom of the columns (in the column direction) configuring the memory 31 is performed toward the column in the left-to-right direction.

Then, if the writing of the code bit is ended up to the bottom of the rightmost column, the code bits are read, from the first column of all columns configuring the memory 31, in the row direction, in a unit of six bits (mb bits) and supplied to the replacement unit 32.

The replacement unit 32 performs a replacement process of replacing the positions of the code bits of six bits from the memory 31, and outputs six resulting bits as six symbol bits $y_0$, $y_1$, $y_2$, $y_3$, $y_4$, and $y_5$ that represent one symbol of 64QAM.

In other words, the code bits of mb bits (here, six bits) are read from the memory 31 in the row direction, but if the i-th bit (i=0, 1, . . . , mb−1) from the most significant bit of the code bits of mb bits which are read from the memory 31 is represented as a bit b±, the code bits of six bits which are read from the memory 31 in the row direction can be represented as bits $b_0$, $b_1$, $b_2$, $b_3$, $b_4$, and $b_5$ from the most significant bit in order.

From the relationship of the column weights described in FIG. 12 and FIG. 13, the code bit located in the direction of a bit $b_0$ is a code bit which is strong in error, and the code bit located in the direction of a bit $b_5$ is a code bit which is weak in error.

The replacement unit 32 can perform a replacement process of replacing the positions of the code bits $b_0$ to $b_5$ of six bits from the memory 31 such that the code bit which is weak in error among the code bits $b_0$ to $b_5$ of six bits from the memory 31 is allocated to the strong bits among the symbol bits $y_0$ to $y_5$ of one symbol of 64QAM.

Here, various replacement methods that replace the code bits $b_0$ to $b_5$ of six bits from the memory 31 and allocate them to each of six symbol bits $y_0$ to $y_5$ representing one symbol of 64QAM have been proposed from many companies.

B of FIG. 22, C of FIG. 22, and D of FIG. 22 respectively show a first replacement method, a second replacement method, and a third replacement method.

In B of FIG. 22 to D of FIG. 22 (similar even in FIG. 23 which will be described later), a line connecting the bit $b_i$ and $y_i$ means allocating the code bit $b_i$ to the symbol bit $y_i$ of the symbol (replacing it in the position of the symbol bit $y_i$).

As the first replacement method of B of FIG. 22, adopting any one of three types of replacement methods has been proposed, and as the second replacement method of C of FIG. 22, adopting any one of two types of replacement methods has been proposed.

As the third replacement method of D of FIG. 22, selecting and using six types of replacement methods in order has been proposed.

Figure 23:
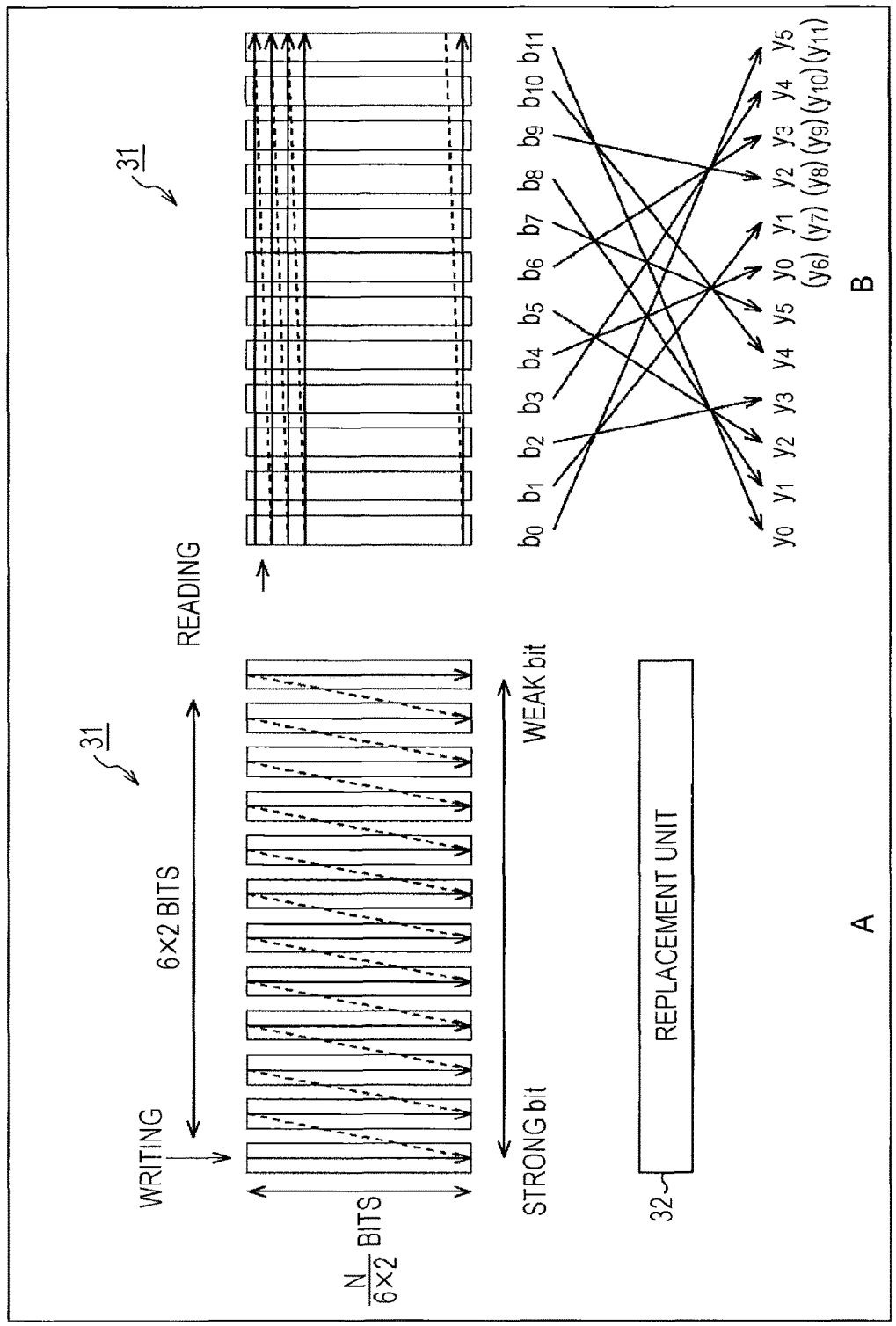
FIG. 23 is a diagram describing a process of the demultiplexer 25.

FIG. 23 illustrates a configuration example of the demultiplexer 25 in which a modulation scheme is 64QAM which maps a symbol to any of 64 signal points, (therefore, the number m of bits of code bit of the LDPC code which is mapped to one symbol is six bits, similarly to FIG. 22), and the multiple b is 2, and the fourth replacement method.

When the multiple b is 2, the memory 31 includes a storage capacity of N/(6×2)×(6×2) bits in the column direction×row direction, and is configured with 12 (=6×2) columns.

A of FIG. 23 illustrates a write order of the LDPC code to the memory 31.

In the demultiplexer 25, as described in FIG. 22, the writing of the code bit of the LDPC code in a direction from the top to the bottom of the columns (in the column direction) configuring the memory 31 is performed toward the column in the left-to-right direction.

Then, if the writing of the code bit is ended up to the bottom of the rightmost column (when the writing of the one codeword is ended), the code bits are read, from the first column of all columns configuring the memory 31, in the row direction, in a unit of 12 bits (mb bits) and supplied to the replacement unit 32.

The replacement unit 32 performs a replacement process of replacing the positions of the code bits of 12 bits from the memory 31 by using the fourth replacement method, and outputs 12 resulting bits as 12 bits representing two symbols (b symbols) of 64QAM, in other words, six symbol bits $y_0$, $y_1$, $y_2$, $y_3$, $y_4$, and $y_5$ that represent one symbol of 64QAM, and six symbol bits $y_0$, $y_1$, $y_2$, $y_3$, $y_4$, and $y_5$ that represent one next symbol.

Here, B of FIG. 23 illustrates the fourth replacement method of the replacement process by the replacement unit 32 of A of FIG. 23.

In addition, when the multiple b is 2 (the same applies in the case of 3 or more), in the replacement process, the code bits of mb bits are allocated to the symbol bits of mb bits of b successive symbols. Including FIG. 23, in the following, for convenience of explanation, the (i+1)-th bit from the most significant bit of the symbol bit of mb bits of b successive symbols is represented as bit (symbol bit) $y_i$.

What code bit replacement method is appropriate, in other words, further improves the error rate in the AWGN communication path, and the like varies depending on the code rate and code length of the LDPC code, the modulation scheme and the like.

<Parity Interleave>

Next, parity interleave by the parity interleaver 23 in FIG. 9 will be described with reference to FIG. 24 to FIG. 26.

Figure 24:
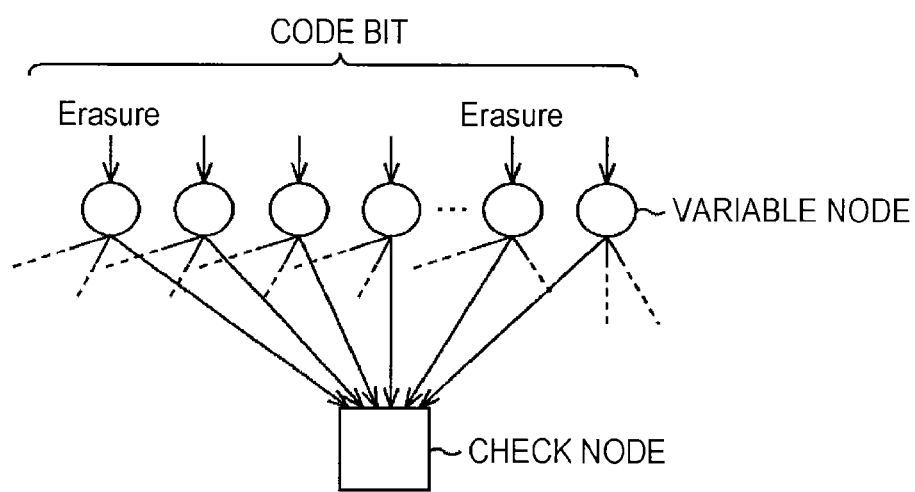
FIG. 24 is a diagram illustrating a Tanner graph for decoding of the LDPC code.

FIG. 24 illustrates a Tanner graph (a part thereof) of the parity check matrix of the LDPC code.

As illustrated in FIG. 24, if a plurality of (2 or the like) variable nodes (code bits corresponding thereto) connected to the check node simultaneously become error nodes such as eraser, the check node returns a message in which a probability of having a value 0 and a probability of having a value 1 are equal, to all variable nodes connected to the check node. Therefore, if a plurality of variable nodes connected to the same check node simultaneously become erasures, the decoding performance is degraded.

Here, the LDPC code which is defined in the standard of DVB-S.2 and output by the LDPC encoder 115 in FIG. 8 is an IRA code, and the parity matrix $H_T$ of the parity check matrix H has a staircase structure, as illustrated in FIG. 11.

Figure 25:
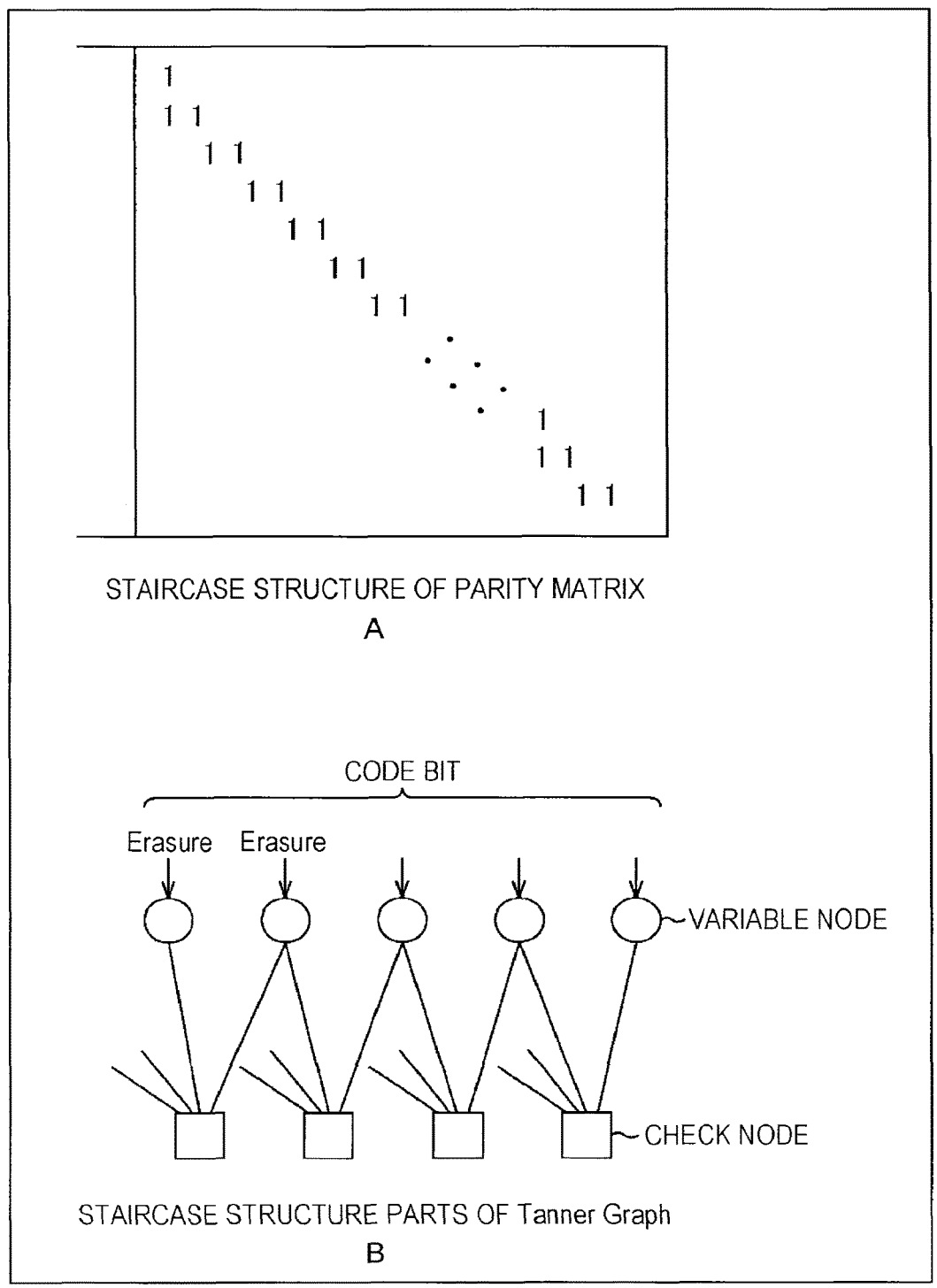
FIG. 25 is a diagram illustrating a parity matrix $H_T$ having a staircase structure and a Tanner graph corresponding to the parity matrix $H_T$.

FIG. 25 is a diagram illustrating a parity matrix $H_T$ having a staircase structure and a Tanner graph corresponding to the parity matrix $H_T$.

In other words, A of FIG. 25 shows a parity matrix $H_T$ having a staircase structure, and B of FIG. 25 shows a Tanner graph corresponding to the parity matrix $H_T$ of A of FIG. 25.

In the parity matrix $H_T$ having the staircase structure, elements of 1 are adjacent in each row (except for the first row). Therefore, in the Tanner graph of the parity matrix $H_T$, two adjacent variable nodes corresponding to the columns of two adjacent elements, of which values in the parity matrix $H_T$ are 1, are connected to the same check node.

Therefore, if the parity bits corresponding to the two adjacent variable nodes described above become error bits simultaneously due to a burst error or an erasure, the check node connected to the two variable nodes (variable nodes for obtaining a message by using the parity bit) corresponding to the two parity bits which become error bits returns a message in which a probability of having a value 0 and a probability of having a value 1 are equal, to the variable node connected to the check node, such that decoding performance is degraded. Then, if the burst length (the number of bits of the parity bits which become error bits in series) is increased, the number of check nodes returning the message indicating the equal probabilities is increased and the decoding performance is further degraded.

Thus, in order to prevent deterioration of the decoding performance described above, the parity interleaver 23 (FIG. 9) performs interleave of interleaving the parity bit of the LDPC code from the LDPC encoder 115 to the position of another parity bit.

Figure 26:
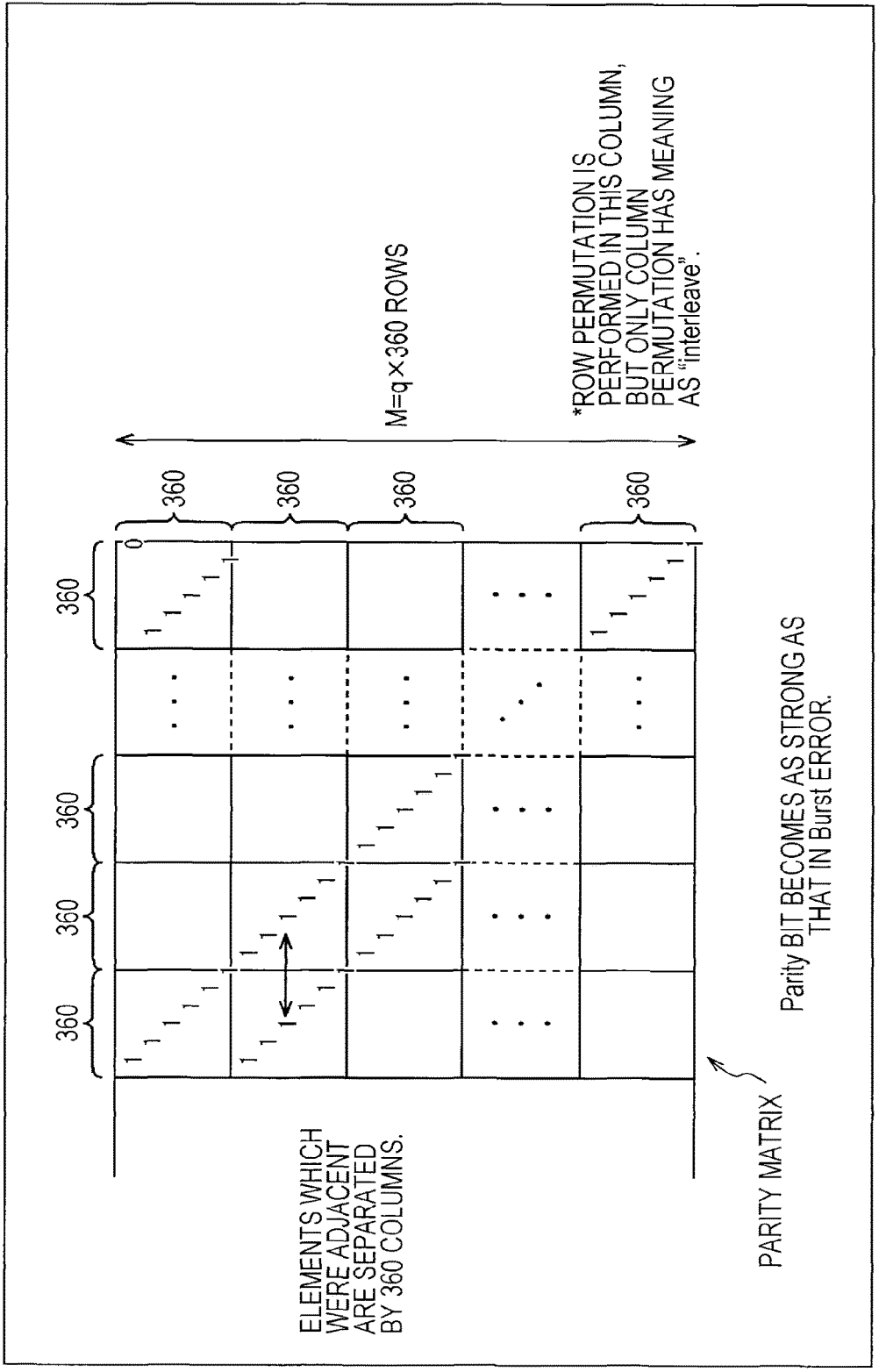
FIG. 26 is a diagram illustrating a parity matrix $H_T$ of a parity check matrix H corresponding to an LDPC code after parity interleave.

FIG. 26 is a diagram illustrating a parity matrix $H_T$ of a parity check matrix H corresponding to an LDPC code after parity interleave is performed by the parity interleaver 23 in FIG. 9.

Here, the information matrix $H_A$ of the parity check matrix H corresponding to the LDPC code which is output by the LDPC encoder 115, and is defined in the standard of DVB-S.2 has a cyclic structure.

The cyclic structure refers to a structure in which a certain column is obtained by cyclically shifting another column, and includes for example, a structure in which for every P columns, the position of 1 in each row of the P column is the position resulting from cyclically shifting the first column of the P column, by a value proportional to a value q obtained by dividing the parity length M, in the column direction. Hereinafter, as appropriate, the P column in the cyclic structure is referred to as the number of columns of a unit of a cyclic structure.

An example of the LDPC code which is defined in the standard of DVB-S.2 includes two types of LDPC codes in which the code length N is 64800 bits and 16200 bits, as described in FIG. 12 and FIG. 13, for both the two types of LDPC codes, the number P of columns of a unit of a cyclic structure is defined as 360 which is one of divisors excluding 1 and M among divisors having the parity length M.

Further, the parity length M is a value other than a prime number represented by an equation M=q×P=q×360, by using a value q which varies depending on the code rate. Therefore, the value q also, similar to the number P of columns of a unit of a cyclic structure, is another one of the divisors except for 1 and M among divisors of the parity length M, and is obtained by dividing the parity length M by the number P of columns of a unit of a cyclic structure (product of P and q, which are the divisors of the parity length M, is the parity length M).

As described above, when the information length is K and x is an integer of 0 or more and less than P, if y is an integer of 0 or more and less than q, the parity interleaver 23 interleaves the (K+qx+y+1)-th code bit among code bits of the LDPC code of N bits in the position of the (K+Py+x+1)-th code bit, as parity interleave.

Since both the (K+qx+y+1)-th code bit and the (K+Py+x+1)-th code bit are the (K+1)-th and subsequent code bits, according to the parity interleave, the position of the parity bit of the LDPC code is moved.

According to such a parity interleave, the variable nodes (parity bit corresponding thereto) connected to the same check node are separated by the number P of columns of a unit of a cyclic structure, in other words, here, 360 bits, such that when the burst length is less than 360 bits, it is possible to avoid a state in which a plurality of variable nodes connected to the same check node simultaneously become error nodes, and thus to improve a resistance to the burst error.

In addition, the LDPC code after the parity interleave of interleaving the (K+qx+y+1)-th code bit to the position of the (K+Py+x+1)-th code bit coincides with the LDPC code of the parity check matrix (hereinafter, referred to as a conversion parity check matrix) obtained by the column permutation of replacing the (K+qx+y+1)-th column of the original parity check matrix H with the (K+Py+x+1)-th column.

Further, a quasi-cyclic structure with the P columns (in FIG. 26, 360 columns) as a unit is shown in the parity matrix of the conversion parity check matrix, as illustrated in FIG. 26.

Here, the quasi-cyclic structure means a structure in which some parts, except for other parts, have the cyclic structure. In the conversion parity check matrix obtained by performing column permutation corresponding to the parity interleave, on the parity check matrix of the LDPC code which is defined in the standard of DVB-S.2, there is no element of 1 (becomes a 0 element) in a portion of 360 rows×360 columns in the right corner portion (a shift matrix which will be described later), and from this point, the parity check matrix does not have a (complete) cyclic structure, but a so-called quasi-cyclic structure.

In addition, the conversion parity check matrix in FIG. 26 is a matrix obtained by performing permutation of rows (a row permutation) so as to configure a configuration matrix which will be described later, as well as the column permutation corresponding to the parity interleave, on the original parity check matrix H.

<Column Twist Interleave>

Next, with reference to FIG. 27 to FIG. 30, a column twist interleave as a rearrangement process by the column twist interleaver 24 of FIG. 9 will be described.

The transmission apparatus 11 of FIG. 8 transmits one bit or more code bits of the LDPC code as one symbol. In other words, for example, when two bits of the code bit are one symbol, for example, QPSK is used as a modulation scheme, and when the four bits of the code bit are one symbol, for example, 16APSK or 16QAM is used as a modulation scheme.

When two bits or more of the code bit are transmitted as one symbol, if an erasure and the like occurs in any symbol, all code bits of the symbol become erasures.

Therefore, it is necessary to avoid the variable node corresponding to the code bits of one symbol being connected to the same check node to lower the probability that a plurality of variable nodes connected to the same check node (code bit corresponding thereto) become erasures at the same time, in order to improve decoding performance.

Meanwhile, as described above, in the parity check matrix H of the LDPC code which is output by the LDPC encoder 115, and is defined in the standard of DVB-S.2, the information matrix $H_A$ has a cyclic structure, and the parity matrix $H_T$ has a staircase structure. Then, as described in FIG. 26, in the conversion parity check matrix which is the parity check matrix of the LDPC code after the parity interleave, a cyclic structure (precisely, as described above, a quasi-cyclic structure) is shown in the parity matrix.

Figure 27:
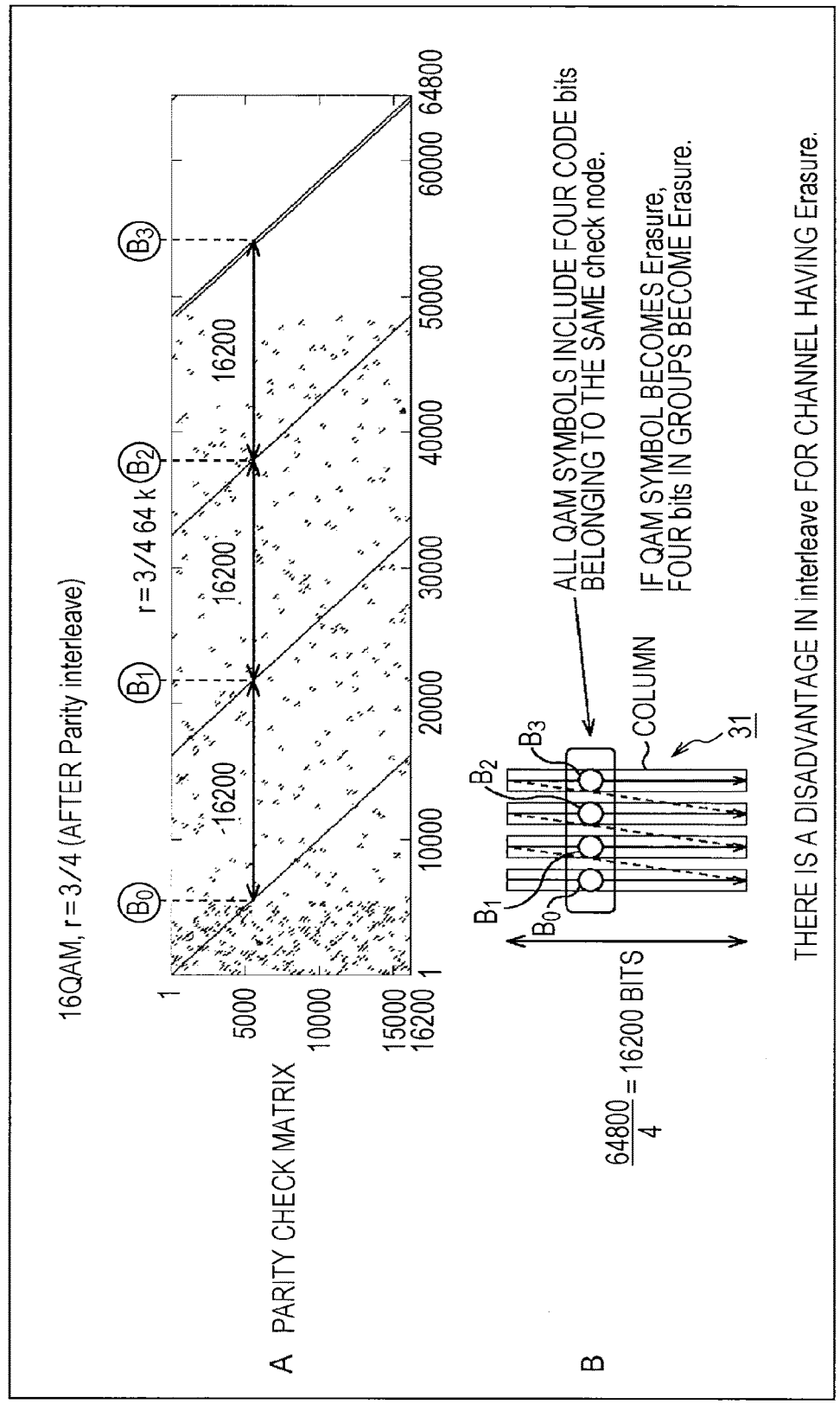
FIG. 27 is a diagram illustrating a conversion parity check matrix.

FIG. 27 illustrates a conversion parity check matrix.

In other words, A of FIG. 27 illustrates a conversion parity check matrix of the parity check matrix H of the LDPC code in which the code length N is 64800 bits and the code rate (r) is 3/4.

In A of FIG. 27, in the conversion parity check matrix, the positions of the elements of which values are set to 1 are represented by points (•).

B of FIG. 27 illustrates a process performed by the demultiplexer 25 (FIG. 9), with an LDPC code of the conversion parity check matrix of A of FIG. 27, in other words, the LDPC code after the parity interleave as a target.

In B of FIG. 27, with a modulation scheme as a scheme of mapping the symbol to 16 signal points, such as 16APSK or 16QAM, the code bits of the LDPC code after the parity interleave are written in the four columns configuring the memory 31 of the demultiplexer 25, in the column direction.

The code bits, which are written in the four columns configuring the memory 31, in the column direction, are read in a four bit unit, in the row direction, so as to be one symbol.

In this case, the code bits $B_0$, $B_1$, $B_2$, and $B_3$ of four bits as one symbol may be code bits corresponding to 1 in any one row of the conversion parity check matrix of A in FIG. 27, and in this case, the variable nodes respectively corresponding to the code bits $B_0$, $B_1$, $B_2$, and $B_3$ are connected to the same check node.

Therefore, when the code bits $B_0$, $B_1$, $B_2$, and $B_3$ of four bits of one symbol are code bits corresponding to 1 in any one row of the conversion parity check matrix, if an erasure occurs in the symbol, it is not possible to obtain an appropriate message from the same check node connected to the variable nodes respectively corresponding to the code bits $B_0$, $B_1$, $B_2$, and $B_3$, and thus the decoding performance is degraded.

Even in the code rate other than the code rate of 3/4, similarly, a plurality of code bits corresponding to a plurality of variable nodes connected to the same check node may be one symbol of 16APSK or 16QAM.

Thus, the column twist interleaver 24 performs column twist interleave of interleaving the code bit of the LDPC code after the parity interleave from the parity interleaver 23 such that a plurality of code bits corresponding to 1 in any one row of the conversion parity check matrix are not included in one symbol.

Figure 28:
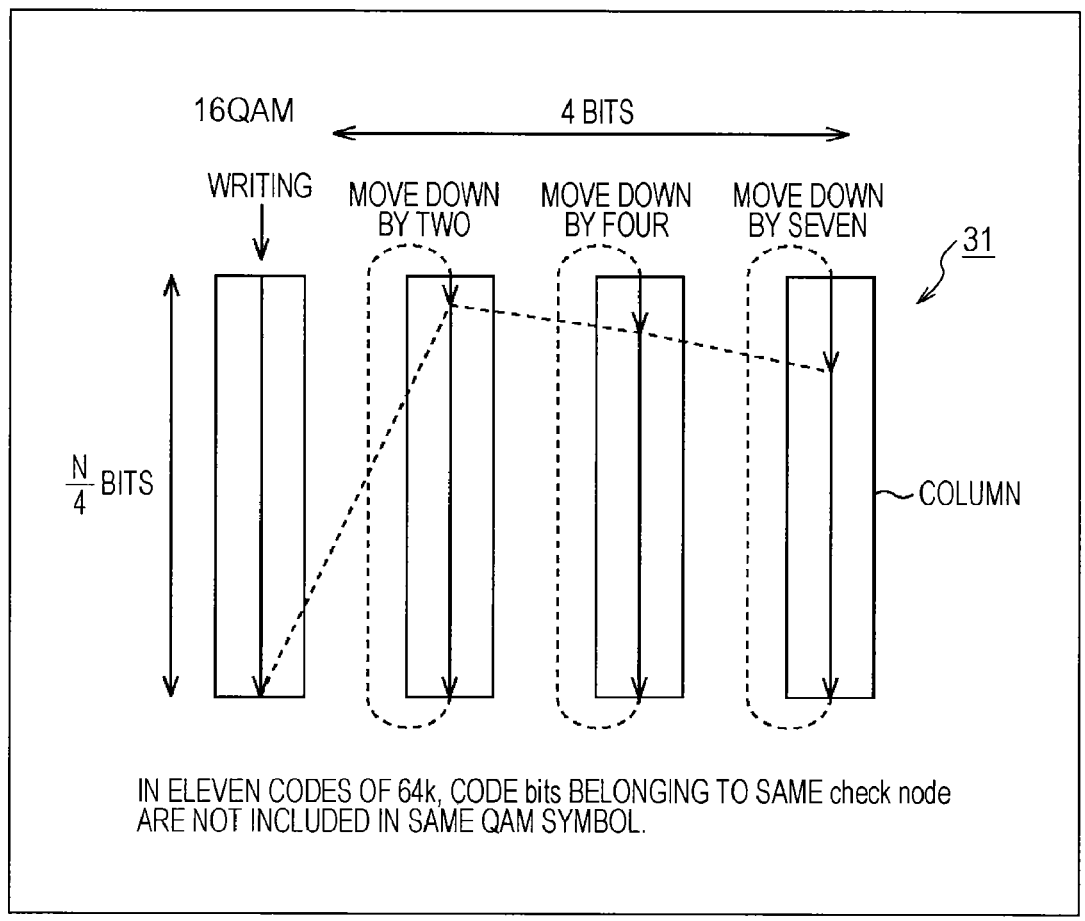
FIG. 28 is a diagram describing a process of a column twist interleaver 24.

FIG. 28 is a diagram describing column twist interleave.

In other words, FIG. 28 illustrates the memory 31 (FIG. 22 and FIG. 23) of the demultiplexer 25.

As described in FIG. 22, the memory 31 has a storage capacity for storing mb bits in the column (vertical) direction and N/(mb) bits in the row (horizontal) direction and is configured with mb columns. Then, the column twist interleaver 24 performs column twist interleave by controlling the write start position for the memory 31, when writing the code bit of the LDPC code in the column direction and reading the code bit in the row direction.

In other words, the column twist interleaver 24 appropriately changes a write start position at which the writing of the code bit is started, for each of a plurality of columns, such that a plurality of code bits configuring one symbol which are read in the row direction do not become code bits corresponding to 1 located in a certain one row of the conversion parity check matrix (the code bits of the LDPC code are rearranged such that a plurality of code bits corresponding to 1 located in a certain one row of the parity check matrix are not included in the same symbol).

Here, FIG. 28 illustrates a configuration example of the memory 31 when a modulation scheme is 16APSK or 16QAM, and the multiple b described in FIG. 22 is 1. Therefore, the number m of bits of code bit of the LDPC code configured in one symbol is four bits, and the memory 31 is configured with four (=mb) columns.

The column twist interleaver 24 (on behalf of the demultiplexer 25 in FIG. 22) performs the writing of the code bit of the LDPC code in a direction from the top to the bottom of four columns (in the column direction) configuring the memory 31, toward the column in the left-to-right direction.

Then, if the writing of the code bit is ended up to the rightmost column, the column twist interleaver 24 reads the code bit from the first row of all columns configuring the memory 31, in the row direction, in a unit of four bits (mb bit), and outputs the code bit as the LDPC code after the column twist interleave, to the replacement unit 32 (FIG. 22 and FIG. 23) of the demultiplexer 25.

However, if it is assumed that the address of the first (top) position of each column is 0 and the address of each position in the column direction is represented by integers in the ascending order, in the column twist interleaver 24, it is assumed that the write start position of the leftmost column is the position of an address 0, the write start position of the second (from the left) column is the position of an address 2, the write start position of the third column is the position of an address 4, and the write start position of the fourth column is the position of an address 7.

In addition, with respect to columns of which the write start positions are other than the position of an address 0, after the code bits are written up to the bottom position, back to the top (position of the address 0), the code bits are written up to the position immediately before the write start position. Thereafter, the writing to the next column (right) is performed.

By performing the column twist interleave described above, it is possible to avoid a plurality of code bits corresponding to a plurality of variable nodes connected to the same check node being formed into one symbol of 16APSK or 16QAM (being included in the same symbol), for the LDPC code which is defined in the standard of DVB-T.2, as a result, it is possible to improve the decoding performance at the communication path with an erasure.

FIG. 29 illustrates the required number of columns of the memory 31 for column twist interleave and the address of a write start position, for each modulation scheme, for respective LDPC codes of the code length N of 64800 and 11 code rates which are defined in the standard of DVB-T.2.

If the multiple b is 1 and the number m of bits of one symbol is two bits by employing, for example, QPSK as a modulation scheme, according to FIG. 29, the memory 31 has two columns storing 2×1 (=mb) bits in the row direction, and stores 64800/(2×1) bits in the column direction.

Then, among the two columns of the memory 31, it is assumed that the write start position of the first column is the position of an address 0, and the write start position of the second column is the position of an address 2.

In addition, for example, when any one of the first to third replacement methods of FIG. 22 is adopted as the replacement method of the replacement process of the demultiplexer 25 (FIG. 9), the multiple b is 1.

If the multiple b is 2 and the number m of bits of one symbol is two bits by employing, for example, QPSK as a modulation scheme, according to FIG. 29, the memory 31 has four columns storing 2×2 bits in the row direction, and stores 64800/(2×2) bits in the column direction.

Then, among four columns of the memory 31, it is assumed that the write start position of the first column is the position of an address 0, the write start position of the second column is the position of an address 2, the write start position of the third column is the position of an address 4, and the write start position of the fourth column is the position of an address 7.

In addition, for example, when the fourth replacement method of FIG. 23 is adopted as the replacement method of the replacement process of the demultiplexer 25 (FIG. 9), the multiple b is 2.

If the multiple b is 1 and the number m of bits of one symbol is four bits by employing, for example, 16QAM as a modulation scheme, according to FIG. 29, the memory 31 has four columns storing 4×1 bits in the row direction, and stores 64800/(4×1) bits in the column direction.

Then, among four columns of the memory 31, it is assumed that the write start position of the first column is the position of an address 0, the write start position of the second column is the position of an address 2, the write start position of the third column is the position of an address 4, and the write start position of the fourth column is the position of an address 7.

If the multiple b is 2 and the number m of bits of one symbol is four bits by employing, for example, 16QAM as a modulation scheme, according to FIG. 29, the memory 31 has eight columns storing 4×2 bits in the row direction, and stores 64800/(4×2) bits in the column direction.

Then, among eight columns of the memory 31, it is assumed that the write start position of the first column is the position of an address 0, the write start position of the second column is the position of an address 0, the write start position of the third column is the position of an address 2, the write start position of the fourth column is the position of an address 4, the write start position of the fifth column is the position of an address 4, the write start position of the sixth column is the position of an address 5, the write start position of the seventh column is the position of an address 7, and the write start position of the eighth column is the position of an address 7.

If the multiple b is 1 and the number m of bits of one symbol is six bits by employing, for example, 64QAM as a modulation scheme, according to FIG. 29, the memory 31 has six columns storing 6×1 bits in the row direction, and stores 64800/(6×1) bits in the column direction.

Then, among six columns of the memory 31, it is assumed that the write start position of the first column is the position of an address 0, the write start position of the second column is the position of an address 2, the write start position of the third column is the position of an address 5, the write start position of the fourth column is the position of an address 9, the write start position of the fifth column is the position of an address 10, and the write start position of the sixth column is the position of an address 13.

If the multiple b is 2 and the number m of bits of one symbol is six bits by employing, for example, 64QAM as a modulation scheme, according to FIG. 29, the memory 31 has 12 columns storing 6×2 bits in the row direction, and stores 64800/(6×2) bits in the column direction.

Then, among 12 columns of the memory 31, it is assumed that the write start position of the first column is the position of an address 0, the write start position of the second column is the position of an address 0, the write start position of the third column is the position of an address 2, the write start position of the fourth column is the position of an address 2, the write start position of the fifth column is the position of an address 3, the write start position of the sixth column is the position of an address 4, the write start position of the seventh column is the position of an address 4, the write start position of the eighth column is the position of an address 5, the write start position of the ninth column is the position of an address 5, the write start position of the tenth column is the position of an address 7, the write start position of the 11th column is the position of an address 8, and the write start position of the 12th column is the position of an address 9.

If the multiple b is 1 and the number m of bits of one symbol is 8 bits by employing, for example, 256QAM as a modulation scheme, according to FIG. 29, the memory 31 has 8 columns storing 8×1 bits in the row direction, and stores 64800/(8×1) bits in the column direction.

Then, among 8 columns of the memory 31, it is assumed that the write start position of the first column is the position of an address 0, the write start position of the second column is the position of an address 0, the write start position of the third column is the position of an address 2, the write start position of the fourth column is the position of an address 4, the write start position of the fifth column is the position of an address 4, the write start position of the sixth column is the position of an address 5, the write start position of the seventh column is the position of an address 7, the write start position of the eighth column is the position of an address 7.

If the multiple b is 2 and the number m of bits of one symbol is 8 bits by employing, for example, 256QAM as a modulation scheme, according to FIG. 29, the memory 31 has 16 columns storing 8×2 bits in the row direction, and stores 64800/(8×2) bits in the column direction.

Then, among 16 columns of the memory 31, it is assumed that the write start position of the first column is the position of an address 0, the write start position of the second column is the position of an address 2, the write start position of the third column is the position of an address 2, the write start position of the fourth column is the position of an address 2, the write start position of the fifth column is the position of an address 2, the write start position of the sixth column is the position of an address 3, the write start position of the seventh column is the position of an address 7, the write start position of the eighth column is the position of an address 15, the write start position of the ninth column is the position of an address 16, the write start position of the tenth column is the position of an address 20, the write start position of the 11th column is the position of an address 22, the write start position of the 12th column is the position of an address 22, the write start position of the 13th column is the position of an address 27, the write start position of the 14th column is the position of an address 27, the write start position of the 15th column is the position of an address 28, and the write start position of the 16th column is the position of an address 32.

If the multiple b is 1 and the number m of bits of one symbol is 10 bits by employing, for example, 1024QAM as a modulation scheme, according to FIG. 29, the memory 31 has 10 columns storing 10×1 bits in the row direction, and stores 64800/(10×1) bits in the column direction.

Then, among 10 columns of the memory 31, it is assumed that the write start position of the first column is the position of an address 0, the write start position of the second column is the position of an address 3, the write start position of the third column is the position of an address 6, the write start position of the fourth column is the position of an address 8, the write start position of the fifth column is the position of an address 11, the write start position of the sixth column is the position of an address 13, the write start position of the seventh column is the position of an address 15, the write start position of the eighth column is the position of an address 17, the write start position of the ninth column is the position of an address 18, and the write start position of the tenth column is the position of an address 20.

If the multiple b is 2 and the number m of bits of one symbol is 10 bits by employing, for example, 1024QAM as a modulation scheme, according to FIG. 29, the memory 31 has 20 columns storing 10×2 bits in the row direction, and stores 64800/(10×2) bits in the column direction.

Then, among 20 columns of the memory 31, it is assumed that the write start position of the first column is the position of an address 0, the write start position of the second column is the position of an address 1, the write start position of the third column is the position of an address 3, the write start position of the fourth column is the position of an address 4, the write start position of the fifth column is the position of an address 5, the write start position of the sixth column is the position of an address 6, the write start position of the seventh column is the position of an address 6, the write start position of the eighth column is the position of an address 9, the write start position of the ninth column is the position of an address 13, the write start position of the tenth column is the position of an address 14, the write start position of the 11th column is the position of an address 14, the write start position of the 12th column is the position of an address 16, the write start position of the 13th column is the position of an address 21, the write start position of the 14th column is the position of an address 21, the write start position of the 15th column is the position of an address 23, the write start position of the 16th column is the position of an address 25, the write start position of the 17th column is the position of an address 25, the write start position of the 18th column is the position of an address 26, the write start position of the 19th column is the position of an address 28, and the write start position of the 20th column is the position of an address 30.

If the multiple b is 1 and the number m of bits of one symbol is 12 bits by employing, for example, 4096QAM as a modulation scheme, according to FIG. 29, the memory 31 has 12 columns storing 12×1 bits in the row direction, and stores 64800/(12×1) bits in the column direction.

Then, among 12 columns of the memory 31, it is assumed that the write start position of the first column is the position of an address 0, the write start position of the second column is the position of an address 0, the write start position of the third column is the position of an address 2, the write start position of the fourth column is the position of an address 2, the write start position of the fifth column is the position of an address 3, the write start position of the sixth column is the position of an address 4, the write start position of the seventh column is the position of an address 4, the write start position of the eighth column is the position of an address 5, the write start position of the ninth column is the position of an address 5, the write start position of the tenth column is the position of an address 7, the write start position of the 11th column is the position of an address 8, and the write start position of the 12th column is the position of an address 9.

If the multiple b is 2 and the number m of bits of one symbol is 12 bits by employing, for example, 4096QAM as a modulation scheme, according to FIG. 29, the memory 31 has 24 columns storing 12×2 bits in the row direction, and stores 64800/(12×2) bits in the column direction.

Then, among 24 columns of the memory 31, it is assumed that the write start position of the first column is the position of an address 0, the write start position of the second column is the position of an address 5, the write start position of the third column is the position of an address 8, the write start position of the fourth column is the position of an address 8, the write start position of the fifth column is the position of an address 8, the write start position of the sixth column is the position of an address 8, the write start position of the seventh column is the position of an address 10, the write start position of the eighth column is the position of an address 10, the write start position of the ninth column is the position of an address 10, the write start position of the tenth column is the position of an address 12, the write start position of the 11th column is the position of an address 13, the write start position of the 12th column is the position of an address 16, the write start position of the 13th column is the position of an address 17, the write start position of the 14th column is the position of an address 19, the write start position of the 15th column is the position of an address 21, the write start position of the 16th column is the position of an address 22, the write start position of the 17th column is the position of an address 23, the write start position of the 18th column is the position of an address 26, the write start position of the 19th column is the position of an address 37, the write start position of the 20th column is the position of an address 39, the write start position of the 21st column is the position of an address 40, the write start position of the 22nd column is the position of an address 41, the write start position of the 23rd column is the position of an address 41, and the write start position of the 24th column is the position of an address 41.

FIG. 30 illustrates the required number of columns of the memory 31 for column twist interleave and the address of a write start position, for each modulation scheme, for respective LDPC codes of the code length N of 16200 and 10 code rates which are defined in the standard of DVB-T.2.

If the multiple b is 1 and the number m of bits of one symbol is 2 bits by employing, for example, QPSK as a modulation scheme, according to FIG. 30, the memory 31 has two columns storing 2×1 bits in the row direction, and stores 16200/(2×1) bits in the column direction.

Then, among the two columns of the memory 31, it is assumed that the write start position of the first column is the position of an address 0, and the write start position of the second column is the position of an address 0.

If the multiple b is 2 and the number m of bits of one symbol is 2 bits by employing, for example, QPSK as a modulation scheme, according to FIG. 30, the memory 31 has 4 columns storing 2×2 bits in the row direction, and stores 16200/(2×2) bits in the column direction.

Then, among the four columns of the memory 31, it is assumed that the write start position of the first column is the position of an address 0, the write start position of the second column is the position of an address 2, the write start position of the third column is the position of an address 3, and the write start position of the fourth column is the position of an address 3.

If the multiple b is 1 and the number m of bits of one symbol is 4 bits by employing, for example, 16QAM as a modulation scheme, according to FIG. 30, the memory 31 has 4 columns storing 4×1 bits in the row direction, and stores 16200/(4×1) bits in the column direction.

Then, among the four columns of the memory 31, it is assumed that the write start position of the first column is the position of an address 0, the write start position of the second column is the position of an address 2, the write start position of the third column is the position of an address 3, and the write start position of the fourth column is the position of an address 3.

If the multiple b is 2 and the number m of bits of one symbol is 4 bits by employing, for example, 16QAM as a modulation scheme, according to FIG. 30, the memory 31 has 8 columns storing 4×2 bits in the row direction, and stores 16200/(4×2) bits in the column direction.

Then, among the eight columns of the memory 31, it is assumed that the write start position of the first column is the position of an address 0, the write start position of the second column is the position of an address 0, the write start position of the third column is the position of an address 0, the write start position of the fourth column is the position of an address 1, the write start position of the fifth column is the position of an address 7, the write start position of the sixth column is the position of an address 20, the write start position of the seventh column is the position of an address 20, and the write start position of the eighth column is the position of an address 21.

If the multiple b is 1 and the number m of bits of one symbol is 6 bits by employing, for example, 64QAM as a modulation scheme, according to FIG. 30, the memory 31 has 6 columns storing 6×1 bits in the row direction, and stores 16200/(6×1) bits in the column direction.

Then, among the six columns of the memory 31, it is assumed that the write start position of the first column is the position of an address 0, the write start position of the second column is the position of an address 0, the write start position of the third column is the position of an address 2, the write start position of the fourth column is the position of an address 3, the write start position of the fifth column is the position of an address 7, and the write start position of the sixth column is the position of an address 7.

If the multiple b is 2 and the number m of bits of one symbol is 6 bits by employing, for example, 64QAM as a modulation scheme, according to FIG. 30, the memory 31 has 12 columns storing 6×2 bits in the row direction, and stores 16200/(6×2) bits in the column direction.

Then, among the 12 columns of the memory 31, it is assumed that the write start position of the first column is the position of an address 0, the write start position of the second column is the position of an address 0, the write start position of the third column is the position of an address 0, the write start position of the fourth column is the position of an address 2, the write start position of the fifth column is the position of an address 2, the write start position of the sixth column is the position of an address 2, the write start position of the seventh column is the position of an address 3, the write start position of the eighth column is the position of an address 3, the write start position of the ninth column is the position of an address 3, the write start position of the tenth column is the position of an address 6, the write start position of the 11th column is the position of an address 7, and the write start position of the 12th column is the position of an address 7.

If the multiple b is 1 and the number m of bits of one symbol is 8 bits by employing, for example, 256QAM as a modulation scheme, according to FIG. 30, the memory 31 has 8 columns storing 8×1 bits in the row direction, and stores 16200/(8×1) bits in the column direction.

Then, among the eight columns of the memory 31, it is assumed that the write start position of the first column is the position of an address 0, the write start position of the second column is the position of an address 0, the write start position of the third column is the position of an address 0, the write start position of the fourth column is the position of an address 1, the write start position of the fifth column is the position of an address 7, the write start position of the sixth column is the position of an address 20, the write start position of the seventh column is the position of an address 20, and the write start position of the eighth column is the position of an address 21.

If the multiple b is 1 and the number m of bits of one symbol is 10 bits by employing, for example, 1024QAM as a modulation scheme, according to FIG. 30, the memory 31 has 10 columns storing 10×1 bits in the row direction, and stores 16200/(10×1) bits in the column direction.

Then, among the ten columns of the memory 31, it is assumed that the write start position of the first column is the position of an address 0, the write start position of the second column is the position of an address 1, the write start position of the third column is the position of an address 2, the write start position of the fourth column is the position of an address 2, the write start position of the fifth column is the position of an address 3, the write start position of the sixth column is the position of an address 3, the write start position of the seventh column is the position of an address 4, the write start position of the eighth column is the position of an address 4, the write start position of the ninth column is the position of an address 5, and the write start position of the tenth column is the position of an address 7.

If the multiple b is 2 and the number m of bits of one symbol is 10 bits by employing, for example, 1024QAM as a modulation scheme, according to FIG. 30, the memory 31 has 20 columns storing 10×2 bits in the row direction, and stores 16200/(10×2) bits in the column direction.

Then, among the 20 columns of the memory 31, it is assumed that the write start position of the first column is the position of an address 0, the write start position of the second column is the position of an address 0, the write start position of the third column is the position of an address 0, the write start position of the fourth column is the position of an address 2, the write start position of the fifth column is the position of an address 2, the write start position of the sixth column is the position of an address 2, the write start position of the seventh column is the position of an address 2, the write start position of the eighth column is the position of an address 2, the write start position of the ninth column is the position of an address 5, the write start position of the tenth column is the position of an address 5, the write start position of the 11th column is the position of an address 5, the write start position of the 12th column is the position of an address 5, the write start position of the 13th column is the position of an address 5, the write start position of the 14th column is the position of an address 7, the write start position of the 15th column is the position of an address 7, the write start position of the 16th column is the position of an address 7, the write start position of the 17th column is the position of an address 7, the write start position of the 18th column is the position of an address 8, the write start position of the 19th column is the position of an address 8, and the write start position of the 20th column is the position of an address 10.

If the multiple b is 1 and the number m of bits of one symbol is 12 bits by employing, for example, 4096QAM as a modulation scheme, according to FIG. 30, the memory 31 has 12 columns storing 12×1 bits in the row direction, and stores 16200/(12×1) bits in the column direction.

Then, among the 12 columns of the memory 31, it is assumed that the write start position of the first column is the position of an address 0, the write start position of the second column is the position of an address 0, the write start position of the third column is the position of an address 0, the write start position of the fourth column is the position of an address 2, the write start position of the fifth column is the position of an address 2, the write start position of the sixth column is the position of an address 2, the write start position of the seventh column is the position of an address 3, the write start position of the eighth column is the position of an address 3, the write start position of the ninth column is the position of an address 3, the write start position of the tenth column is the position of an address 6, the write start position of the 11th column is the position of an address 7, and the write start position of the 12th column is the position of an address 7.

If the multiple b is 2 and the number m of bits of one symbol is 12 bits by employing, for example, 4096QAM as a modulation scheme, according to FIG. 30, the memory 31 has 24 columns storing 12×2 bits in the row direction, and stores 16200/(12×2) bits in the column direction.

Then, among the 24 columns of the memory 31, it is assumed that the write start position of the first column is the position of an address 0, the write start position of the second column is the position of an address 0, the write start position of the third column is the position of an address 0, the write start position of the fourth column is the position of an address 0, the write start position of the fifth column is the position of an address 0, the write start position of the sixth column is the position of an address 0, the write start position of the seventh column is the position of an address 0, the write start position of the eighth column is the position of an address 1, the write start position of the ninth column is the position of an address 1, the write start position of the tenth column is the position of an address 1, the write start position of the 11th column is the position of an address 2, the write start position of the 12th column is the position of an address 2, the write start position of the 13th column is the position of an address 2, the write start position of the 14th column is the position of an address 3, the write start position of the 15th column is the position of an address 7, the write start position of the 16th column is the position of an address 9, the write start position of the 17th column is the position of an address 9, the write start position of the 18th column is the position of an address 9, the write start position of the 19th column is the position of an address 10, the write start position of the 20th column is the position of an address 10, the write start position of the 21st column is the position of an address 10, the write start position of the 22nd column is the position of an address 10, the write start position of the 23rd column is the position of an address 10, and the write start position of the 24th column is the position of an address 11.

Figure 31:
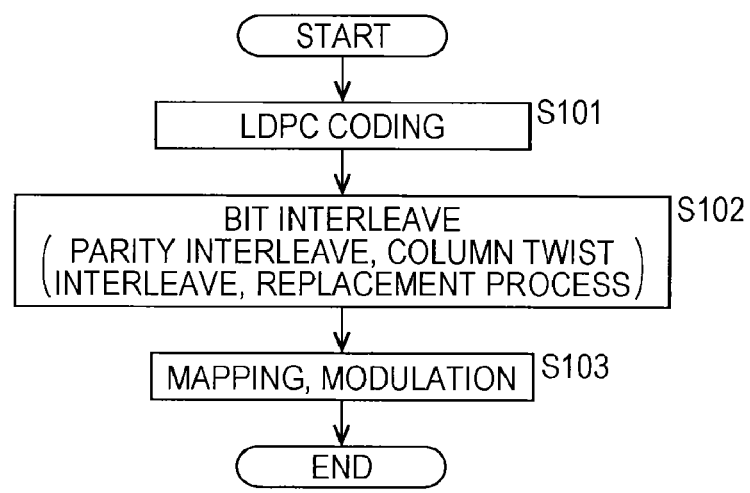
FIG. 31 is a flowchart illustrating a process performed in a bit interleaver 116 and a mapper 117.

FIG. 31 is a flowchart illustrating a process performed by the LDPC encoder 115, the bit interleaver 116, and the mapper 117 of FIG. 8.

The LDPC encoder 115 receives the LDPC target data supplied from the BCH encoder 114, LDPC-encodes the LDPC target data to the LDPC code in step S101, supplies the LDPC code to the bit interleaver 116, and the process proceeds to step S102.

The bit interleaver 116, in step S102, performs bit interleave on the LDPC code from the LDPC encoder 115, supplies a symbol obtained by symbolizing the LDPC code after the bit interleave to the mapper 117, and the process proceeds to step S103.

In other words, in step S102, in the bit interleaver 116 (FIG. 9), the parity interleaver 23 performs a parity interleave on the LDPC code from the LDPC encoder 115, and supplies the LDPC code after the parity interleave to the column twist interleaver 24.

The column twist interleaver 24 performs the column twist interleave on the LDPC code from the parity interleaver 23, and supplies it to the demultiplexer 25.

The demultiplexer 25 performs a replacement process of replacing the code bit of the LDPC code after the column twist interleave by the column twist interleaver 24, and setting the code bit after the replacement as the symbol bit of the symbol (bit that represents the symbol).

Here, the replacement process by the demultiplexer 25 may be performed according to the first to fourth replacement methods illustrated in FIG. 22 and FIG. 23, and may be performed according to another replacement method.

The symbol obtained by the replacement process by the demultiplexer 25 is supplied to the mapper 117 from the demultiplexer 25.

In step S103, the mapper 117 maps the symbol from the demultiplexer 25 to the signal point which is determined by the modulation scheme of quadrature modulation performed by the mapper 117 so as to perform quadrature modulation, and supplies the resulting data to the time interleaver 118.

It is possible to improve the resistance to an erasure or a burst error when transmitting a plurality of code bits of the LDPC code as one symbol, by performing and the parity interleave and the column twist interleave, as described above.

Here, in FIG. 9, for the convenience of description, the parity interleaver 23 which is a block performing parity interleave and the column twist interleaver 24 which is a block performing column twist interleave are configured separately, but the parity interleaver 23 and the column twist interleaver 24 can be configured integrally.

In other words, both the parity interleave and the column twist interleave may be performed by reading and writing code bits to the memory, and may be represented by a matrix that converts the address for writing the code bits (write address) into the address for reading the code bits (read address).

Therefore, if the matrix representing parity interleave and the matrix representing column twist interleave are multiplied so as to obtain a matrix and a code bit is converted by using the matrix, it is possible to achieve a resulting LDPC code by performing the parity interleave on the LDPC code and performing the column twist interleave on the LDPC code which has been subjected to the parity interleave.

Further, it is possible to collectively configure the demultiplexer 25 in addition to the parity interleaver 23 and the column twist interleaver 24.

In other words, it is possible to represent the replacement process performed in the demultiplexer 25 by a matrix obtained by converting a write address of the memory 31 storing the LDPC code into a read address.

Therefore, if a matrix is obtained by multiplexing the matrix representing parity interleave, the matrix representing column twist interleave, and the matrix representing a replacement process, it is possible to collectively perform the parity interleave, the column twist interleave, and the replacement process by using the matrix.

In addition, it is possible to perform only one or neither of the parity interleave and the column twist interleave. For example, when the communication path 13 (FIG. 7) is a satellite line or the like in which the burst error and flutter do not need to be considered, and the like, other than AWGN, as DVB-S.2, the parity interleave and the column twist interleave are not to be performed.

Next, a simulation of measuring an error rate (bit error rate) which is performed for the transmission apparatus 11 in FIG. 8 will be described with reference to FIG. 32 to FIG. 34.

The simulation is performed by employing a communication path having a flutter of D/U of 0 dB.

Figure 32:
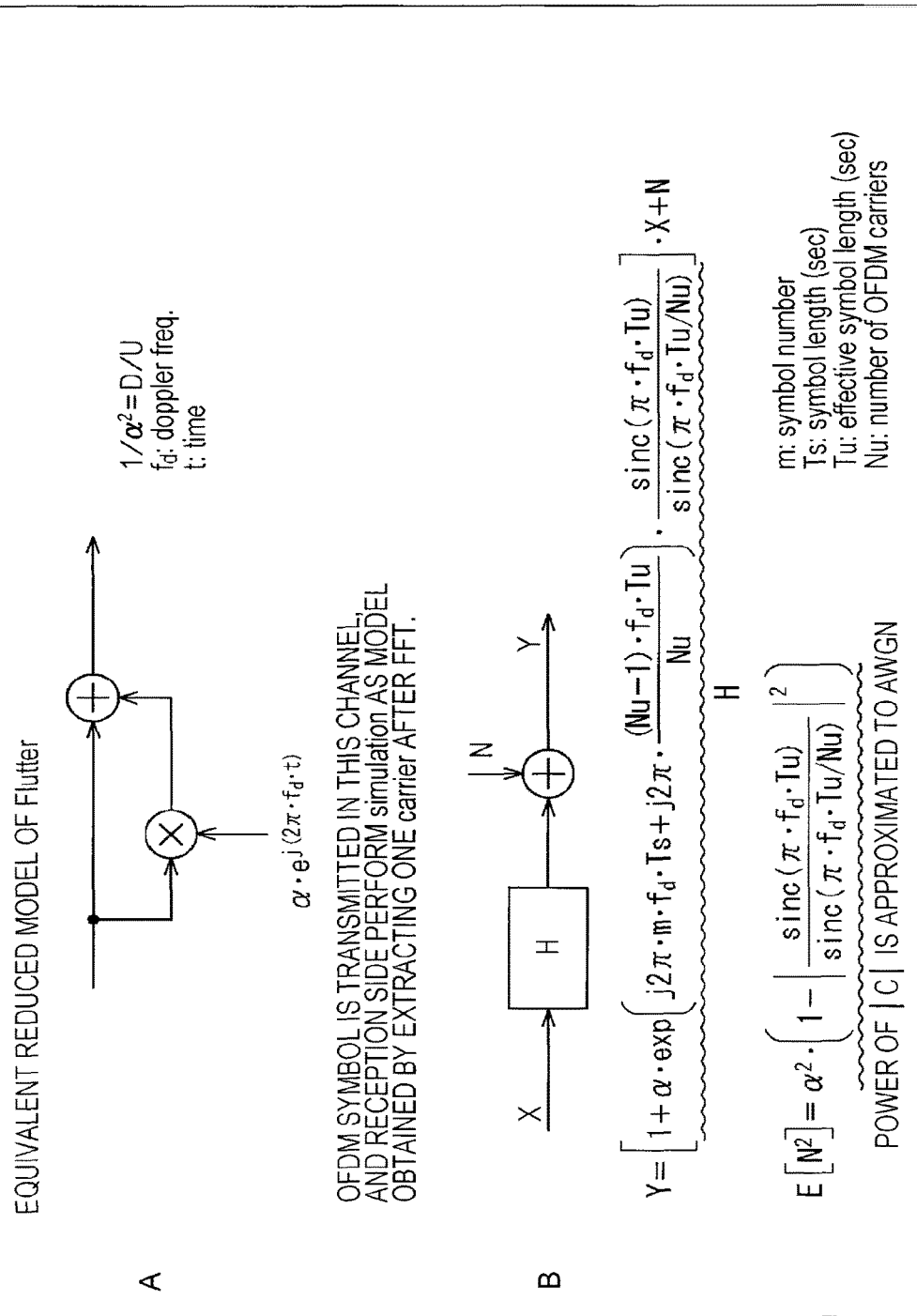
FIG. 32 is a diagram illustrating a communication path model employed in a simulation.

FIG. 32 is a diagram illustrating a communication path model employed in a simulation.

In other words, A of FIG. 32 illustrates a model of a flutter employed in the simulation.

Further, B of FIG. 32 illustrates a model of a communication path having the flutter represented by the model of A of FIG. 32.

In addition, in B of FIG. 32, H represents a model of the flutter in FIG. 32. Further, in B of FIG. 32, N represents Inter Carrier Interference (ICI), and in the simulation, an expected value $E[N^2]$ of the power is approximated to AWGN.

Figure 33:
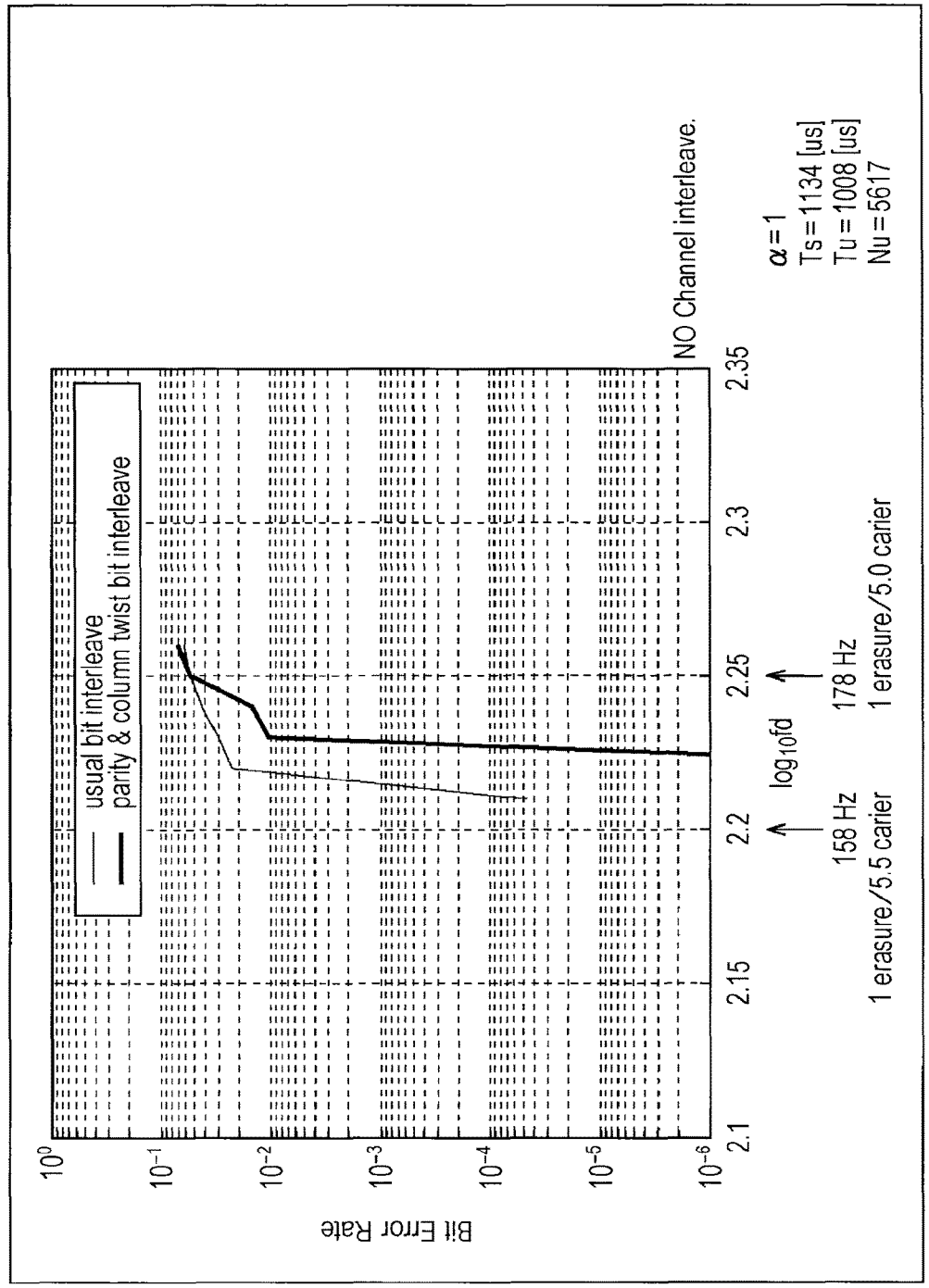
FIG. 33 is a diagram illustrating a relationship between an error rate obtained by the simulation and a Doppler frequency $f_d$ of a flutter.
Figure 34:
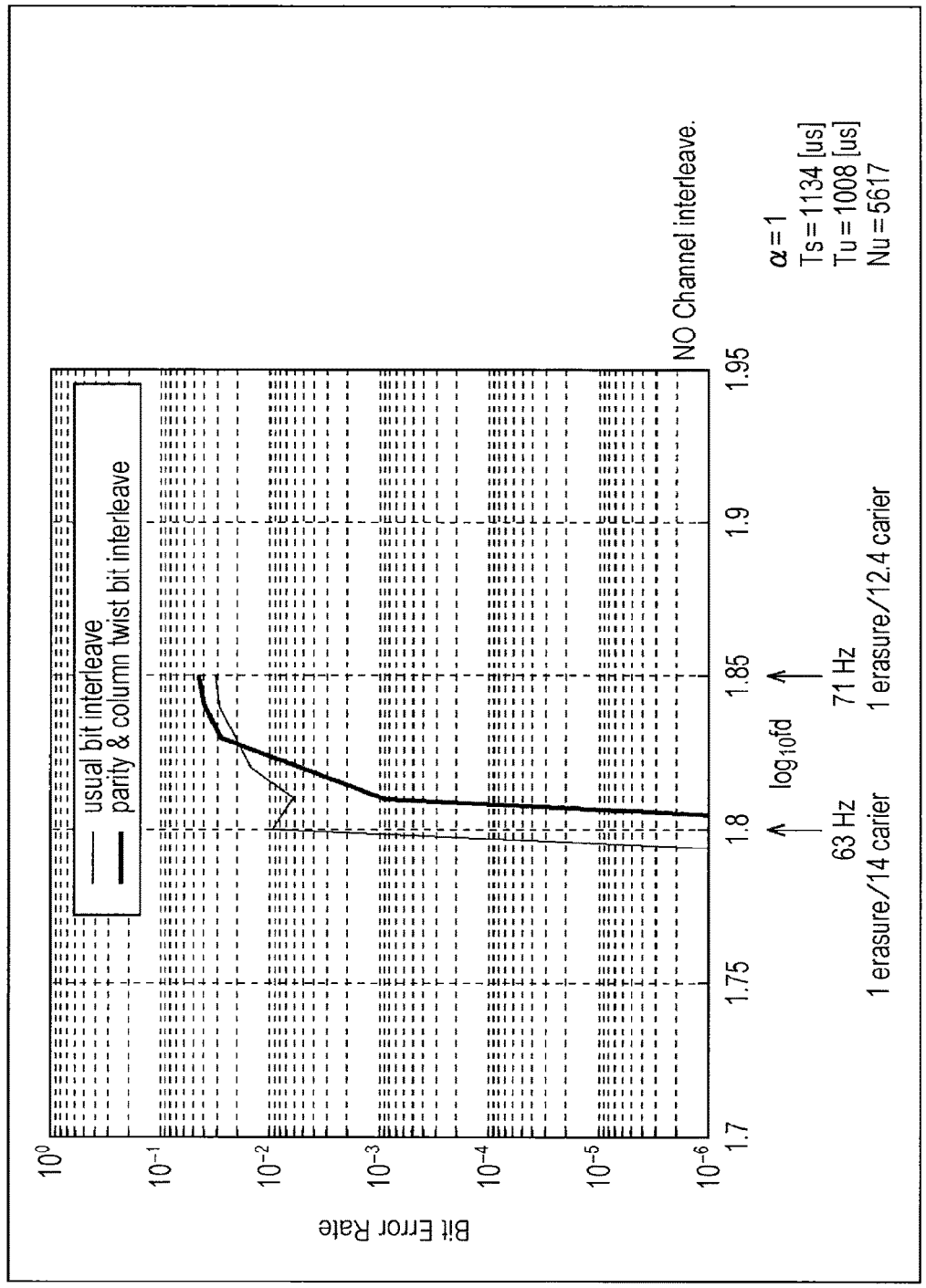
FIG. 34 is a diagram illustrating a relationship between an error rate obtained by the simulation and a Doppler frequency $f_d$ of a flutter.

FIG. 33 and FIG. 34 show a relationship between the error rate obtained by the simulation and the Doppler frequency $f_d$ of the flutter.

In addition, FIG. 33 shows a relationship between the error rate and the Doppler frequency $f_d$, when the modulation scheme is 16QAM and the code rate (r) is (3/4), and the replacement method is the first replacement method. Further, FIG. 34 shows a relationship between the error rate and the Doppler frequency $f_d$, when the modulation scheme is 64QAM and the code rate (r) is (5/6), and the replacement method is the first replacement method.

Further, in FIG. 33 and FIG. 34, a thick line shows the relationship between the error rate and the Doppler frequency $f_d$ in the case of performing all of the parity interleave, the column twist interleave, and the replacement process, and a thin line shows the relationship between the error rate and the Doppler frequency $f_d$ in the case of performing only the replacement process among the parity interleave, the column twist interleave, and the replacement process.

In either FIG. 33 or FIG. 34, it is ascertained that the error rate is more improved (reduced) in the case of performing all of the parity interleave, the column twist interleave, and the replacement process than in the case of performing only the replacement process.

<Configuration Example of LDPC Encoder 115>

Figure 35:
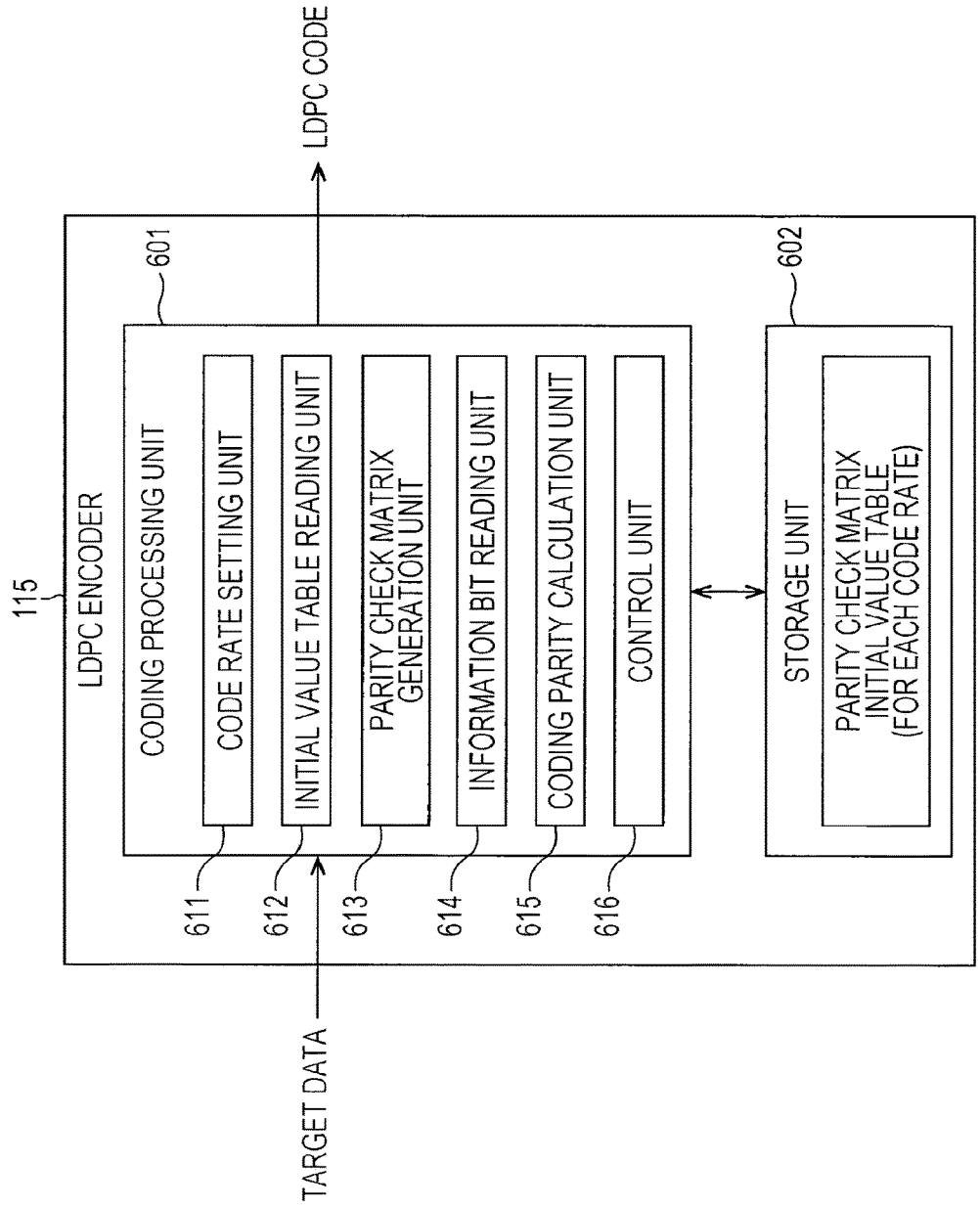
FIG. 35 is a block diagram illustrating a configuration example of an LDPC encoder 115.

FIG. 35 is a block diagram illustrating a configuration example of the LDPC encoder 115 of FIG. 8.

In addition, the LDPC encoder 122 of FIG. 8 is configured similarly.

As described in FIG. 12 and FIG. 13, in the standards of DVB-S.2 and the like, the LDPC codes of two types of code lengths N of 64800 bits and 16200 bits are defined.

11 code rates 1/4, 1/3, 2/5, 1/2, 3/5, 2/3, 3/4, 4/5, 5/6, 8/9, and 9/10 are defined for the LDPC code of code length N of 64800 bits, and 10 code rates 1/4, 1/3, 2/5, 1/2, 3/5, 2/3, 3/4, 4/5, 5/6, and 8/9 are defined for the LDPC code of code length N of 16200 bits (FIG. 12 and FIG. 13).

The LDPC encoder 115 may perform coding (error correction coding) by the LDPC code of each code rate of code lengths N of 64800 bits and 16200 bits, for each code length N, according to the parity check matrix H prepared for each code rate.

The LDPC encoder 115 is configured with a coding processing unit 601 and a storage unit 602.

The coding processing unit 601 is configured with a code rate setting unit 611, an initial value table reading unit 612, a parity check matrix generation unit 613, an information bit reading unit 614, a coding parity calculation unit 615, and a control unit 616, performs LDPC coding on the LDPC target data supplied to the LDPC encoder 115, and supplies the resulting LDPC code to the bit interleaver 116 (FIG. 8).

In other words, the code rate setting unit 611 sets the code length N and the code rate of the LDPC code in response to, for example, an operator's operations, or the like.

The initial value table reading unit 612 reads a parity check matrix initial value table, which will be described later, corresponding to the code length N and the code rate which are set by the code rate setting unit 611, from the storage unit 602.

The parity check matrix generation unit 613 generates a parity check matrix H and stores the matrix H in the storage unit 602, by arranging the elements of 1 in the information matrix $H_A$ corresponding to the information length K (=code length N-parity length M) according the code length N and the code rate which are set by the code rate setting unit 611, based on the parity check matrix initial value table read by the initial value table reading unit 612, in the column direction, in a period of 360 columns (the number p of columns of a unit of a cyclic structure).

The information bit reading unit 614 reads (extracts) the information bit of the information length K, from the LDPC target data supplied to the LDPC encoder 115.

The coding parity calculation unit 615 generates a codeword (LDPC code) by reading the parity check matrix H generated by the parity check matrix generation unit 613 from the storage unit 602, and calculating the parity bit for the information bit which is read by the information bit reading unit 614 based on a predetermined equation, by using the parity check matrix H.

The control unit 616 controls respective blocks configuring the coding processing unit 601.

The storage unit 602 stores, for example, a plurality of parity check matrix initial value tables corresponding to each of a plurality of code rates shown in FIG. 12 and FIG. 13, for each of the code lengths N of 64800 bits and 16200 bits. Further, the storage unit 602 temporarily stores data required for the process by the coding processing unit 601.

Figures 36, 37:
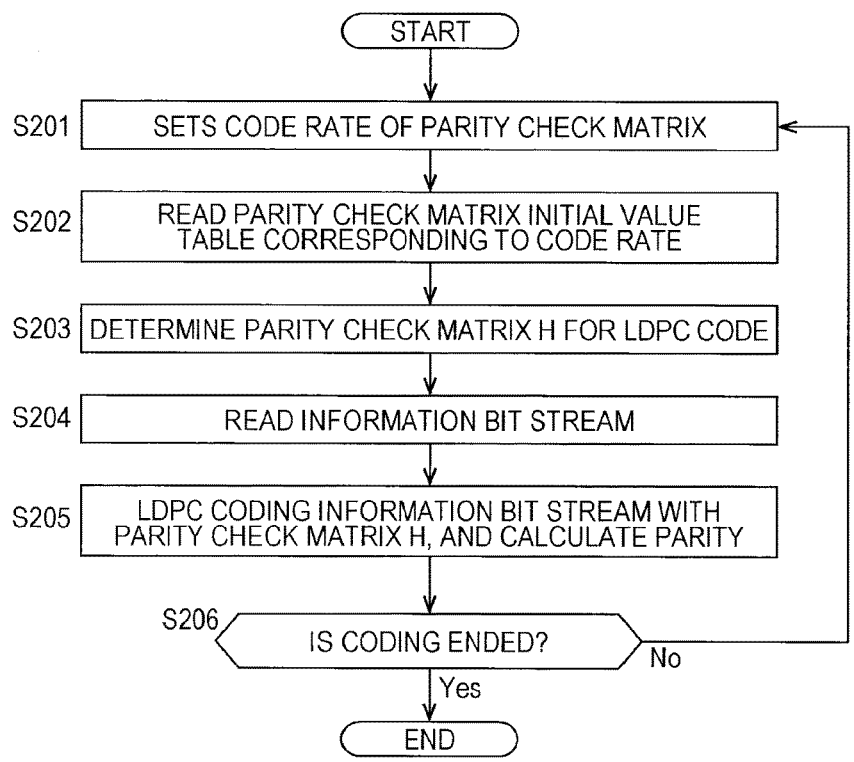
FIG. 36 is a flowchart illustrating a process of the LDPC encoder 115.
FIG. 37 is a diagram illustrating an example of a parity check matrix initial value table in which a code rate is 1/4 and a code length is 16200.

FIG. 36 is a flowchart illustrating a process of the LDPC encoder 115 in FIG. 35.

In step S201, the code rate setting unit 611 determines (sets) the code length N and the code rate r for performing LDPC coding.

In step S202, the initial value table reading unit 612 reads a parity check matrix initial value table which is set in advance, corresponding to the code length N and the code rate r which are determined by the code rate setting unit 611, from the storage unit 602.

In step S203, the parity check matrix generation unit 613 obtains (generates) the parity check matrix H of the LDPC code of the code length N and the code rate r which are determined by the code rate setting unit 611, by using the parity check matrix initial value table which is read from the storage unit 602 by the initial value table reading unit 612, and supplies and stores the parity check matrix H in the storage unit 602.

In step S204, the information bit reading unit 614 reads the information bit of the information length K (=N×r) corresponding to the code length N and the code rate r which are determined by the code rate setting unit 611 from the LDPC target data supplied to the LDPC encoder 115, reads the parity check matrix H which is obtained by the parity check matrix generation unit 613 from the storage unit 602, and supplies the information bit and the parity check matrix H to the coding parity calculation unit 615.

In step S205, the coding parity calculation unit 615 sequentially calculates the parity bit of the codeword c satisfying the equation (8), by using the information bit and the parity check matrix H from the information bit reading unit 614.

$$Hc^T = 0 \qquad (8)$$

In the equation (8), c represents a row vector as a codeword (LDPC code), and $c^T$ represents a vector obtained by transporting the row vector c.

Here, as described above, when the part of the information bit is represented by a row vector A, and the part of the parity bit is represented by a row vector T, in the row vector c which is the LDPC code (1 codeword), the row vector c can be represented by the equation c=[A|T], by the row vector A as the information bit and the row vector T as the parity bit.

The parity check matrix H and the row vector c=[A|T] as the LDPC code need to satisfy an equation $Hc^T=0$, and when the parity matrix $H_T$ of the parity check matrix $H=[H_A|H_T]$ has the staircase structure shown in FIG. 11, the row vector T as a parity bit configuring the row vector c=[A|T] satisfying the equation $Hc^T=0$ may be obtained sequentially, by making elements of each row 0, in order from the element in the first row of the column vector $Hc^T$ in the equation $Hc^T=0$.

The coding parity calculation unit 615 obtains the parity bit T for the information bit A from the information bit reading unit 614, and outputs the codeword c=[A|T] represented by the information bit A and the parity bit T, as the LDPC coding result of the information bit A.

Thereafter, in step S206, the control unit 616 determines whether or not the LDPC coding is ended. In step S206, when it is determined that the LDPC coding is not completed, in other words, for example, when there is still an LDPC target data to be subjected to the LDPC coding, the process returns to step S201 (or step S204), and thereafter, the process from the step S201 (or step S204) to S206 is repeated.

Further, in step S206, when it is determined that the LDPC coding is ended, in other words, for example, when there is no LDPC target data to be subjected to the LDPC coding, the LDPC encoder 115 ends the process.

As described above, a parity check matrix initial value table corresponding to each code length N and each code rate r is prepared, the LDPC encoder 115 performs the LDPC coding of a predetermined code rate r of a predetermined code length N, by using the parity check matrix H generated from the parity check matrix initial value table corresponding to the predetermined code length N and the predetermined code rate r.

<Example of Parity Check Matrix Initial Value Table>

The parity check matrix initial value table is a table that represents the positions of elements of 1 of an information matrix $H_A$ (FIG. 10) corresponding to the information length K corresponding to the code length N and code rate r of the LDPC code of the parity check matrix H (LDPC code defined by the parity check matrix H) at an interval of 360 columns (column number P in units of cyclic structure), and is created in advance for each parity check matrix H of each code length N and each code rate r.

FIG. 37 is a diagram illustrating an example of the parity check matrix initial value table.

In other words, FIG. 37 shows a parity check matrix initial value table for the parity check matrix H which is defined in DVB-T.2 standard and of which the code length N is 16200 bits and the code rate r (code rate on the representation of DVB-T.2) is 1/4.

The parity check matrix generation unit 613 (FIG. 35) obtains the parity check matrix H by using the parity check matrix initial value table in the following manner.

FIG. 38 is a diagram describing a method of obtaining the parity check matrix H from the parity check matrix initial value table.

In other words, FIG. 38 shows a parity check matrix initial value table for the parity check matrix H which is defined in DVB-T.2 standard and of which the code length N is 16200 bits and the code rate r 2/3.

As described above, the parity check matrix initial value table is a table representing the positions of elements of 1 in an information matrix $H_A$ (FIG. 10) corresponding to the information length K according to the code length N and code rate r of the LDPC code at an interval of 360 columns (the number P of columns in a unit of a cyclic structure), and row numbers (row numbers assuming that the row number of the first row of the parity check matrix H is 0) of elements of 1 in the (1+360×(i−1))-th column of the parity check matrix H are arranged by the number of the column weight of the (1+360×(i−1))-th column, in the i-the row.

Here, since the parity matrix $H_T$ (FIG. 10) corresponding to the parity length M, of the parity check matrix H is determined as illustrated in FIG. 25, according to the parity check matrix initial value table, the information matrix $H_A$ (FIG. 10) corresponding to the information length K, of the parity check matrix H is obtained.

The number k+1 of rows of the parity check matrix initial value table changes depending on the information length K.

The relationship of the equation (9) is established between the information length K and the number k+1 of rows of the parity check matrix initial value table.

$$K=(k+1)\times 360 \qquad (9)$$

Here, 360 in the equation (9) is number P of columns of a unit of the cyclic structure described in FIG. 26.

In the parity check matrix initial value table of FIG. 38, 13 numbers are arranged from the first row to the third row, and three numbers are arranged from the fourth row to the (k+1)-th row (in FIG. 38, up to the 30th row).

Therefore, the column weight of the parity check matrix H obtained from the parity check matrix initial value table of FIG. 38 is 13 from the first row to the {1+360×(3−1)−1}-th row, and is 3 from the (1+360×(3−1))-th row to the K-th row.

0, 2084, 1613, 1548, 1286, 1460, 3196, 4297, 2481, 3369, 3451, 4620, and 2622 are in the first row of the parity check matrix initial value table of FIG. 38, which shows that the elements of the rows of the row numbers 0, 2084, 1613, 1548, 1286, 1460, 3196, 4297, 2481, 3369, 3451, 4620, and 2622 in the first column of the parity check matrix H are 1 (other elements are 0).

Further, 1, 122, 1516, 3448, 2880, 1407, 1847, 3799, 3529, 373, 971, 4358, and 3108 are in the second row of the parity check matrix initial value table of FIG. 38, which shows that the elements of the rows of the row numbers 1, 122, 1516, 3448, 2880, 1407, 1847, 3799, 3529, 373, 971, 4358, and 3108 in the 361 (=1+360×(2−1))-th column of the parity check matrix H are 1.

As described above, the parity check matrix initial value table represents the positions of elements of 1 in the information matrix $H_A$ of the parity check matrix H at an interval of 360 columns.

The columns other than the (1+360×(i−1))-th columns in the parity check matrix H, in other words, respective columns from the (2+360×(i−1))-th column to the (360×i)-th column are arranged by periodically cyclically shifting the elements of 1 in the (1+360×(i−1))-th column determined by the parity check matrix initial value table, according to the parity length M, in the down direction (the down direction of a column).

In other words, for example, the (2+360×(i−1))-th column is obtained by cyclically shifting the (1+360×(i−1))-th column by M/360(=q) in the down direction, and the next (3+360×(i−1))-th column is obtained by cyclically shifting the (2+360×(i−1))-th column which is obtained by cyclically shifting the (1+360×(i−1))-th column by 2×M/360(=2×q) in the down direction, by M/360(=q) in the down direction.

Here, if it is assumed that the numerical value of the j-th column (j-th from the left) in the i-th row (i-th from the top) of the parity check matrix initial value table is represented by $h_{i,j}$, and the row number of the j-th element of 1 in the w-th column of the parity check matrix H is represented by $H_{w-j}$, the row number $H_{w-j}$ of the element of 1 in the w-th column which is a column other than the (1+360×(i−1))-th column of the parity check matrix H may be obtained by the equation (10).

$$H_{w-j}=\mathrm{mod}\ \{h_{i,j}+\mathrm{mod}((w-1),P)\times q,M\} \qquad (10)$$

Here, mod(x, y) means the remainder when dividing x by y.

Further, P is the number P of columns of a unit of the cyclic structure described above, and is 360, for example, in the standards of DVB-S.2, DVB-T.2, and DVB-C.2, as described above. Further, q is a value M/360 which is obtained by dividing the parity length M by the number P (=360) of columns of a unit of the cyclic structure.

The parity check matrix generation unit 613 (FIG. 35) specifies the row number of the element of 1 in the (1+360×(i−1))-th column of the parity check matrix H by the parity check matrix initial value table.

Further, the parity check matrix generation unit 613 (FIG. 35) obtains the row number $H_{w-j}$ of the element of 1 in the w-th column which is a column other than the (1+360×(i−1))-th column of the parity check matrix H by the equation (10), and generates the parity check matrix H in which the element of the row number obtained as described above is 1.

<New LDPC Code>

Meanwhile, it is expected that the demand of transmitting data of a large capacity such as an image of a high resolution will be increased in the future. In the transmission of data of a large capacity, the LDPC code of a high code rate (low redundancy) is required, but even when using the LDPC code with high code rate, it is desired to secure good communication quality.

Thus, as the LDPC code with high code rate in which good communication quality may be secured, for example, the LDPC code (hereinafter, referred to as new LDPC code) in which the code rate r is 12/15, and the code length N is 16 k bits will be described.

In addition, with respect to the new LDPC code, the parity matrix $H_T$ of the parity check matrix H has a staircase structure (FIG. 11) similarly to the LDPC code which is defined in the DVB-S.2, and the like, from the viewpoint of maintaining affinity (compatibility) with the LDPC code of the existing standards such as the DVB-S.2 as much as possible.

Further, with respect to the new LDPC code, the information matrix $H_A$ of the parity check matrix H has a cyclic structure, and the number P of columns of a unit of the cyclic structure is 360 similarly to the LDPC code which is defined in the DVB-S.2, and the like.

FIG. 39 is a diagram illustrating an example of the parity check matrix initial value table of a new LDPC code.

The LDPC encoder 115 (FIG. 8, FIG. 35) performs LDPC coding to the new LDPC code, by using the parity check matrix H obtained from the parity check matrix initial value table shown in FIG. 39.

In this case, the parity check matrix initial value table shown in FIG. 39 is stored in the storage unit 602 of the LDPC encoder 115 (FIG. 8).

The new LDPC code obtained by using the parity check matrix H obtained from the parity check matrix initial value table shown in FIG. 39 is a high performance-LDPC code.

Here, the high performance-LDPC code is the LDPC code obtained from an appropriate parity check matrix H.

Further, the appropriate parity check matrix H is a parity check matrix H satisfying a predetermined condition in which when the LDPC code obtained from the parity check matrix H is transmitted at a low $E_s/N_o$, or $E_b/N_o$ (signal power to noise power ratio per one bit), BER (and FER) is reduced).

The appropriate parity check matrix H may be obtained by performing a simulation of measuring the BER when for example, the LDPC code obtained from various check matrices satisfying the predetermined condition is transmitted at a low $E_s/N_o$.

A predetermined condition to be satisfied by an appropriate parity check matrix H is that an analysis result obtained by a method of analyzing a code performance called Density Evolution is good and there is no a loop of the elements of 1, which is called a cycle 4.

Here, in the information matrix $H_A$, if elements of 1 are dense as a cycle 4, it is known that the decoding performance of the LDPC code is deteriorated, therefore, it is required that there is no cycle 4 as a predetermined condition to be satisfied by an appropriate parity check matrix H.

In addition, it is possible to appropriately determine a predetermined condition to be satisfied by an appropriate parity check matrix H, from the viewpoint of improvement in the decoding performance of the LDPC code, and facilitation (simplification) of a decoding process of the LDPC code.

Figure 40:
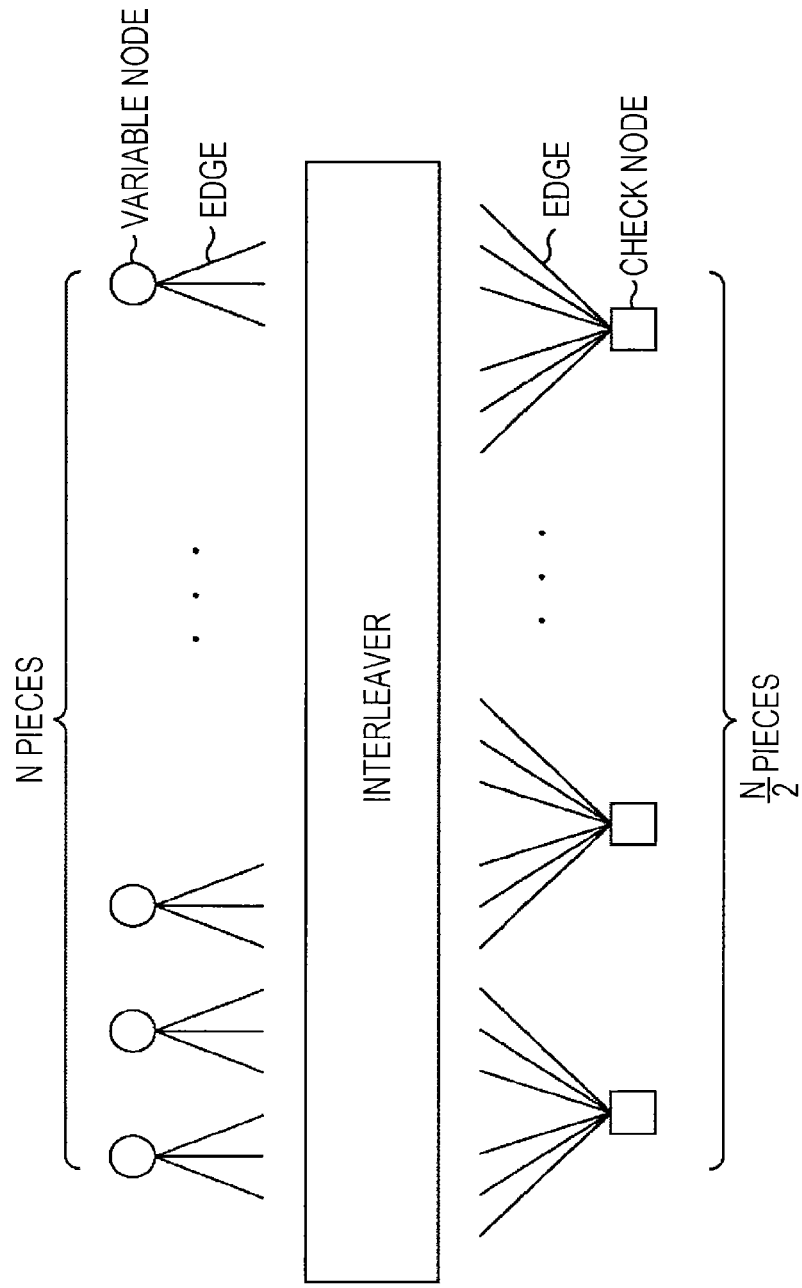
FIG. 40 is a diagram illustrating an example of a Tanner graph of ensemble of a degree sequence in which a column weight is 3 and a row weight is 6.
Figure 41:
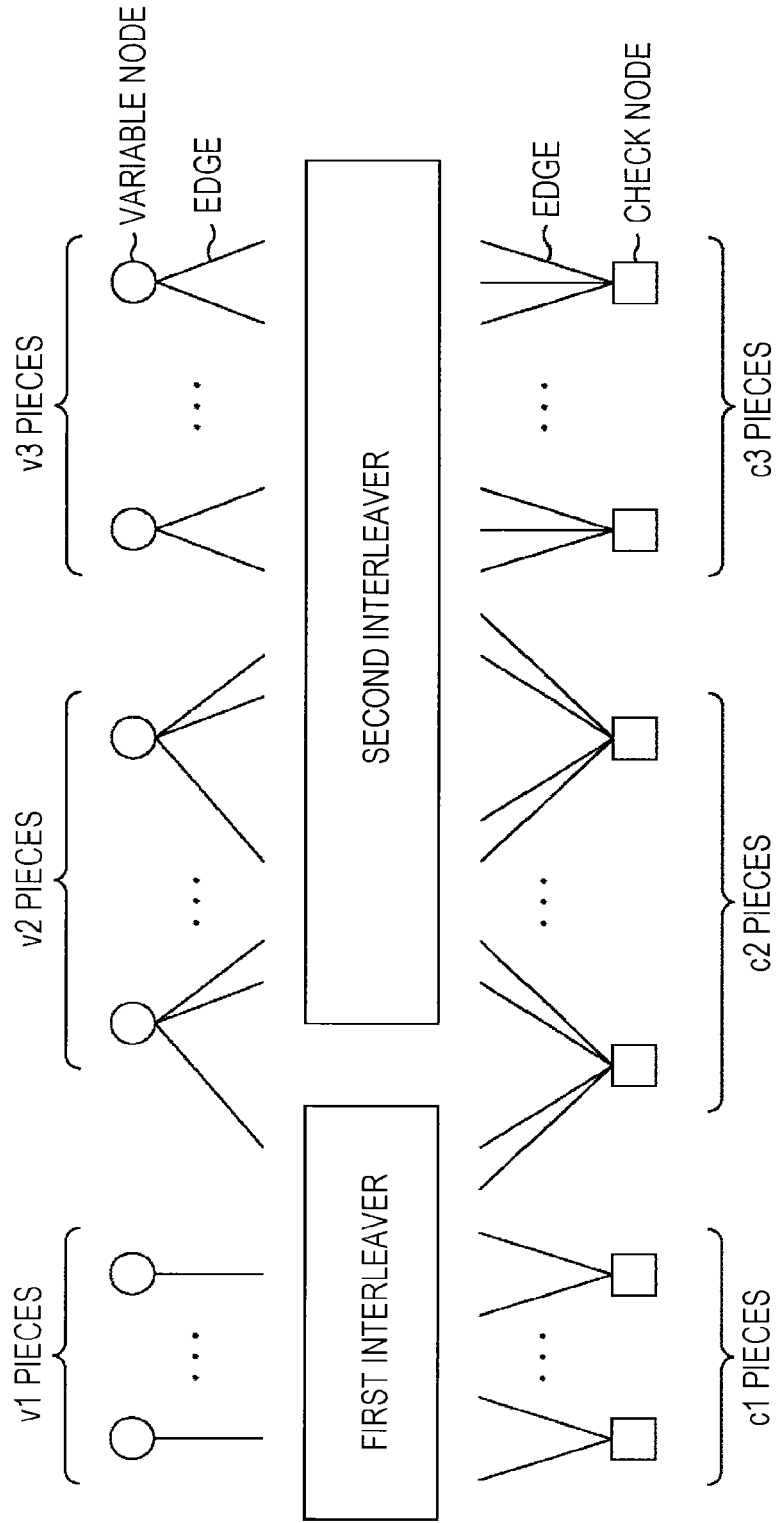
FIG. 41 is a diagram illustrating an example of a Tanner graph of a multi-edge type ensemble.

FIG. 40 and FIG. 41 are diagrams describing density evolution by which an analysis result is obtained as a predetermined condition to be satisfied by the appropriate parity check matrix H.

The density evolution is a code analysis method of calculating an expected value of an error probability for an entire LDPC code (ensemble) in which the code length N characterized by a degree sequence to be described later is ∞.

For example, the expected value of error probability of a certain ensemble is 0 at first on the AWGN channel, but if the variance of noise is gradually increasing from 0 and the variance of noise goes to a certain threshold or more, the expected value is not 0.

According to the density evolution, it is possible to determine the quality of the performance of the ensemble (adequacy of a parity check matrix) by comparing the threshold of the variance of the noise in which the expected value of error probability is not 0 (hereinafter, also referred to as a performance threshold).

In addition, if an ensemble to which a specific LDPC code belongs is determined for the LDPC code and the density evolution is performed for the ensemble, it is possible to predict an approximate performance of the LDPC code.

Therefore, if a high performance-ensemble is found, the high performance-LDPC code may be found among the LDPC codes belonging to the ensemble.

Here, the above described degree sequence represents a percentage of which the variable node and the check node with each weight are present, for the code length N of the LDPC code.

For example, the regular (3, 6) LDPC code of which a code rate is 1/2 belongs to an ensemble characterized by a degree sequence in which the weight (column weight) of all variable nodes is 3 and the weight (row weight) of all check nodes is 6.

FIG. 40 illustrates a Tanner graph of such an ensemble.

In the Tanner graph of FIG. 40, the number of variable nodes denoted by circle marks (○ mark) is N which is equal to the code length N, and the number of check nodes denoted by square marks (□ mark) is N/2 which is obtained by multiplying the code length N by a code rate 1/2.

Three edges having equal column weight are coupled to each variable node, therefore, in total, only 3N edges are coupled to the N variable nodes.

Six edges having equal column weight are coupled to each check node, therefore, in total, only 3N edges are coupled to the N/2 check nodes.

Further, in the Tanner graph of FIG. 40, one interleaver exists.

The interleaver randomly rearranges the 3N edges coupled to the N variable nodes, and connects each rearranged edge to any of the 3N edges coupled to the N/2 check nodes.

In the interleaver, a rearrangement pattern for rearranging the 3N edges coupled to the N variable nodes is as (3N)!(= (3N)×(3N−1)× . . . ×1). Therefore, the ensemble characterized by a degree sequence in which the weight of all variable nodes is 3 and the weight of all check nodes is 6 is an aggregation of (3N)! LDPC codes.

In the simulation of obtaining a high performance-LDPC code (appropriate parity check matrix), an ensemble of a multi-edge type is used in the density evolution.

In the multi-edge type, the interleaver, through which the edge coupled to the variable node and the edge coupled to the check node pass, is divided into multi edges, such that characterizing the ensemble is more strictly performed.

FIG. 41 illustrates an example of a Tanner graph of an ensemble of a multi-edge type.

In the Tanner graph of FIG. 41, two interleavers of a first interleaver and a second interleaver exist.

Further, in the Tanner graph of FIG. 41, only v1 variable nodes exist in which the number of edges connected to the first interleaver is 1 and the number of edges connected to the second interleaver is 0, only v2 variable nodes exist in which the number of edges connected to the first interleaver is 1 and the number of edges connected to the second interleaver is 2, and only v3 variable nodes exist in which the number of edges connected to the first interleaver is 0 and the number of edges connected to the second interleaver is 2.

Further, in the Tanner graph of FIG. 41, only c1 check nodes exist in which the number of edges connected to the first interleaver is 2 and the number of edges connected to the second interleaver is 0, only c2 check nodes exist in which the number of edges connected to the first interleaver is 2 and the number of edges connected to the second interleaver is 2, and only c3 check nodes exist in which the number of edges connected to the first interleaver is 0 and the number of edges connected to the second interleaver is 3.

Here, the density evolution and its implementation are described in, for example, "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In a simulation of obtaining a new LDPC code (a parity check matrix initial value table thereof), an ensemble is found in which a performance threshold is a predetermined value or less by using a density evolution of multi-edge type, and the LDPC code of which BER is reduced in the case of using one or more quadrature modulations such as QPSK among the LDPC codes belonging to the ensemble is selected as a high performance-LDPC code, here, the performance threshold is $E_b/N_0$ (signal power to noise power ratio per one bit) at which BER begins to fall (becomes smaller).

The parity check matrix initial value table of the new LDPC code described above is the parity check matrix initial value table of the LDPC code in which the code length N is 16 kbits and the code rate r is 12/15.

Therefore, according to the new LDPC code obtained from the parity check matrix initial value table, it is possible to secure good communication quality in data transmission.

Figures 42, 43:
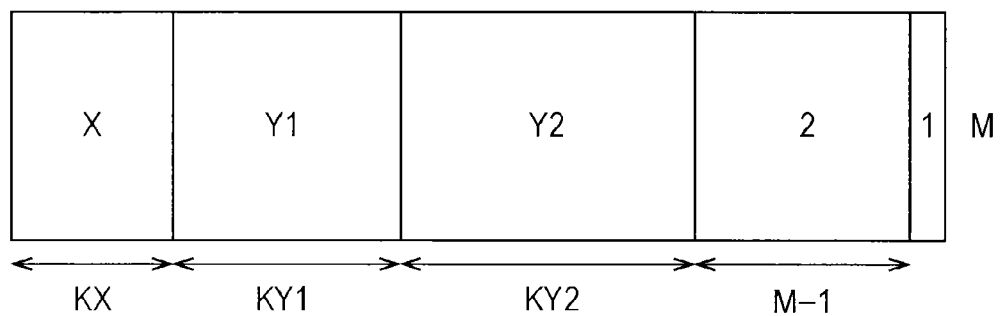
FIG. 42 is a diagram illustrating a minimum cycle length and a performance threshold of a parity check matrix of 16k code with r=12/15.
FIG. 43 is a diagram describing a parity check matrix of 16k code with r=12/15.

FIG. 42 is a diagram illustrating a minimum cycle length and a performance threshold of the parity check matrix H which are obtained from the parity check matrix initial value table of the new LDPC code of FIG. 39.

Here, the minimum cycle length (girth) means a minimum value of the length (loop length) of a loop configured with elements of 1.

For the parity check matrix H obtained from the parity check matrix initial value table of the new LDPC code, the minimum cycle length is 6, and the cycle 4 (a loop configured with elements of 1, having a loop length of 4) does not exist.

Further, the performance threshold of the new LDPC code is 4.269922.

FIG. 43 is a diagram describing a parity check matrix H (parity check matrix H of the new LDPC code) (which is obtained from the parity check matrix initial value table) of FIG. 39.

In the parity check matrix H of the new LDPC code, the column weight X is given to the first column to a KX column, and the column weight Y1 is given to the subsequent KY1 columns, the column weight Y2 is given to the subsequent KY2 columns, the column weight 2 is given to the subsequent M−1 columns, and the column weight 1 is given to the last one column.

Here, KX+KY1+KY2+M−1+1 is equal to the code length N=16200 bits.

FIG. 44 is a diagram illustrating the numbers of columns KX, KY1, KY2, and M in FIG. 43, and column weights X, Y1, and Y2, for the parity check matrix H of the new LDPC code.

In the parity check matrix H of the new LDPC code, similar to the parity check matrix described in FIG. 12 and FIG. 13, the closer to the first side (left side) the column is, the larger the column weight is likely to be, therefore, the code bit on the start side of the new LDPC code is likely to be strong in error (having a resistance to error).

Figure 45:
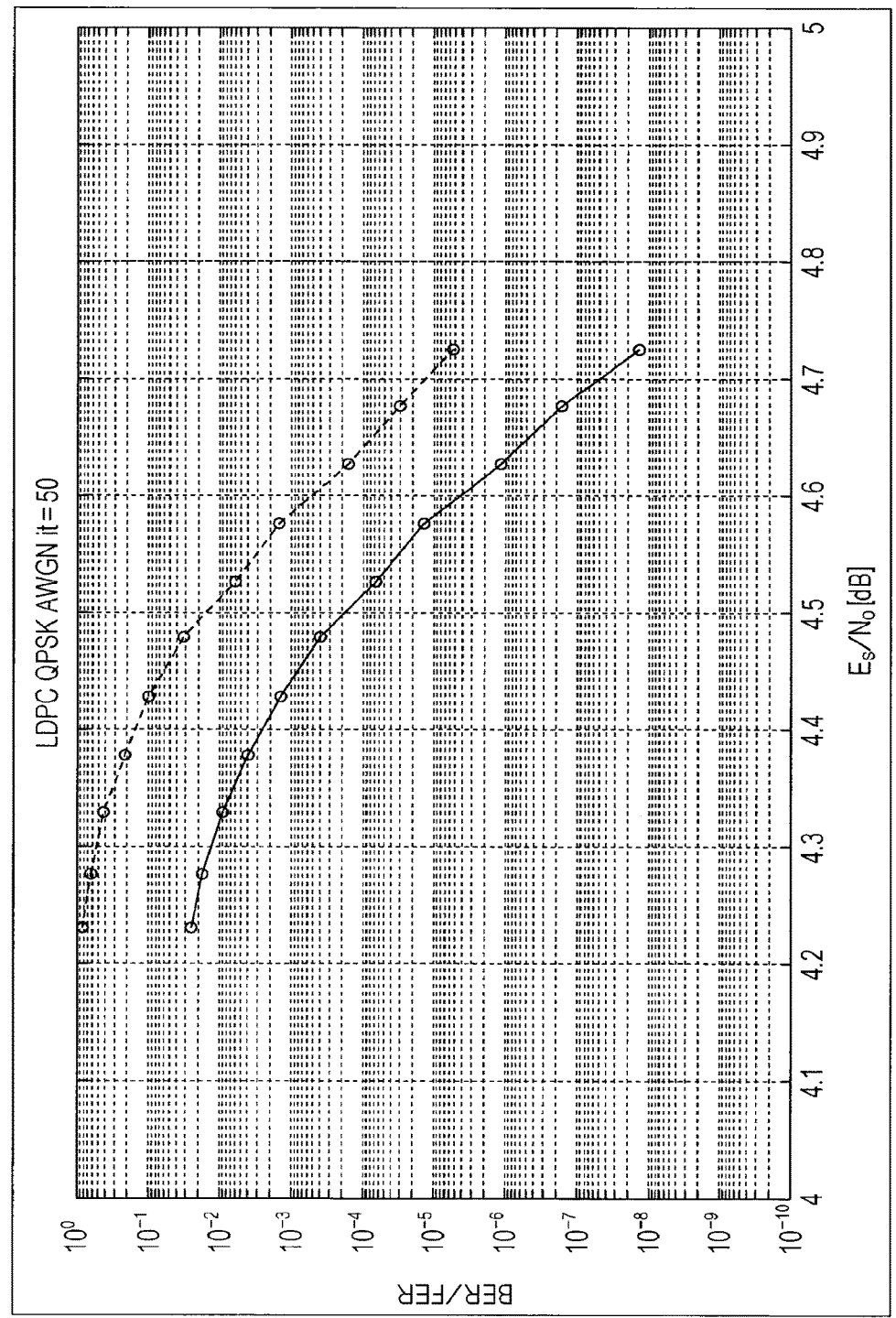
FIG. 45 is a diagram illustrating a simulation result of simulation of measuring BER/FER.

FIG. 45 is a diagram illustrating a simulation result of BER/FER of the new LDPC code of FIG. 39.

In the simulation, the communication path (channel) is assumed as AWGN, QPSK is adopted as a modulation scheme, and 50 is adopted as the iterative decoding number of times.

In FIG. 45, the horizontal axis represents $E_s/N_0$, and the vertical axis represents BER/FER. In addition, the solid line represents BER, and the dotted line represents FER.

According to FIG. 45, a good BER/FER is obtained for the new LDPC code, therefore, it is possible to check that good communication quality is secured in new data transmission using an LDPC code.

<Configuration Example of Reception Apparatus 12>

Figure 46:
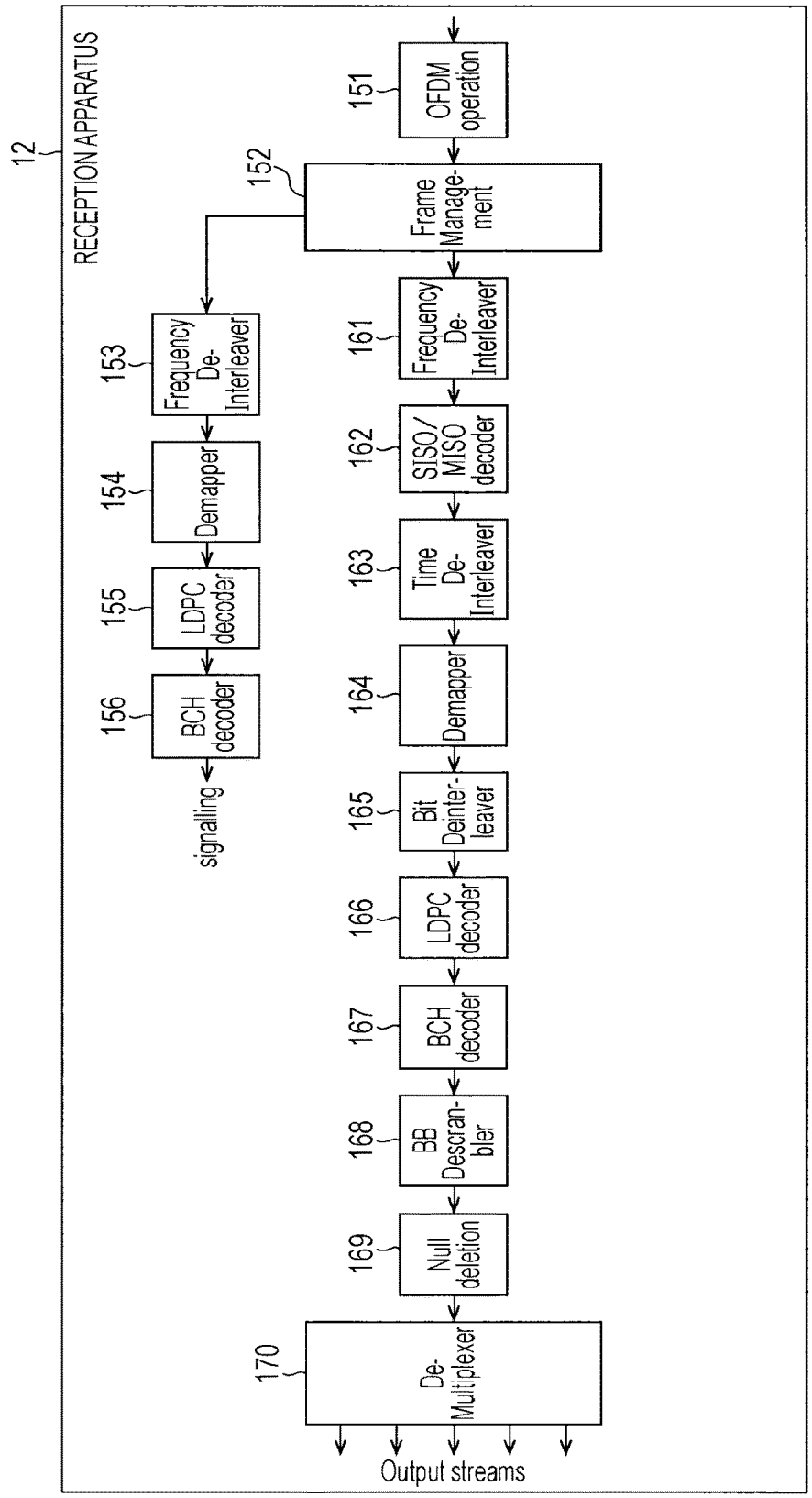
FIG. 46 is a block diagram illustrating a configuration example of a reception apparatus 12.

FIG. 46 is a block diagram illustrating a configuration example of the reception apparatus 12 of FIG. 7.

The OFDM processing unit (OFDM operation) 151 receives an OFDM signal from the transmission apparatus 11 (FIG. 7), and performs a signal process on the OFDM signal. The data by the OFDM processing unit 151 performing the signal process is supplied to the frame management unit 152.

The frame management unit 152 performs a process (frame analysis) on a frame configured with data supplied from the OFDM processing unit 151, and supplies the a resulting target data signal and a control data signal to the frequency deinterleavers 161 and 153, respectively.

The frequency deinterleaver 153 performs frequency deinterleave in symbol units on the data from the frame management unit 152, and supplies the resulting data to the demapper 154.

The demapper 154 performs demapping (signal point arrangement decoding) and quadrature demodulation of the data (data on the constellation) from the frequency deinterleaver 153, based on the arrangement (constellation) of a signal point as defined by quadrature modulation to be performed on the transmission apparatus 11 side, and supplies the resulting data (LDPC code (likelihood)) to the LDPC decoder 155.

The LDPC decoder 155 performs the LDPC decoding on the LDPC code from the demapper 154, and supplies the resulting LDPC target data (here, BCH code) to the BCH decoder (BCH decoder) 156.

The BCH decoder 156 performs the BCH decoding of the LDPC target data from the LDPC decoder 155, and outputs the resulting control data (signaling).

Meanwhile, the frequency deinterleaver 161 performs frequency deinterleave in symbol units on the data from the frame management unit 152, and supplies the resulting data to the SISO/MISO decoder 162.

The SISO/MISO decoder 162 performs space-time decoding of the data from the frequency deinterleaver 161, and supplies the resulting data to the time deinterleaver 163.

The time deinterleaver 163 performs time deinterleave in symbol units on the data from the SISO/MISO decoder 162, and supplies the resulting data to the demapper 164.

The demapper 164 performs demapping (signal point arrangement decoding) and quadrature demodulation of the data (data on the constellation) from the time deinterleaver 163, based on the arrangement (constellation) of the signal point as defined by quadrature modulation to be performed on the transmission apparatus 11 side, and supplies the resulting data to the bit deinterleaver 165.

The bit deinterleaver 165 performs the bit deinterleave of the data from the demapper 164, and supplies the LDPC code (likelihood) which is data subjected to the bit deinterleave, and supplies the resulting data to the LDPC decoder 166.

The LDPC decoder 166 performs the LDPC decoding on the LDPC code from the bit deinterleaver 165, and supplies the resulting LDPC target data (here, BCH code) to the BCH decoder 167.

The BCH decoder 167 performs the BCH decoding of the LDPC target data from the LDPC decoder 155, and outputs the resulting data to the BB descrambler 168.

The BB descrambler 168 performs the BB descrambling on the data from the BCH decoder 167, and supplies the resulting data to a null deletion unit (Null Deletion) 169.

The null deletion unit 169 deletes Null inserted by the padder 112 of FIG. 8, from data from the BB descrambler 168, and supplies the result to the demultiplexer 170.

The demultiplexer 170 separates one or more streams (object data) obtained by multiplexing the data from the null deletion unit 169 into each stream, performs necessary processes thereon, and outputs the result as an output stream.

In addition, the reception apparatus 12 can be configured without providing some blocks shown in FIG. 46 being provided. In other words, for example, if the transmission apparatus 11 (FIG. 8) is configured without the time interleaver 118, the SISO/MISO encoder 119, the frequency interleaver 120, and the frequency interleaver 124 being provided, the reception apparatus 12 can be configured without providing the time deinterleaver 163, the SISO/MISO decoder 162, the frequency deinterleaver 161, and the frequency deinterleaver 153 respectively corresponding to the time interleaver 118, the SISO/MISO encoder 119, the frequency interleaver 120, and the frequency interleaver 124 of the transmission apparatus 11.

Figure 47:
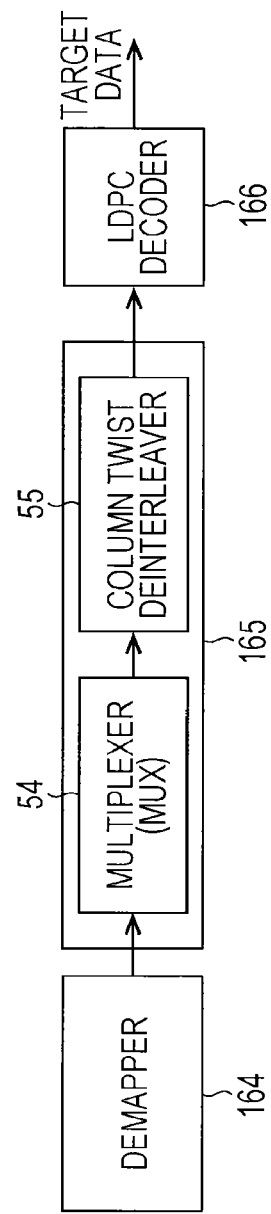
FIG. 47 is a block diagram illustrating a configuration example of a bit deinterleaver 165.

FIG. 47 is a block diagram illustrating a configuration example of a bit deinterleaver 165 in FIG. 46.

The bit deinterleaver 165 is configured with a multiplexer (MUX) 54 and a column twist deinterleaver 55, and performs (bit) deinterleave on the symbol bit of a symbol that is data from the demapper 164 (FIG. 46).

In other words, the multiplexer 54 performs a reverse replacement process (a process opposite to the replacement process) corresponding to the replacement process performed by the demultiplexer 25 in FIG. 9 on the symbol bit of the symbol from the demapper 164, in other words, the reverse replacement process of returning the position of the code bit (likelihood) of the LDPC code which is replaced by the replacement process to its original position, and supplies the resulting LDPC code to the column twist deinterleaver 55.

The column twist deinterleaver 55 performs a column twist deinterleave (a process opposite to the column twist interleave) corresponding to the column twist interleave as the rearrangement process performed by the column twist interleaver 24 in FIG. 9 on the LDPC code from the multiplexer 54, in other words, for example, a column twist deinterleave as the reverse replacement process of returning the code bit of the LDPC code of which the sequence is changed by the column twist interleave as the replacement process to its original sequence.

Specifically, the column twist deinterleaver 55 performs column twist deinterleave by writing and reading the code bit of the LDPC code to the deinterleave memory configured similarly to the memory 31 shown in FIG. 28.

Here, in the column twist deinterleaver 55, the writing of the code bit is performed in the row direction of the deinterleave memory by using the read address during the reading of the code bit from the memory 31 as the write address. Further, the reading of the code bit is performed by using the write address during the writing of the code bit to the memory 31 as the read address.

The LDPC code obtained from the column twist deinterleave is supplied from the column twist deinterleaver 55 to the LDPC decoder 166.

Here, when the parity interleave, the column twist interleave, and the replacement process are performed on the LDPC code supplied from the demapper 164 to the bit deinterleaver 165, in the bit deinterleaver 165, it is possible to perform a parity deinterleave corresponding to the parity interleave (a process opposite to the parity interleave, in other words, the parity deinterleave of returning the code bit of the LDPC code of which the sequence is changed by the parity interleave to its original sequence), the reverse replacement process corresponding to the replacement process, and the column twist deinterleave corresponding to the column twist interleave.

However, in the bit deinterleaver 165 in FIG. 47, the multiplexer 54 of performing the reverse replacement process corresponding to the replacement process, and the column twist deinterleaver 55 of performing the column twist deinterleave corresponding to the column twist interleave are provided, but a block of performing the parity deinterleave corresponding to the parity interleave is not provided and the parity deinterleave is not performed.

Therefore, the bit deinterleaver 165 (the column twist deinterleaver 55 thereof) performs the reverse replacement process and the column twist deinterleave on the LDPC decoder 166, and supplies the LDPC code which is not subjected to the parity deinterleave, to the LDPC decoder 166.

The LDPC decoder 166 performs the LDPC decoding on the LDPC code from the bit deinterleaver 165 by using a conversion parity check matrix obtained by performing at least column replacement corresponding to the parity interleave on the parity check matrix H used for the LDPC coding by the LDPC encoder 115 in FIG. 8, and outputs the resulting data as a decoding result of the LDPC target data.

Figure 48:
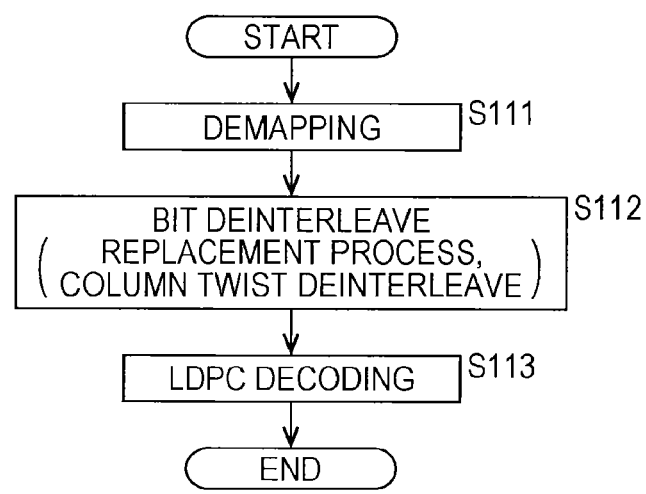
FIG. 48 is a flowchart illustrating a process performed by a demapper 164, the bit deinterleaver 165, and an LDPC decoder 166.

FIG. 48 is a flowchart illustrating a process performed by the demapper 164, the bit deinterleaver 165, and the LDPC decoder 166 in FIG. 47.

In step S111, the demapper 164 performs demapping and quadrature demodulation on the data (data on the constellation mapped to a signal point) from the time deinterleaver 163, and supplies the result to the bit deinterleaver 165, and the process proceeds to step S112.

The bit deinterleaver 165 performs deinterleave (bit deinterleave) on the data from the demapper 164 in step S112, and the process proceeds to step S113.

In other words, in step S112, the multiplexer 54 in the bit deinterleaver 165 performs the reverse replacement process on the data (corresponding to the symbol bit of the symbol) from the demapper 164, and supplies the code bit of the resulting LDPC code to the column twist deinterleaver 55.

The column twist deinterleaver 55 performs column twist deinterleave on the LDPC code from the multiplexer 54, and supplies the resulting LDPC code (likelihood) to the LDPC decoder 166.

In step S113, the LDPC decoder 166 performs the LDPC decoding on the LDPC code from the column twist deinterleaver 55 by using the parity check matrix H used for the LDPC coding by the LDPC encoder 115 in FIG. 8, in other words, by using the conversion parity check matrix H obtained by performing at least column replacement corresponding to the parity interleave on the parity check matrix H, and outputs the resulting data as a decoding result of the LDPC target data to the BCH decoder 167.

In addition, even in FIG. 47, similarly to the case in FIG. 9, for the convenience of description, the multiplexer 54 which performs the reverse replacement process and the column twist deinterleaver 55 which performs column twist deinterleave are configured separately, but the multiplexer 54 and the column twist deinterleaver 55 can be configured integrally.

Further, when the bit interleaver 116 in FIG. 9 does not perform the column twist interleave, the column twist deinterleaver 55 does not need to be provided in the bit deinterleaver 165 in FIG. 47.

Next, the LDPC decoding performed by the LDPC decoder 166 in FIG. 46 will be further described.

The LDPC decoder 166 in FIG. 46 performs the LDPC decoding on the LDPC code from the column twist deinterleaver 55 in which the reverse replacement process and the column twist deinterleave are performed and the parity deinterleave is not performed, as described above, on the parity check matrix H used for the LDPC coding by the LDPC encoder 115 in FIG. 8 by using the conversion parity check matrix obtained by performing at least column replacement corresponding to the parity interleave.

Here, an LDPC decoding has been proposed previously which is able to suppress an operating frequency to a sufficiently feasible range while suppressing the circuit scale by performing the LDPC decoding by using the conversion parity check matrix (for example, see Japanese Patent No. 4224777).

Thus, first, the LDPC decoding by using the conversion parity check matrix which has been proposed previously will be described with reference to FIG. 49 to FIG. 52.

Figure 49:
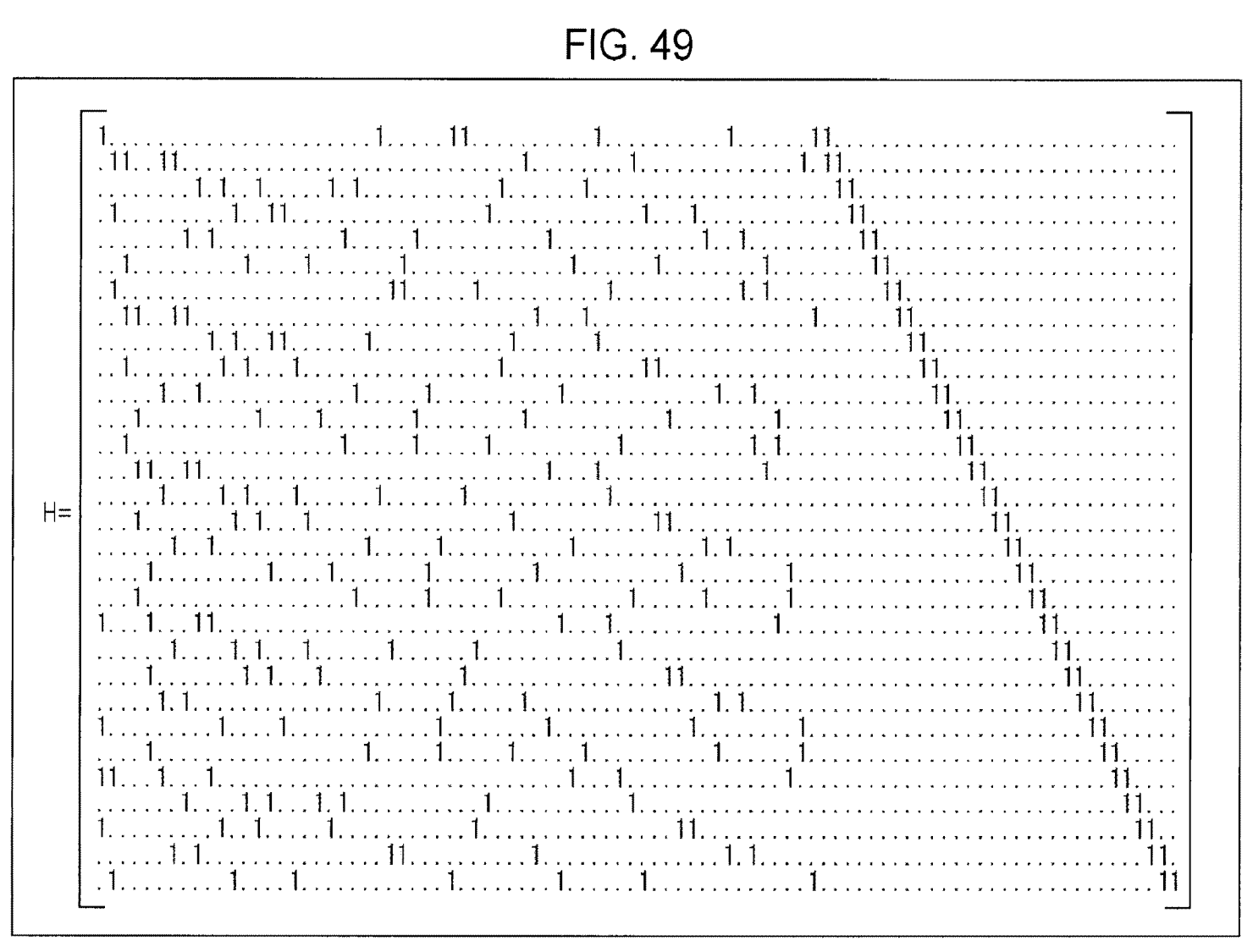

FIG. 49 illustrates an example of the parity check matrix H of an LDPC code of which the code length N is 90 and the code rate is 2/3.

In addition, in FIG. 49 (also in FIG. 50 and FIG. 51, which will be described later), 0 is expressed as period (.).

In the parity check matrix H in FIG. 49, the parity matrix has a staircase structure.

Figure 50:
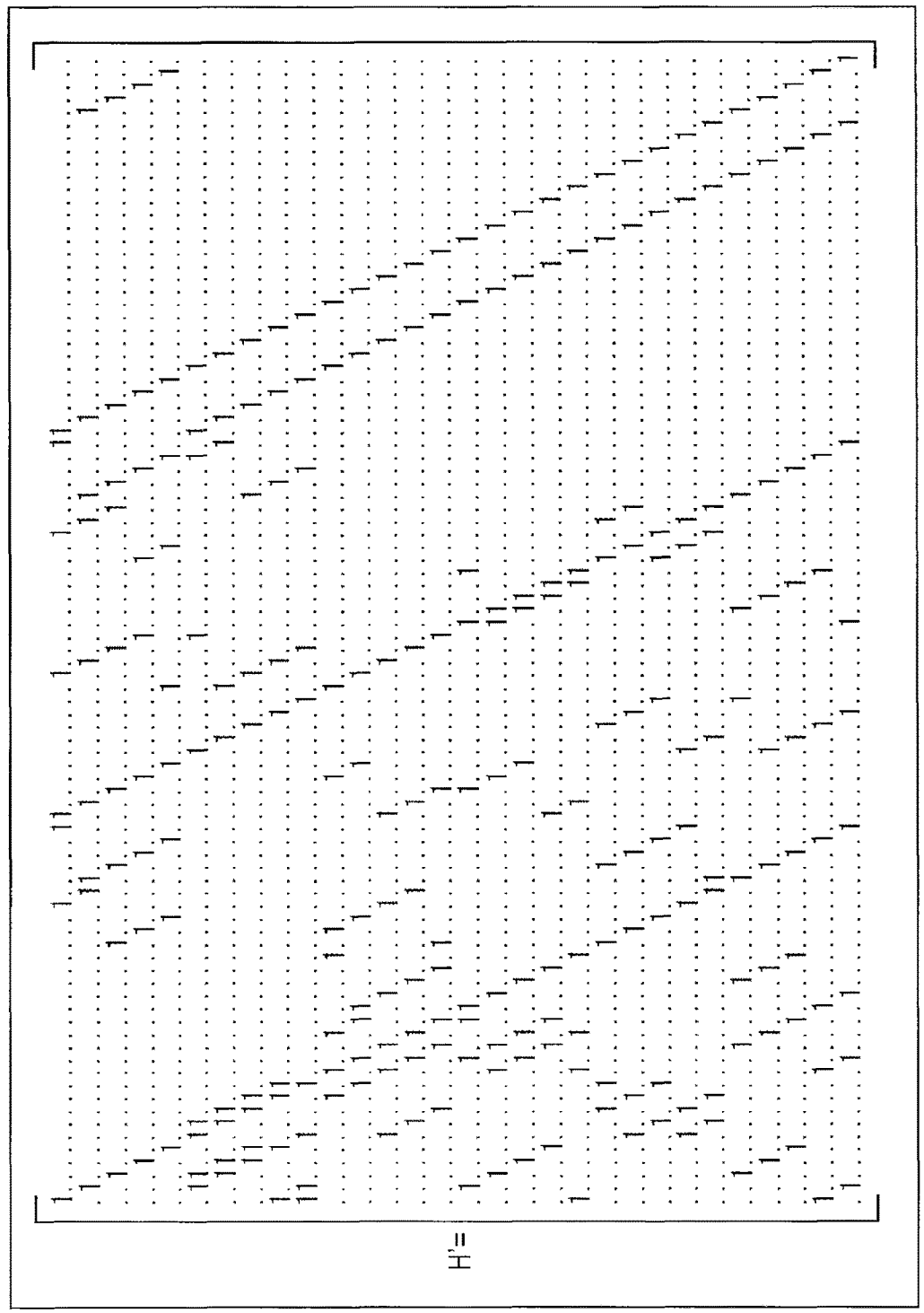
FIG. 50 is a diagram illustrating a matrix (conversion parity check matrix) obtained by performing row permutation and column permutation on a parity check matrix.

FIG. 50 illustrates a parity check matrix H' obtained by performing the row permutation of equation (11) and the column permutation of equation (12) on the parity check matrix H in FIG. 49.

Row permutation: $6s+t+1\text{row-}th \to 5t+s+1\text{row-}th$ (11)

Column permutation: $6x+y+61\text{column-}th \to 5y+x+61\text{column-}th$ (12)

Here, in the equations (11) and (12), s, t, x, and y are integers in respective ranges $0 \le s < 5$, $0 \le t < 6$, $0 \le x < 5$, and $0 \le t < 6$.

According to the row permutation of the equation (11), permutation is performed such that the first, seventh, 13th, 19th, and 25th rows which have remainders of 1 when dividing these by 6 are replaced with the first, second, third, fourth, and fifth rows, and the second, eighth, 14th, 20th, and 26th rows which have remainders of 2 when dividing these by 6 are replaced with the sixth, seventh, eighth, ninth, and tenth rows.

Further, according to the column permutation of the equation (12), permutation is performed such that the 61th, 67th, 73th, 79th, and 85th columns after the 61th column (parity matrix) which have remainders of 1 when dividing these by 6 are replaced with the 61th, 62th, 63th, 64th, and 65th columns, and the 62th, 68th, 74th, 80th, and 86th columns which have remainders of 2 when dividing these by 6 are replaced with the 66th, 67th, 68th, 69th, and 70th columns.

Thus, the matrix obtained by performing the row and column permutation on the parity check matrix H in FIG. 49 is the parity check matrix H' in FIG. 50.

Here, even if the row permutation is performed on the parity check matrix H, it does not affect the sequence of the code bit of the LDPC code.

Further, the column permutation of the equation (12) corresponds to a parity interleave that interleaves the (K+qx+y+1)-th code bit described above in the position of the (K+Py+x+1)-th code bit when respectively setting the information length K to 60, the number p of columns of a unit of a cyclic structure to 5, and the divisor q (=M/P) of the parity length M (here, 30) to 6.

Therefore, the parity check matrix H' of FIG. 50 is a conversion parity check matrix obtained by at least performing a column permutation of replacing the (K+qx+y+1)-th column of the parity check matrix of FIG. 49 (hereinafter, as appropriate, referred to as an original parity check matrix) H with the (K+qx+x+1)-th column.

If the LDPC code of the original parity check matrix H in FIG. 49 is replaced similarly to the equation (12) and is multiplied by the conversion parity check matrix H' of FIG. 50, 0 vector is output. In other words, if the row vector c obtained by performing a column permutation of the equation (12) on the row vector c as the LDPC code (1 codeword) of the original parity check matrix H is expressed as c', $Hc^T$ becomes 0 vector due to the property of the parity check matrix H, and thus $H'c'^T$ becomes surely 0 vector.

From the above, the conversion parity check matrix H' in FIG. 50 is the parity check matrix of the LDPC code c' obtained by performing column permutation of the equation (12) on the LDPC code c of the original parity check matrix H.

Therefore, it is possible to obtain the same decoding result as the case of decoding the LDPC code c of the original parity check matrix H by using the parity check matrix H, by decoding (LDPC decoding) the LDPC code c' subjected to the column permutation of the equation (12) on the LDPC code of the original parity check matrix H by using the conversion parity check matrix H' in FIG. 50, and by performing reverse permutation to the column permutation of the equation (12) on the decoding result.

Figure 51:
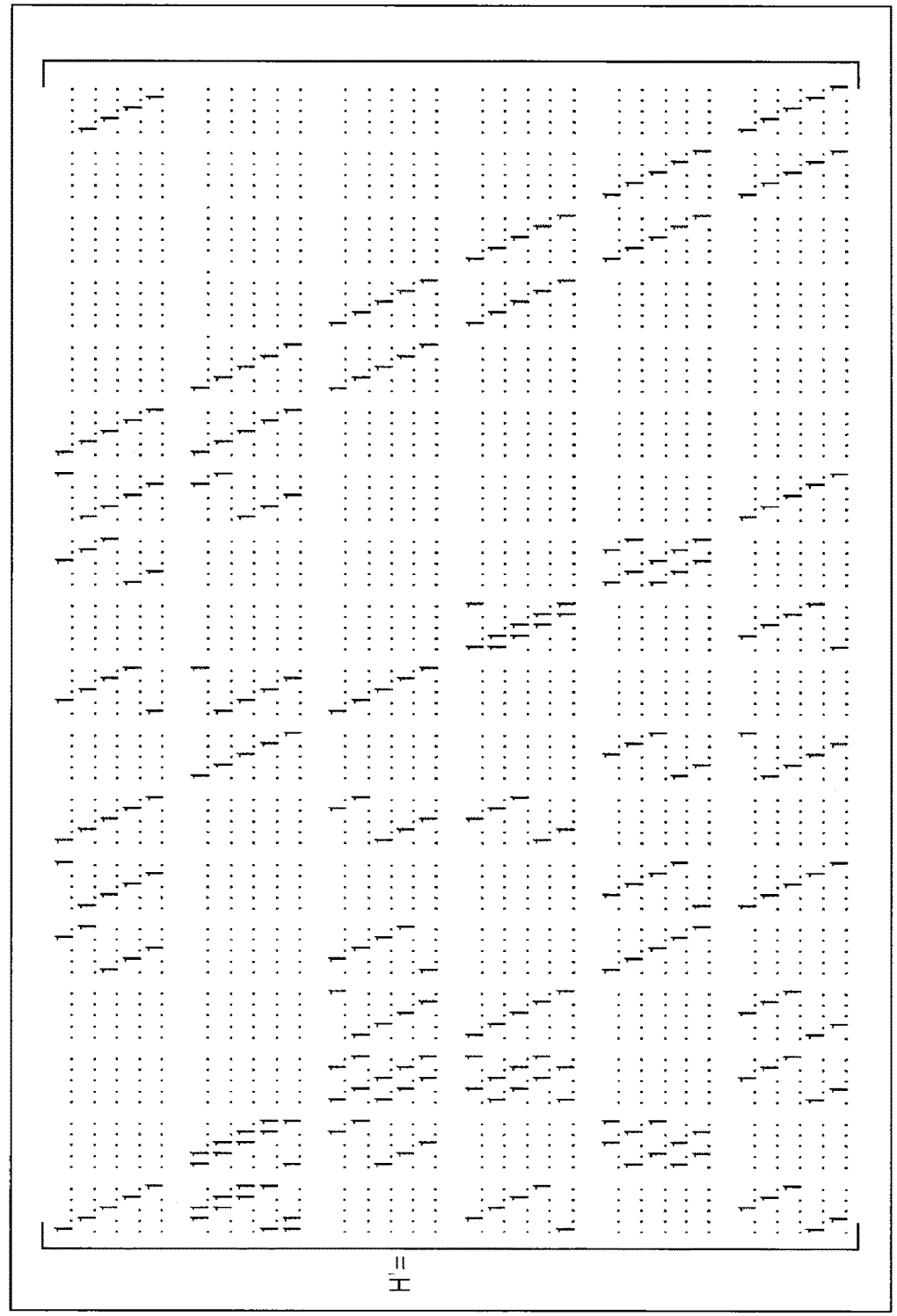
FIG. 51 is a diagram illustrating a conversion parity check matrix which is divided into 5×5 units.

FIG. 51 illustrates a conversion parity check matrix H' of FIG. 50 by being spaced in a unit of a 5×5 matrix.

In FIG. 51, the conversion parity check matrix H' is represented by combining a 5×5 (=P×P) unit matrix, a matrix having 0 for one or more elements of 1 in the unit matrix (hereinafter, as appropriate, referred to as a quasi-unit matrix), or a matrix obtained by cyclically shifting the unit matrix or the quasi-unit matrix (hereinafter, as appropriate, referred to as a shift matrix), a sum of two or more matrices out of the unit matrix, the quasi-unit matrix, and the shift matrix (hereinafter, as appropriate, referred to as a sum matrix), and a 5×5 zero matrix.

The conversion parity check matrix H' of FIG. 51 may be configured with the 5×5 unit matrix, the quasi-unit matrix, the shift matrix, the sum matrix, and the zero matrix. Thus, the 5×5 matrices (the unit matrix, the quasi-unit matrix, the shift matrix, the sum matrix, and the zero matrix) configuring the conversion parity check matrix H' are referred to as, hereinafter, as appropriate, configuration matrices.

It is possible to use an architecture which simultaneously performs the check node calculations and the variable node calculations P number of times, for decoding the LDPC code of the parity check matrix expressed by the P×P configuration matrices.

Figure 52:
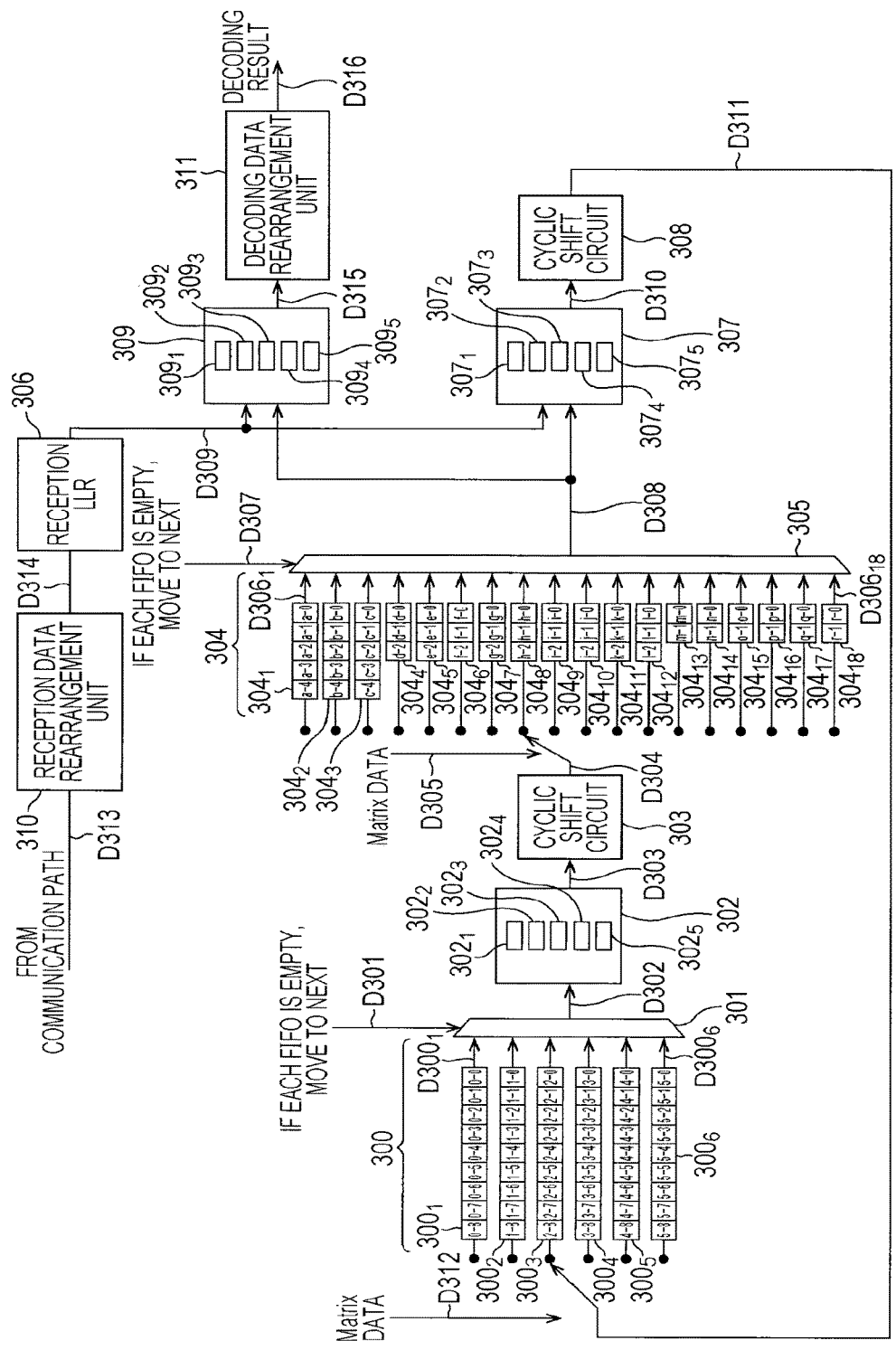
FIG. 52 is a block diagram illustrating a configuration example of a decoding device that performs node calculation in groups of P.

FIG. 52 is a block diagram illustrating a configuration example of a decoding device that performs such decoding.

In other words, FIG. 52 illustrates a configuration example of a decoding device that performs decoding of the LDPC code by using the conversion parity check matrix H' in FIG. 51 which is obtained by performing at least the column permutation of the equation (12) on the original parity check matrix H in FIG. 49.

The decoding device in FIG. 52 is configured with an edge data storage memory 300 configured with six FIFOs $300_1$ to $300_6$, a selector 301 that selects the FIFOs $300_1$ to $300_6$, a check node calculation unit 302, two cyclic shift circuits 303 and 308, an edge data storage memory 304 configured with 18 FIFOs $304_1$ to $304_{18}$, a selector 305 that selects the FIFOs $304_1$ to $304_{18}$, a reception data memory 306 that stores reception data, a variable node calculation unit 307, a decoding word calculation unit 309, a reception data rearrangement unit 310, and a decoding data rearrangement unit 311.

First, a method of storing data to the edge data storage memories 300 and 304 will be described.

The edge data storage memory 300 is configured with six FIFOs $300_1$ to $300_6$, here, six is the number obtained by dividing the number 30 of rows of the conversion parity check matrix H' in FIG. 51 by the number 5 of rows of the configuration matrix (the number P of columns of a unit of a cyclic structure). The FIFO $300_y$ (y=1, 2, ..., 6) is configured with storage areas of a plurality of number of stages, and it is possible to simultaneously read and write the message corresponding to five edges, here, five is the number of rows and the number of columns of the configuration matrix (the number P of columns in a unit of a cyclic structure), to the storage area of each stage. Further, the number of stages of the storage area of the FIFO $300_y$ is 9 which is the maximum number of 1 (Hamming weight) in the row direction of the conversion parity check matrix in FIG. 51.

Pieces of data (a message $v_i$ from the variable node) corresponding to the positions of 1 in the first row to the fifth row of the conversion parity check matrix H' of FIG. 51 are stored in the FIFO $300_1$ in the form of padding each row in the horizontal direction (in the form of ignoring 0). In other words, if the j-th row and the i-th column are expressed as (j, i), pieces of data corresponding to the positions of 1 in a 5×5 unit matrix of (1, 1) to (5, 5) of the conversion parity check matrix H' are stored in the storage area of the first stage of the FIFO $300_1$. Pieces of data corresponding to the positions of 1 in a shift matrix (a shift matrix obtained by cyclically shifting the 5×5 unit matrix by three in the right direction) of (1, 21) to (5, 25) of the conversion parity check matrix H' are stored in the storage area of the second stage. Similarly, data is stored in the storage areas of the third to eighth stages in association with the conversion parity check matrix H'. Then, pieces of data corresponding to the positions of 1 in a shift matrix (a shift matrix obtained by 1 in the first row of the 5×5 unit matrix being replaced with 0 and cyclic-shifted by one in the left direction) of (1, 86) to (5, 90) of the conversion parity check matrix H' are stored in the storage area of the ninth stage.

Pieces of data corresponding to the positions of 1 in the sixth row to the tenth row of the conversion parity check matrix H' of FIG. 51 are stored in the FIFO $300_2$. In other words, pieces of data corresponding to the positions of 1 in a first shift matrix configuring the sum matrix (a sum matrix as a sum of a first shift matrix and a second shift matrix which are obtained by respectively cyclic-shifting the 5×5 unit matrix by one and two in the right direction) of (6, 1) to (10, 5) of the conversion parity check matrix H' are stored in the storage area of the first stage of the FIFO $300_2$. Pieces of data corresponding to the positions of 1 in a second shift matrix configuring the sum matrix of (6, 1) to (10, 5) of the conversion parity check matrix H' are stored in the storage area of the second stage of the FIFO $300_2$.

In other words, with respect to the configuration matrix having a weight of 2 or greater, when the configuration matrix is represented in the form of a sum of a plurality of matrices out of a P×P unit matrix having a weight of 1, a quasi-unit matrix having 0 for one or more elements of 1 in the unit matrix, or a shift matrix obtained by cyclically shifting the unit matrix or the quasi-unit matrix, pieces of data corresponding to the positions of 1 in the unit matrix having the weight of 1, the quasi-unit matrix, or the shift matrix (messages corresponding to the edges belonging to the unit matrix, the quasi-unit matrix, or the shift matrix) are stored in the same address (the same FIFO among the FIFOs $300_1$ to $300_6$).

Hereinafter, data is stored in association with the conversion parity check matrix H', even in the storage areas of the third to ninth stages.

Similarly to FIFOs $300_3$ to $300_6$, data is stored in association with the conversion parity check matrix H'.

The edge data storage memory 304 is configured with 18 FIFO $304_1$ to $304_{18}$, here, 18 is obtained by dividing the number 90 of columns of the conversion parity check matrix H' by the number 5 of columns of the configuration matrix (the number P of columns in a unit of the cyclic structure). The FIFO $304_x$ (x=1, 2, ..., 18) is configured with storage areas of a plurality of number of stages, and it is possible to simultaneously read and write the message corresponding to five edges, here, five is the number of rows and the number of columns of the configuration matrix (the number P of columns in a unit of a cyclic structure), to the storage area of each stage.

Pieces of data (a message $u_j$ from the check node) corresponding to the positions of 1 in the first column to the fifth column of the conversion parity check matrix H' of FIG. 51 are stored in the FIFO $304_1$ in the form of padding each column in the vertical direction (in the form of ignoring 0). In other words, pieces of data corresponding to the positions of 1 in a 5×5 unit matrix of (1, 1) to (5, 5) of the conversion parity check matrix H' are stored in the storage area of the first stage of the FIFO $304_1$. Pieces of data corresponding to the positions of 1 in a first shift matrix configuring a sum matrix (a sum matrix as a sum of a first shift matrix and a second shift matrix which are obtained by respectively cyclic-shifting the 5×5 unit matrix by one and two in the right direction) of (6, 1) to (10, 5) of the conversion parity check matrix H' are stored in the storage area of the second stage. Pieces of data corresponding to the positions of 1 in a second shift matrix configuring the sum matrix of (6, 1) to (10, 5) of the conversion parity check matrix H' are stored in the storage area of the third stage.

In other words, with respect to the configuration matrix having a weight of 2 or greater, when the configuration matrix is represented in the form of a sum of a plurality of matrices out of a P×P unit matrix having a weight of 1, a quasi-unit matrix having 0 for one or more elements of 1 in the unit matrix, or a shift matrix obtained by cyclically shifting the unit matrix or the quasi-unit matrix, pieces of data corresponding to the positions of 1 in the unit matrix having the weight of 1, the quasi-unit matrix, or the shift matrix (messages corresponding to the edges belonging to the unit matrix, the quasi-unit matrix, or the shift matrix) are stored in the same address (the same FIFO among the FIFOs $304_1$ to $304_{18}$).

Hereinafter, data is stored in association with the conversion parity check matrix H', even in the storage areas of the fourth and fifth stages. The number of stages of the storage area of the FIFO $304_1$ is 5 which is the maximum number of 1 (Hamming weight) in the row direction in the first column to the fifth column of the conversion parity check matrix H'.

Data is stored in association with the conversion parity check matrix H' even in the FIFOs $304_2$ and $304_3$, each length (number of stages) is 5. Similarly, data is stored in association with the conversion parity check matrix H' even in the FIFOs $304_4$ to $304_{12}$, each length is 3. Similarly, data is stored in association with the conversion parity check matrix H' even in the FIFOs $304_{13}$ to $304_{18}$, each length is 2.

Next, the operation of the decoding device in FIG. 52 will be described.

The edge data storage memory 300 is configured with six FIFOs $300_1$ to $300_6$, and selects a FIFO which stores data from the FIFOs $300_1$ to $300_6$, according to information (Matrix data) D312 regarding which row of the conversion parity check matrix H' of FIG. 51 five messages D311 supplied from the cyclic shift circuit 308 in the preceding stage belong to, and stores messages D311 in groups of five messages in the selected FIFO in order. Further, during data reading, the edge data storage memory 300 reads five messages $D300_1$ in order from the FIFO $300_1$, and supplies them to the selector 301 in the next stage. After the reading of messages from the FIFO $300_1$ is ended, the edge data storage memory 300 reads messages in order from the FIFOs $300_2$ to $300_6$, and supplies the messages to the selector 301.

The selector 301 selects five messages from the FIFO from which data is read at present, among the FIFO $300_1$ to $300_6$, in response to the select signal D301, and supplies the messages as a message D302 to the check node calculation unit 302.

The check node calculation unit 302 is configured with five check node calculators $302_1$ to $302_5$, performs check node calculation according to the equation (7), by using the message D302 supplied from the selector 301 ($D302_1$ to $D302_5$) (message $v_i$ in the equation (7)), and supplies five messages D303 ($D303_1$ to $D303_5$) (message $U_j$ in the equation (7)) obtained from the check node calculation to the cyclic shift circuit 303.

The cyclic shift circuit 303 cyclically shifts the five messages $D303_1$ to $D303_5$ obtained by the check node calculation unit 302, based on information (Matrix data) D305 regarding the number of times of cyclic shifting of the unit matrix (or quasi-unit matrix) which is a base in the conversion parity check matrix H' which is performed on the corresponding edge, and supplies the result as a message D304, to the edge data storage memory 304.

The edge data storage memory 304 is configured with 18 FIFOs $304_1$ to $304_{18}$, and selects a FIFO which stores data from the FIFOs $304_1$ to $304_{18}$, according to information D305 regarding which row of the conversion parity check matrix H' five messages D304 supplied from the cyclic shift circuit 303 in the preceding stage belong to, and arranges and stores messages D304 in groups of five messages in the selected FIFO in order. Further, during data reading, the edge data storage memory 304 reads five messages $D306_1$ in order from the FIFO $304_1$, and supplies it to the selector 305 in the next stage. After the reading of data from the FIFO $304_1$ is ended, the edge data storage memory 304 reads messages in order from the FIFO $304_2$ to $304_{18}$, and supplies the messages to the selector 305.

The selector 305 selects five messages from the FIFO from which data is read at present, among the FIFOs $304_1$ to $304_{18}$, in response to the select signal D307, and supplies the messages as a message D308 to the variable node calculation unit 307 and the decoding word calculation unit 309.

Meanwhile, the reception data rearrangement unit 310 rearranges the LDPC code D313 corresponding to the parity check matrix H of FIG. 49, received through the communication path 13 by performing column permutation of the equation (12), and supplies the rearranged LDPC code as the reception data D314, to the reception data memory 306. The reception data memory 306 calculates and stores the reception log likelihood ratio (LLR) from the reception data D314 supplied from the reception data rearrangement unit 310, and supplies the reception LLR in groups of five, as the received value D309, to the variable node calculation unit 307 and the decoding word calculation unit 309.

The variable node calculation unit 307 is configured with five variable node calculators $307_1$ to $307_5$, performs variable node calculation according to the equation (1), by using the message D308 ($D308_1$ to $D308_5$) (message $u_j$ of the equation (1)) supplied through the selector 305 and the five received values D309 (received value $u_{0i}$ of the equation (1)) supplied from the reception data memory 306, and supplies the message D310 ($D310_1$ to $D310_5$) (message $v_i$ of the equation (1)) obtained by the calculation to the cyclic shift circuit 308.

The cyclic shift circuit 308 cyclically shifts the five messages $D310_1$ to $D310_5$ obtained by the variable node calculation unit 307, based on information regarding the number of times of cyclic shifting of the unit matrix (or quasi-unit matrix) which is a base in the conversion parity check matrix H' which is performed on the corresponding edge, and supplies the result as a message D311, to the edge data storage memory 300.

By performing one round of the above operations, it is possible to perform one decoding of the LDPC codes (variable node calculation and check node calculation). After the decoding device of FIG. 52 decodes the LDPC code a predetermined number of times, and supplies a finally obtained decoding result to the decoding word calculation unit 309 and the decoding data rearrangement unit 311.

In other words, the decoding word calculation unit 309 is configured with five decoding word calculators $309_1$ to $309_5$, calculates a decoding result (decoding word) based on the equation (5) by using the five messages D308 ($D308_1$ to $D308_5$) (message $u_j$ of the equation (5)) output by the selector 305 and the five received values D309 (received value $u_{0i}$ of the equation (5)) supplied from the reception data memory 306, as the final stage of the multiple times of decoding, and supplies the resulting decoding data D315 to the decoding data rearrangement unit 311.

The decoding data rearrangement unit 311 rearranges and outputs the order as the final decoding result D316, by performing the inverse permutation to the column permutation of the equation (12) on the decoding data D315 supplied from the decoding word calculation unit 309.

The parity check matrix is converted to a parity check matrix (conversion parity check matrix) which can be expressed by a combination of a P×P unit matrix, a quasi-unit matrix having 0 for one or more elements of 1, or a shift matrix obtained by cyclically shifting the unit matrix or the quasi-unit matrix, a sum matrix which is a sum of a plurality of matrices of the unit matrix, the quasi-unit matrix, or the shift matrix, a P×P zero matrix, in other words, a combination of configuration matrices by performing one or both of the row permutation and the column permutation on the parity check matrix (original parity check matrix) as described above, such that it is possible to adopt an architecture of simultaneously performing the check node calculations and the variable node calculations P number of times, here, P is a smaller number than the number of rows and the number of columns of the parity check matrix, for the decoding of the LDPC code. In the case of adopting the architecture of simultaneously performing the node calculations (the check node calculation and the variable node calculation) P number of times, here, P is a smaller number than the number of rows and the number of columns of the parity check matrix, it is possible to suppress the operation frequency to a feasible range and to perform a number of iterative decoding, as compared to the case of simultaneously performing the node calculations the number of times which is equal to the number of rows and the number of columns of the parity check matrix.

It is assumed that the LDPC decoder 166 configuring the reception apparatus 12 of FIG. 46 performs LDPC decoding by simultaneously performing the check node calculations and the variable node calculations P number of times, similarly to, for example, the decoding device of FIG. 52.

In other words, in order to simplify the explanation, it is assumed that the parity check matrix of the LDPC code which is output by the LDPC encoder 115 configuring the transmission apparatus 11 of FIG. 8 is, for example, the parity check matrix H in which the parity matrix has the staircase structure, illustrated in FIG. 49, in the parity interleaver 23 of the transmission apparatus 11, a parity interleave that interleaves the (K+qx+y+1)-th code bit in the position of the (K+Py+x+1)-th code bit is performed by setting the information length K to 60, the number p of columns of a unit of a cyclic structure to 5, and the divisor q of the parity length M (=M/P) to 6.

Since the parity interleave, as described above, corresponds to the column permutation of the equation (12), it is not necessary for the LDPC decoder 166 to perform the column permutation of the equation (12).

For this reason, in the reception apparatus 12 of FIG. 46, as described above, the LDPC code which is not subjected to the parity deinterleave, in other words, the LDPC code in the state of the column permutation of the equation (12) being performed is supplied to the LDPC decoder 166 from the column twist deinterleaver 55, and the LDPC decoder 166 performs the same process as the decoding device of FIG. 52 except for not performing the column permutation of the equation (12).

Figure 53:
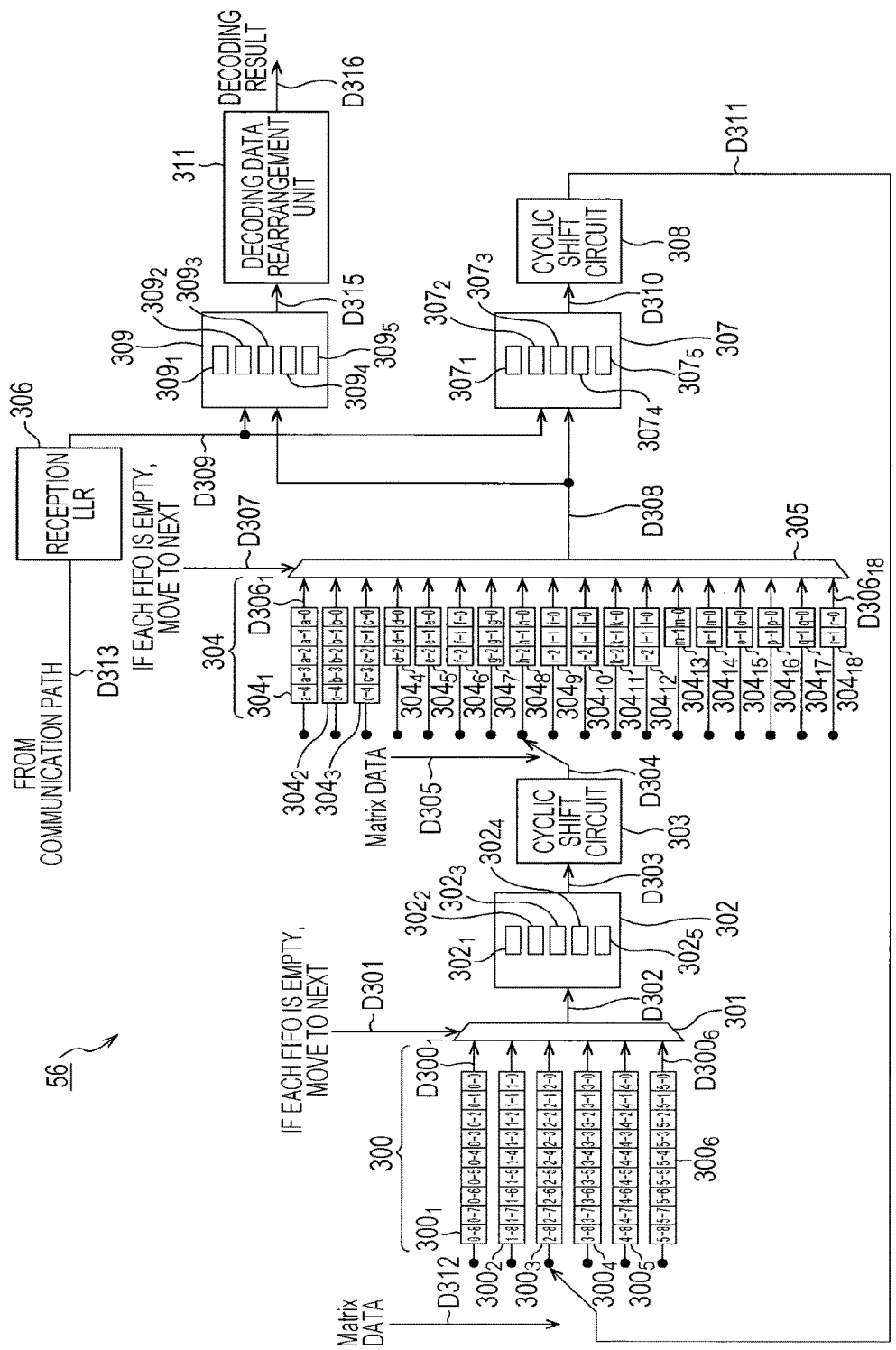
FIG. 53 is a block diagram illustrating a configuration example of the LDPC decoder 166.

In other words, FIG. 53 illustrates a configuration example of the LDPC decoder 166 of FIG. 46.

In FIG. 53, since the LDPC decoder 166 is configured similarly to the decoding device of FIG. 52 except that the reception data rearrangement unit 310 of FIG. 52 is not provided, and performs the same process as that of decoding device of FIG. 52 except that the column permutation in equation (12) is not performed, the description thereof will be omitted.

As described above, the LDPC decoder 166 can be configured without providing the reception data rearrangement unit 310, such that it is possible to reduce the size further than the size of decoding device of FIG. 52.

In addition, in FIG. 49 to FIG. 53, in order to simplify the explanation, it is assumed that the code length N of the LDPC code is 90, the information length K is 60, the number p of columns of a unit of a cyclic structure (the number of rows and the number of columns of the configuration matrix) is 5, and the divisor q of the parity length M (=M/P) is 6, but the code length N, the information length K, the number p of columns of a unit of a cyclic structure, and the divisor q (=M/P) are not respectively limited to the above values.

In other words, in the transmission apparatus 11 of FIG. 8, the LDPC encoder 115 outputs, for example, the LDPC code in which the code length N is 64800, 16200, or the like, the information length K is N−Pq (=N−M), the number p of columns of a unit of a cyclic structure is 360, and the divisor q is M/P, but the LDPC decoder 166 of FIG. 53 simultaneously performs the check node calculations and the variable node calculations P number of times on the LDPC code, and thus it may be suitable for the case of performing the LDPC decoding.

Figure 54:
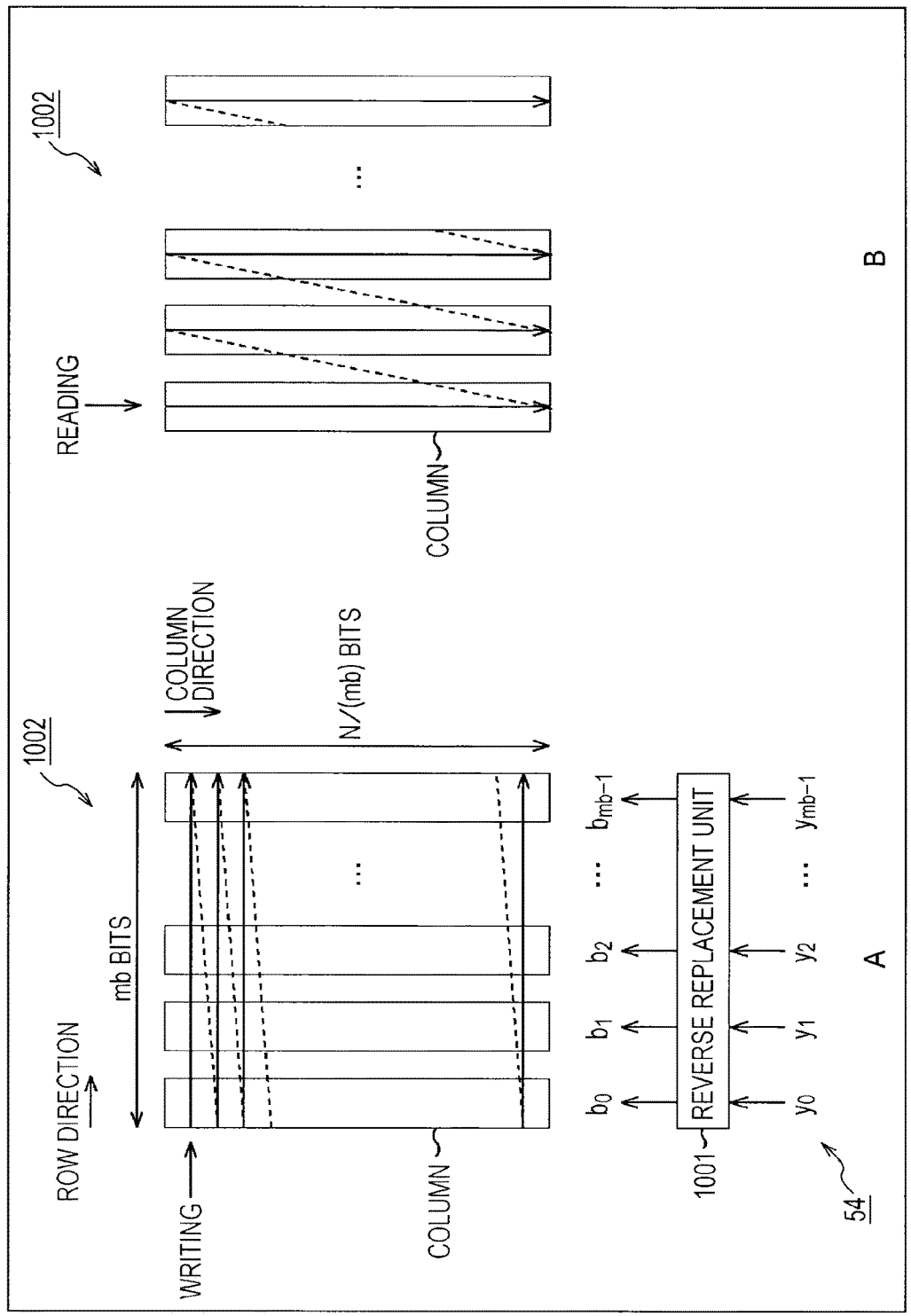
FIG. 54 is a diagram describing a process of a multiplexer 54 configuring the bit deinterleaver 165.

FIG. 54 is a diagram describing a process of the multiplexer 54 of the bit deinterleaver 165 of FIG. 47.

In other words, A of FIG. 54 illustrates a functional configuration example of the multiplexer 54.

The multiplexer 54 is configured with a reverse replacement unit 1001 and a memory 1002.

The multiplexer 54 performs a reverse replacement process (a process opposite to the replacement process) corresponding to the replacement process performed by the demultiplexer 25 of the transmission apparatus 11 on the symbol bit of the symbol from the demapper 164 in the preceding stage, in other words, the reverse replacement process of returning the position of the code bit (symbol bit) of the LDPC code which is replaced by the replacement process to its original position, and supplies the resulting LDPC code to the column twist deinterleaver 55 in the subsequent stage.

In other words, the symbol bits $y_0, y_1, \ldots, y_{mb-1}$ of mb bits of the b symbols, in a unit of (successive) b symbols are supplied to the reverse replacement unit 1001, in the multiplexer 54.

The reverse replacement unit 1001 performs a reverse replacement of returning the sequence of the symbol bits $y_0$, to $y_{mb-1}$ of mb bits to the arrangement of the original code bits $b_0, b_1, \ldots, b_{mb-1}$ of m bits (the sequence of the code bits $b_0$ to $b_{mb-1}$ before the replacement is performed by the replacement unit 32 configuring the demultiplexer 25 of the transmission apparatus 11), and outputs the resulting code bits $b_0$ to $b_{mb-1}$ of mb bits.

The memory 1002 has a storage capacity for storing mb bits in the row (horizontal) direction and N/(mb) bits in the column (vertical) direction, similarly to the memory 31 configuring the demultiplexer 25 on the transmission apparatus 11 side. In other words, the memory 1002 is configured with mb columns for storing N/(mb) bits.

Here, the writing of the code bit of the LDPC code which is output by the reverse replacement unit 1001 to the memory 1002 is performed in the direction of the reading of the code bit from the memory 31 of the demultiplexer 25 of the transmission apparatus 11, and the reading of the code bit which is written to the memory 1002 is performed in the direction of the writing of the code bit to the memory 31.

In other words, as illustrated in A of FIG. 54, the multiplexer 54 of the reception apparatus 12 sequentially performs the writing of the code bit of the LDPC code which is output by the reverse replacement unit 1001 toward the bottom row from the first row of the memory 1002.

Then, if the writing of the code bit of one code length is ended, the multiplexer 54 reads the code bit in the column direction from the memory 1002 and supplies it to the column twist deinterleaver 55 in the subsequent stage.

Here, B of FIG. 54 is a diagram illustrating reading of a code bit from the memory 1002.

In the multiplexer 54, the reading of the code bit of the LDPC code in a direction from the top to the bottom of the columns (in the column direction) configuring the memory 1002 is performed toward the column in the left-to-right direction.

Figure 55:
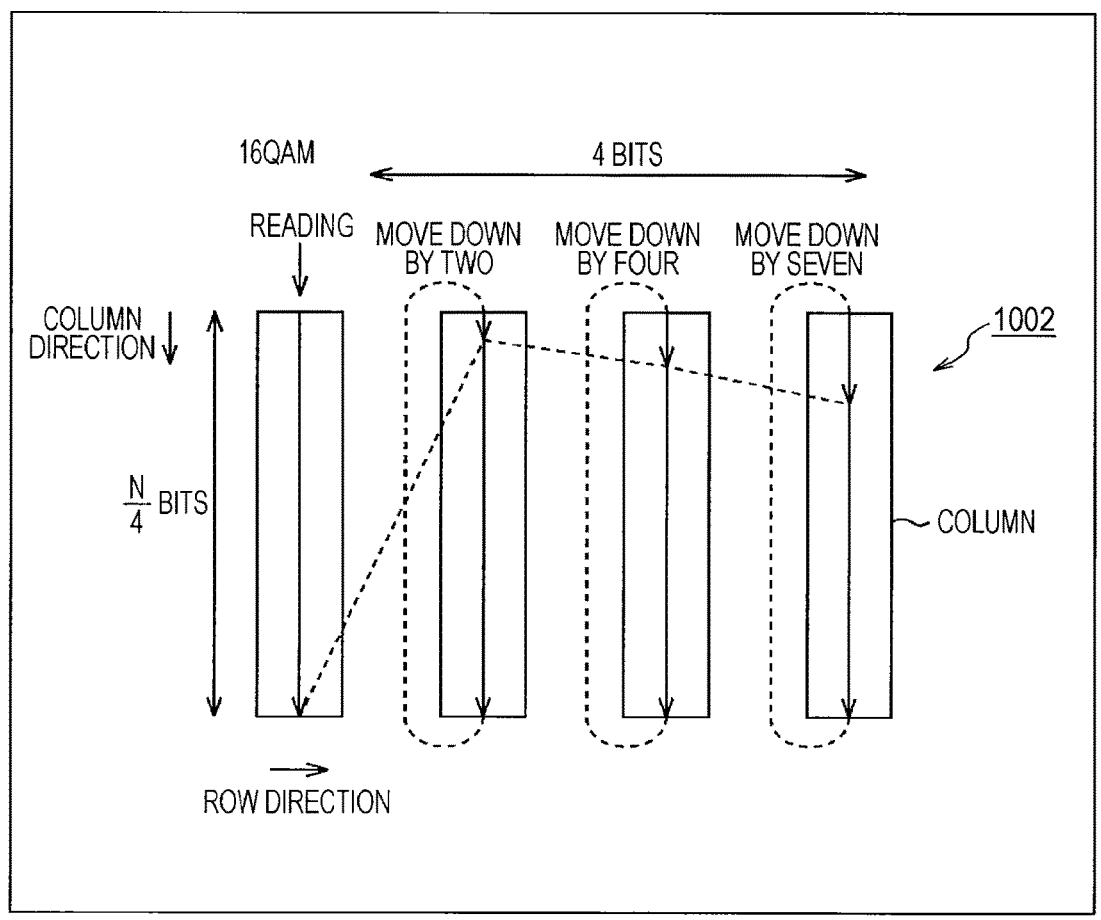
FIG. 55 is a diagram describing a process of a column twist deinterleaver 55.

FIG. 55 is a diagram describing a process of the column twist deinterleaver 55 configuring the bit deinterleaver 165 in FIG. 47.

In other words, FIG. 55 illustrates a configuration example of a memory 1002 of the multiplexer 54.

The memory 1002 has a storage capacity for storing mb bits in the column (vertical) direction and N/(mb) bits in the row (horizontal) direction, and is configured with mb columns.

The column twist deinterleaver 55 performs column twist deinterleave by controlling the read start position when writing the code bit of the LDPC code in the row direction to the memory 1002 and reading the code bit in the column direction from the memory 1002.

In other words, the column twist deinterleaver 55 performs a reverse rearrangement process of returning the sequence of the code bit which is rearranged by the column twist interleave to an original sequence, by appropriately changing the read start position in which the reading of the code bit is started, for each of the plurality of columns.

Here, FIG. 55 illustrates a configuration example of the memory 1002 when the modulation scheme described in FIG. 28 is 16APSK, 16QAM, or the like, and the multiple b is 1. In this case, the number m of bits of one symbol is four, and the memory 1002 is configured with 4 (=mb) columns.

The column twist deinterleaver 55 sequentially performs the writing of the code bit of the LDPC code which is output by the replacement unit 1001, instead of the multiplexer 54, toward the bottom row from the first row of the memory 1002.

Then, if the writing of the code bit of one code length is ended, the column twist deinterleaver 55 performs the reading of the code bit in the top to bottom direction (in the column direction) of the memory 1002 toward the column in the left-to-right direction.

Here, the column twist deinterleaver 55 performs reading of the code bit from the memory 1002, by using the write start position in which the column twist interleaver 24 of the transmission apparatus 11 writes a code bit as the read start position of the code bit.

In other words, if it is assumed that the address of the first (top) position of each column is 0 and the address of each position in the column direction is represented by integers in ascending order, when a modulation scheme is 16APSK or 16QAM, and the multiple b is 1, in the column twist deinterleaver 55, the read start position for the leftmost column is the position of an address 0, the read start position for the second column (from the left) is the position of an address 2, the read start position for the third column is the position of an address 4, and the read start position for the fourth column is the position of an address 7.

In addition, with respect to columns of which the read start positions are other than the position of an address 0, after the code bits are read up to the bottom position, back to the top (position of the address 0), the code bits are read up to the position immediately before the read start position. Thereafter, the reading from the next column (right) is performed.

By performing the column twist deinterleave as described above, the sequence of the code bit that is rearranged by the column twist interleave is returned to the original sequence.

Figure 56:
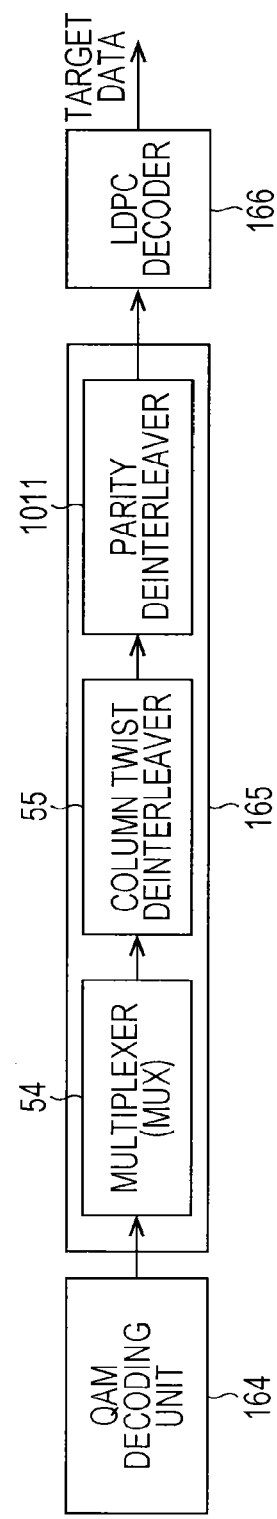
FIG. 56 is a block diagram illustrating another configuration example of the bit deinterleaver 165.

FIG. 56 is a block diagram illustrating another configuration example of the bit deinterleaver 165 in FIG. 46.

In addition, in the drawing, parts corresponding to those of FIG. 47 are denoted by the same reference numerals, and the description thereof will be omitted as appropriate.

In other words, the bit deinterleaver 165 in FIG. 56 is configured similarly to the case of FIG. 47 except for that a parity deinterleaver 1011 is newly provided.

In FIG. 56, the bit deinterleaver 165 is configured with a multiplexer (MUX) 54, a column twist deinterleaver 55, and a parity deinterleaver 1011, and performs bit deinterleave on the code bit of the LDPC code from the demapper 164.

In other words, the multiplexer 54 performs a reverse replacement process (a process opposite to the replacement process) corresponding to the replacement process performed by the demultiplexer 25 of the transmission apparatus 11, in other words, the reverse replacement process of returning the position of the code bit which is replaced by the replacement process to its original position, on the LDPC code from the demapper 164, and supplies the resulting LDPC code to the column twist deinterleaver 55.

The column twist deinterleaver 55 performs a column twist deinterleave corresponding to the column twist interleave as the rearrangement process performed by the column twist interleaver 24 of the transmission apparatus 11 on the LDPC code from the multiplexer 54.

The LDPC code obtained by the column twist deinterleave is supplied from the column twist deinterleaver 55 to the parity deinterleaver 1011.

The parity deinterleaver 1011 performs a parity deinterleave (a process opposite to the parity interleave) corresponding to the parity interleave performed by the parity interleaver 23 of the transmission apparatus 11, in other words, a parity deinterleave of returning the code bit of the LDPC code of which the sequence is changed by the parity interleave to its original sequence, on the code bit subjected to the column twist deinterleave by the column twist deinterleaver 55.

The LDPC code obtained by the parity deinterleave is supplied from the parity deinterleaver 1011 to the LDPC decoder 166.

Therefore, in the bit deinterleaver 165 in FIG. 56, the LDPC code subjected to the reverse replacement process, the column twist deinterleave, and the parity deinterleave, in other words, the LDPC code obtained by the LDPC coding according to the parity check matrix H is supplied to the LDPC decoder 166.

The LDPC decoder 166 performs the LDPC decoding of the LDPC code from the bit deinterleaver 165 by using the parity check matrix H used in the LDPC coding by the LDPC encoder 115 of the transmission apparatus 11. In other words, the LDPC decoder 166 performs the LDPC decoding of the LDPC code from the bit deinterleaver 165 by using the parity check matrix H used in the LDPC coding by the LDPC encoder 115 of the transmission apparatus 11, or by using a conversion parity check matrix obtained by performing at least column permutation corresponding to the parity interleave on the parity check matrix H.

Here, in FIG. 56, because the LDPC code obtained by the LDPC coding according to the parity check matrix H is supplied from the bit deinterleaver 165 (parity deinterleaver 1011 thereof) to the LDPC decoder 166, when the LDPC encoder 115 of the transmission apparatus 11 performs the LDPC decoding of the LDPC code by using the parity check matrix H used in the LDPC coding, the LDPC decoder 166 may be, for example, a decoding device that performs LDPC decoding according to a full serial decoding scheme of sequentially performing the calculation of a message (a check node message, a variable node message) one node by one node or a decoding device that performs LDPC decoding according to a full parallel decoding scheme of simultaneously (in parallel) performing the calculation of a message for all nodes.

Further, when the LDPC decoder 166 performs the LDPC decoding of the LDPC code on the parity check matrix H used in the LDPC coding by the LDPC encoder 115 of the transmission apparatus 11, by using the conversion parity check matrix obtained by at least performing the column permutation corresponding to the parity interleave, the LDPC decoder 166 is a decoding device of an architecture of simultaneously performing the check node calculations and the variable node calculations P (or a divisor of P, the divisor is other than 1) number of times, and is configured by the decoding device (FIG. 52) including the reception data rearrangement unit 310 that rearranges the code bit of the LDPC code, by performing the same column permutation as the column permutation for obtaining the conversion parity check matrix on the LDPC code.

In addition, in FIG. 56, for the convenience of description, the multiplexer 54 that performs the reverse replacement process, the column twist deinterleaver 55 that performs the column twist deinterleave, and the parity deinterleaver 1011 that performs the parity deinterleave are respectively and separately configured, but two or more of the multiplexer 54, the column twist deinterleaver 55, and the parity deinterleaver 1011 may be integrally configured, similarly to the parity interleaver 23, the column twist interleaver 24, and the demultiplexer 25 of the transmission apparatus 11.

Further, when the bit interleaver 116 (FIG. 8) of the transmission apparatus 11 is configured without providing the parity interleaver 23 and the column twist interleaver 24, in FIG. 56, the bit deinterleaver 165 may be configured without providing the column twist deinterleaver 55 and the parity deinterleaver 1011.

Even in this case, the LDPC decoder 166 can be configured with the decoding device of a full serial decoding scheme that performs LDPC decoding by using the parity check matrix H, the decoding device of a full parallel decoding scheme that performs LDPC decoding by using the parity check matrix H, or the decoding device (FIG. 52) including the reception data rearrangement unit 310 that performs the LDPC decoding by P simultaneous check node calculations and variable node calculations by using the conversion parity check matrix H'.

<Configuration Example of Reception System>

Figure 57:
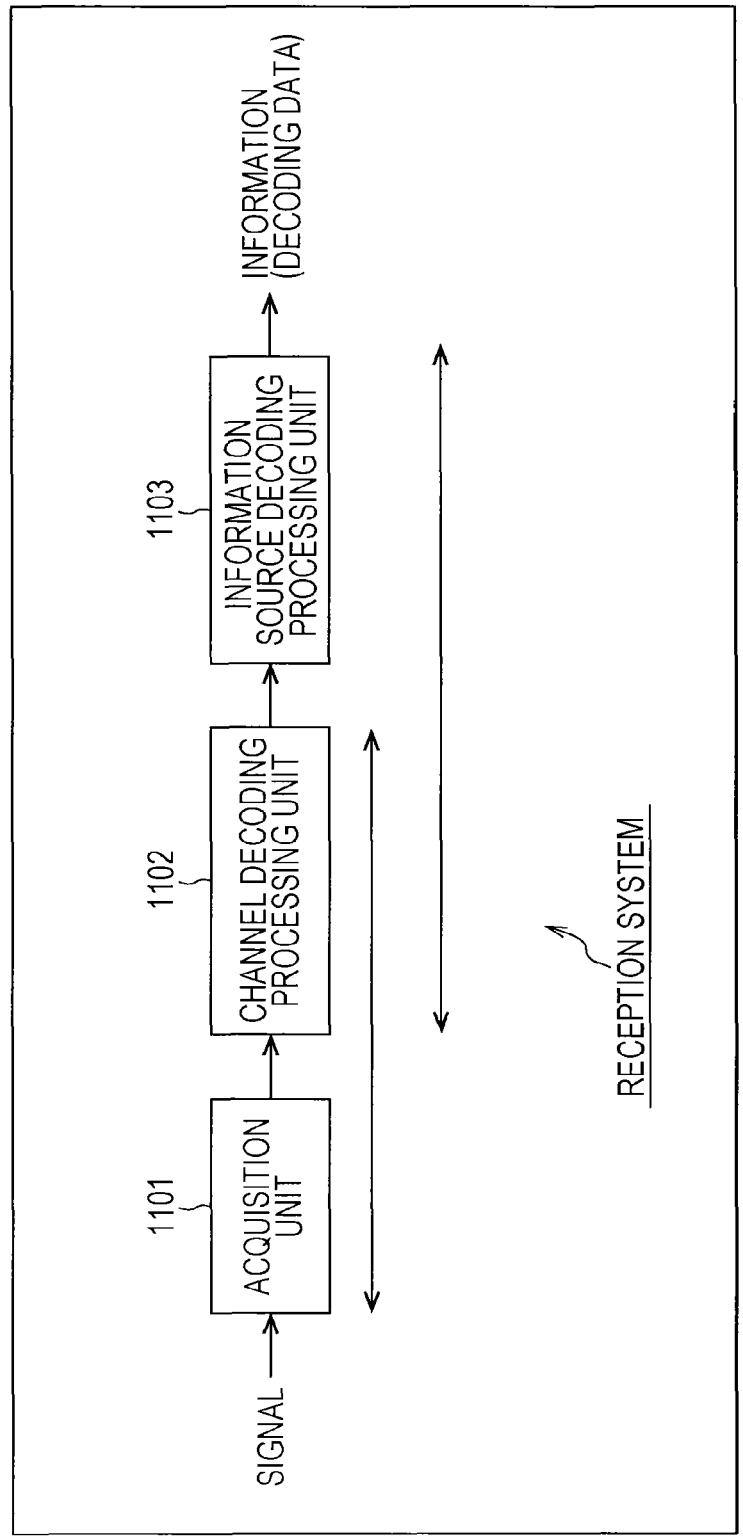
FIG. 57 is a block diagram illustrating a first configuration example of a reception system to which the reception apparatus 12 is applicable.

FIG. 57 is a block diagram illustrating a first configuration example of a reception system to which a reception apparatus 12 is applicable.

In FIG. 57, the reception system is configured with an acquisition unit 1101, a channel decoding processing unit 1102, and an information source decoding processing unit 1103.

The acquisition unit 1101 acquires signals including the LDPC code obtained by at least LDPC-coding LDPC target data such as image data and sound data of a program, through for example, a channel (communication path), not shown, such as terrestrial digital broadcasting, satellite digital broadcasting, a CATV network, the Internet, and other networks, and supplies the signals to the channel decoding processing unit 1102.

Here, when signals acquired by the acquisition unit 1101 are broadcast, for example, from a broadcast station through terrestrial waves, satellite waves, cable television (CATV) networks, and the like, the acquisition unit 1101 is configured with a tuner, a Set Top Box (STB), or the like. Further, when signals acquired by the acquisition unit 1101 are multicast, for example, from a web server, as an Internet Protocol Television (IPTV), the acquisition unit 1101 is configured with, for example, a network interface (IF) such as a Network Interface Card (NIC).

The channel decoding processing unit 1102 corresponds to the reception apparatus 12. The channel decoding processing unit 1102 performs a channel decoding process including at least a process of correcting an error occurring in a channel, on the signals acquired by the acquisition unit 1101 through the channel, and supplies the resulting signal to the information source decoding processing unit 1103.

In other words, the signals acquired by the acquisition unit 1101 through the channel are signals obtained by performing at least the error correction coding for correcting the errors occurring in the channel, and the channel decoding processing unit 1102 performs for example, the channel decoding process such as an error correction process on such signals.

Here, examples of the error correction coding include LDPC coding and BCH coding. Here, at least, the LDPC coding is performed as the error correction coding.

Further, the channel decoding process may include demodulation of a modulation signal, and the like.

The information source decoding processing unit 1103 performs the information source decoding process including at least a process of decompressing the compressed information to the original information on the signal subjected to the channel decoding process.

In other words, the signals acquired by the acquisition unit 1101 through the channel may be subjected to a compression coding for compressing information, in order to reduce the amount of data such as an image and sound as the information, in this case, the information source decoding processing unit 1103 performs the information source decoding process such as a process of decompressing (decompression process) the compressed information to the original information on the signal subjected to the channel decoding process.

In addition, when the signals acquired by the acquisition unit 1101 through the channel are not subjected to the compression coding, the information source decoding processing unit 1103 does not perform the process of decompressing the compressed information to the original information.

Here, the example of the decompression process includes MPEG decoding. Further, the channel decoding process may include descrambling and the like, in addition to the decompression process.

In the reception system configured as described above, the acquisition unit 1101 acquires, for example, signals obtained by performing compression coding such as MPEG coding and error correction coding such as LDPC coding on data such as an image and sound, through the channel, and supplies it to the channel decoding processing unit 1102.

In the channel decoding processing unit 1102, for example, the same process as that performed by the reception apparatus 12 is performed as a channel decoding process on the signal from the acquisition unit 1101, and the resulting signal is supplied to the information source decoding processing unit 1103.

In the information source decoding processing unit 1103, the information source decoding process such as MPEG decoding is performed on the signal from the channel decoding processing unit 1102, and the resulting image or sound is output.

The reception system of FIG. 57 described above may be applied to, for example, a television tuner that receives television broadcasting as digital broadcasting.

In addition, the acquisition unit 1101, the channel decoding processing unit 1102, and the information source decoding processing unit 1103 may be respectively configured as one independent apparatus (hardware (Integrated Circuit (IC), or the like), or a software module).

Further, with respect to the acquisition unit 1101, the channel decoding processing unit 1102, and the information source decoding processing unit 1103, a set of the acquisition unit 1101 and the channel decoding processing unit 1102, a set of the channel decoding processing unit 1102 and the information source decoding processing unit 1103, and a set of the acquisition unit 1101, the channel decoding processing unit 1102, and the information source decoding processing unit 1103 are respectively configured as one independent apparatus.

Figure 58:
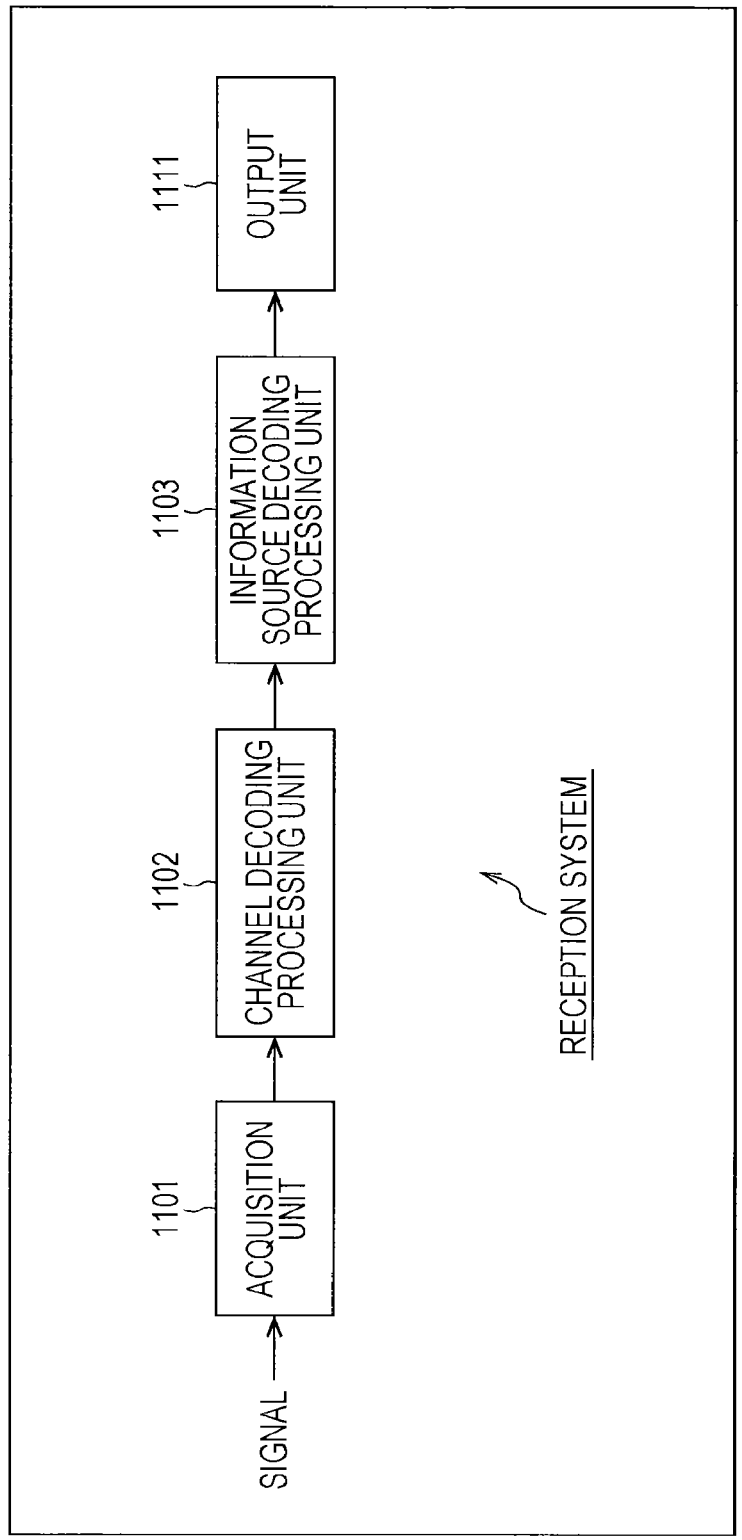
FIG. 58 is a block diagram illustrating a second configuration example of a reception system to which the reception apparatus 12 is applicable.

FIG. 58 is a block diagram illustrating a second configuration example of a reception system to which the reception apparatus 12 is applicable.

In addition, the portions in the drawing corresponding to those in FIG. 57 are denoted by the same reference numerals, and thus the description thereof will be omitted below as appropriate.

The reception system of FIG. 58 is in common with the case in FIG. 57 in having the acquisition unit 1101, the channel decoding processing unit 1102, and the information source decoding processing unit 1103, and is different from the case in FIG. 57 in that an output unit 1111 is newly provided.

For example, the output unit 1111 is a display device that displays an image or a speaker that outputs sound, and outputs the image and sound or the like as a signal output from the information source decoding processing unit 1103. In other words, the output unit 1111 displays the image or outputs sound.

The reception system of FIG. 58 described above may be applied to for example, a television receiver (TV) receiving television broadcasting as digital broadcasting, a radio receiver receiving radio broadcasting, or the like.

In addition, when the compression coding is not applied to the signal obtained by the acquisition unit 1101, the signal output by the channel decoding processing unit 1102 is supplied to the output unit 1111.

Figure 59:
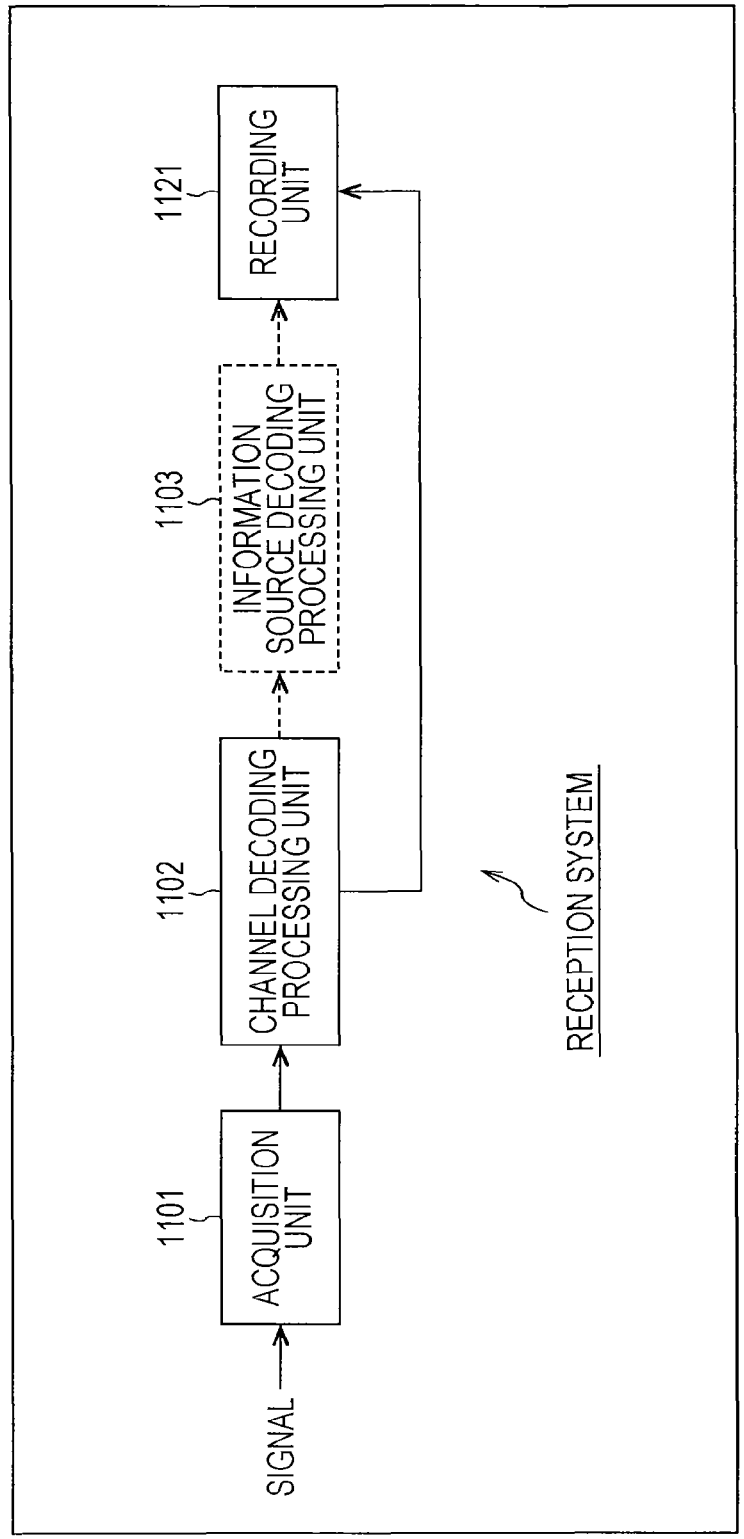
FIG. 59 is a block diagram illustrating a third configuration example of a reception system to which the reception apparatus 12 is applicable.

FIG. 59 is a block diagram illustrating a third configuration example of a reception system to which the reception apparatus 12 is applicable.

In addition, the portions in the drawing corresponding to those in FIG. 57 are denoted by the same reference numerals, and thus the description thereof will be omitted below as appropriate.

The reception system of FIG. 59 is in common with the case in FIG. 57 in having the acquisition unit 1101 and the channel decoding processing unit 1102.

However, the reception system in FIG. 59 is different from the case in FIG. 57 in that the information source decoding processing unit 1103 is not provided and a recording unit 1121 is newly provided.

The recording unit 1121 records (stores) signals (for example, TS packets of TS of MPEG) which are output by the channel decoding processing unit 1102 on a recording (storage) medium such as an optical disc, a hard disk (magnetic disk), and a flash memory.

The reception system of FIG. 59 as described above may be applied to a recorder recording television broadcasting.

In addition, in FIG. 59, the reception system is configured by providing an information source decoding processing unit 1103, and may record a signal subjected to an information source decoding process by the information source decoding processing unit 1103, in other words, an image and sound resulting from the decoding in the recording unit 1121.

<Embodiment of Computer>

Next, a series of processes described above may be performed by either hardware or software. When the series of processes are performed by software, a program constituting the software is installed in a general-purpose computer or the like.

Figure 60:
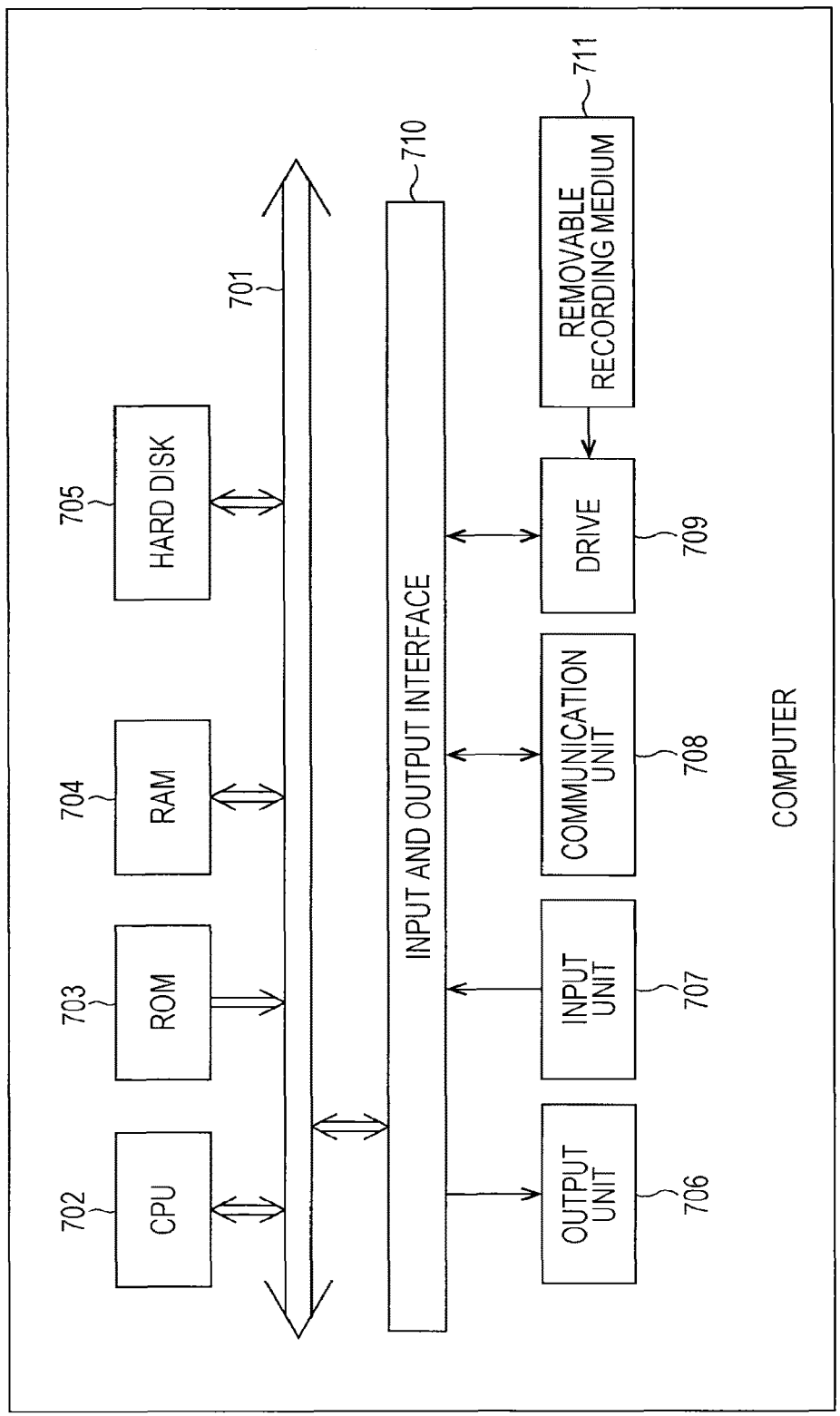
FIG. 60 is a block diagram illustrating a configuration example of an embodiment of a computer to which the present technology is applied.

Thus, FIG. 60 illustrates a configuration example of an embodiment of a computer in which a program executing the series of processes described above is installed.

The program may be recorded in advance on a hard disk 705 or a ROM 703 as a recording medium built in the computer.

Alternatively, it is possible to temporarily or permanently store (record) the program in a removable recording medium 711 such as a flexible disk, a Compact Disc Read Only Memory (CD-ROM), a Magneto Optical (MO) disc, a Digital Versatile Disc (DVD), a magnetic disk, and a semiconductor memory. Such a removable recording medium 711 may be provided as so-called package software.

Additionally, in addition to being installed to the computer from the removable recording medium 711 described above, the program may be wirelessly transferred to the computer from the download site through an artificial satellite for digital satellite broadcasting or transferred to the computer in a wired manner through a network such as a Local Area Network (LAN) or the Internet, and the computer may receive the program transferred as described above by the communication unit 708, and install the program on a built-in hard disk 705.

The computer has a built-in Central Processing Unit (CPU) 702. An input and output interface 710 is connected to the CPU 702 through a bus 701, and when an instruction is input by an input unit 707 such as a keyboard, a mouse, a microphone or the like being operated by a user, through the input and output interface 710, the CPU 702 executes the program stored in the Read Only Memory (ROM) 703 in response to the instruction. Alternatively, the CPU 702 loads a program stored in the hard disk 705, a program that is transferred from a satellite or network, received by the communication unit 708, and installed in the hard disk 705, or a program that is read from the removable recording medium 711 mounted on the drive 709 and is installed on the hard disk 705, in the Random Access Memory (RAM) 704, and executes the programs. Thus, the CPU 702 executes the process according to the flowchart described above or the process performed by the configuration of the block diagram described above. Then, the CPU 702 causes the process result, as required, for example, through the input and output interface 710, to be output from an output unit 706 configured with a Liquid Crystal Display (LCD), a speaker and the like, or be transmitted from the communication unit 708, or to be recorded in the hard disk 705.

Here, in this specification, processing steps of describing a program causing a computer to execute various processes need not necessarily be processed in time series according to the order described in the flowchart, and the processing steps include processes to be processed in parallel or individually (for example, a parallel process or a process using objects).

Further, a program may be processed by a single computer, or may be distributed and processed by a plurality of computers. In addition, a program may be transferred to a remote computer and executed.

Further, in the specification, a system means a set of a plurality of components (devices, modules (products), and the like), and it does not matter whether all the components are in the same housing. Therefore, both a plurality of devices which are housed in separate housings and connected through a network, and, a single device in which a plurality of modules are housed in a single housing are systems.

In addition, embodiments of the present technology are not limited to the above-described embodiments, and various modifications may be made without departing from the scope of the present technology.

For example, the present technology can take a cloud computing configuration in which one function is shared and processed jointly by a plurality of devices through the network.

Further, each step described in the flowchart described above is performed by a single apparatus, and may be performed by being shared by a plurality of devices.

Further, if a plurality of processes are included in a single step, the plurality of processes included in the one step are performed by a single apparatus, and may be performed by being shared by a plurality of devices.

Further, for example, for the new LDPC code described above (the parity check matrix initial value table thereof), it is possible to use satellite lines, terrestrial waves, cables (wired lines), and others as the communication path 13 (FIG. 7). Further, it is possible to use the new LDPC code for data transmission other than digital broadcasting.

REFERENCE SIGNS LIST

11 TRANSMISSION APPARATUS
12 RECEPTION APPARATUS
23 PARITY INTERLEAVER
24 COLUMN TWIST INTERLEAVER
25 DEMULTIPLEXER
31 MEMORY
32 REPLACEMENT UNIT
54 MULTIPLEXER
55 COLUMN TWIST INTERLEAVER
111 MODE ADAPTATION/MULTIPLEXER
112 PADDER
113 BB SCRAMBLER
114 BCH ENCODER
115 LDPC ENCODER
116 BIT INTERLEAVER
117 MAPPER
118 TIME INTERLEAVER
119 SISO/MISO ENCODER
120 FREQUENCY INTERLEAVER
121 BCH ENCODER
122 LDPC ENCODER
123 MAPPER
124 FREQUENCY INTERLEAVER
131 FRAME BUILDER/RESOURCE ALLOCATION UNIT
132 OFDM GENERATION UNIT
151 OFDM PROCESSING UNIT
152 FRAME MANAGEMENT UNIT
153 FREQUENCY DEINTERLEAVER
154 DEMAPPER
155 LDPC DECODER
156 BCH DECODER
161 FREQUENCY DEINTERLEAVER
162 SISO/MISO DECODER
163 TIME DEINTERLEAVER
164 DEMAPPER
165 BIT DEINTERLEAVER
166 LDPC DECODER
167 BCH DECODER
168 BB DESCRAMBLER
169 NULL DELETION UNIT
170 DEMULTIPLEXER
210 Tx UNIT
211 FEC UNIT
212 MAPPING UNIT
213 UP-SAMPLING UNIT
214 NYQUIST FILTER UNIT
220 Rx UNIT
221 AGC UNIT
222 MULTIPLIER
223 ROLL-OFF FILTER UNIT
224 DOWN-SAMPLING UNIT
225 CSI UNIT
226 DEMAPPING UNIT
227 FEC UNIT
230 CHANNEL UNIT
231 IBO UNIT
232 MULTIPLIER
233 TWTA UNIT
234 AWGN UNIT
235 ADDER
300 EDGE DATA STORAGE MEMORY
301 SELECTOR
302 CHECK NODE CALCULATION UNIT
303 CYCLIC SHIFT CIRCUIT
304 EDGE DATA STORAGE MEMORY
305 SELECTOR
306 RECEPTION DATA MEMORY
307 VARIABLE NODE CALCULATION UNIT
308 CYCLIC SHIFT CIRCUIT
309 DECODING WORD CALCULATION UNIT
310 RECEPTION DATA REARRANGEMENT UNIT
311 DECODING DATA REARRANGEMENT UNIT
601 CODING PROCESSING UNIT
602 STORAGE UNIT
611 CODE RATE SETTING UNIT
612 INITIAL VALUE TABLE READING UNIT
613 PARITY CHECK MATRIX GENERATION UNIT
614 INFORMATION BIT READING UNIT
615 CODING PARITY CALCULATION UNIT
616 CONTROL UNIT
701 BUS
702 CPU
703 ROM
704 RAM
705 HARD DISK
706 OUTPUT UNIT
707 INPUT UNIT
708 COMMUNICATION UNIT
709 DRIVE
710 INPUT AND OUTPUT INTERFACE
711 REMOVABLE RECORDING MEDIUM

1001 REVERSE REPLACEMENT UNIT
1002 MEMORY
1011 PARITY DEINTERLEAVER
1101 ACQUISITION UNIT
1101 CHANNEL DECODING PROCESSING UNIT
1103 INFORMATION SOURCE DECODING PROCESSING UNIT
1111 OUTPUT UNIT
1121 RECORDING UNIT

The invention claimed is:

1. A transmitting device for generating a digital television broadcast signal and for decreasing a signal-to-noise power ratio of the generated digital television broadcast signal, the transmitting device comprising:
  circuitry configured to
    receive data to be transmitted in a digital television broadcast signal;
    perform low density parity check (LDPC) encoding on input bits of the received data according to a parity check matrix of an LDPC code having a code length of 16200 bits and a code rate of 12/15 to generate an LDPC code word, the LDPC code enabling error correction processing to correct errors generated in a transmission path of the digital television broadcast signal,
  wherein the LDPC code includes information bits and parity bits, the parity bits being processed by a receiving device to recover information bits corrupted by transmission path errors,
  wherein the parity check matrix includes an information matrix portion corresponding to the information bits and a parity matrix portion corresponding to the parity bits,
  wherein the information matrix portion is represented by a parity check matrix initial value table, and
  wherein the parity check matrix initial value table, having each row indicating positions of elements '1' in corresponding 360 columns of the information matrix portion corresponding to a subset of information bits used in calculating the parity bits in the LDPC encoding, is as follows
  3 394 1014 1214 1361 1477 1534 1660 1856 2745 2987 2991 3124 3155
  59 136 528 781 803 928 1293 1489 1944 2041 2200 2613 2690 2847
  155 245 311 621 1114 1269 1281 1783 1995 2047 2672 2803 2885 3014
  79 870 974 1326 1449 1531 2077 2317 2467 2627 2811 3083 3101 3132
  4 582 660 902 1048 1482 1697 1744 1928 2628 2699 2728 3045 3104
  175 395 429 1027 1061 1068 1154 1168 1175 2147 2359 2376 2613 2682
  1388 2241 3118 3148
  143 506 2067 3148
  1594 2217 2705
  398 988 2551
  1149 2588 2654
  678 2844 3115
  1508 1547 1954
  1199 1267 1710
  2589 3163 3207
  1 2583 2974
  2766 2897 3166
  929 1823 2742
  1113 3007 3239
  1753 2478 3127
  0 509 1811
  1672 2646 2984
  965 1462 3230
  3 1077 2917
  1183 1316 1662
  968 1593 3239
  64 1996 2226
  1442 2058 3181
  513 973 1058
  1263 3185 3229
  681 1394 3017
  419 2853 3217
  3 2404 3175
  2417 2792 2854
  1879 2940 3235
  647 1704 3060, and
    transmit the digital television broadcast signal including the LDPC code word.

2. The transmitting device according to claim 1, wherein a row of the parity check matrix initial value table is represented by i and a length of the parity bits of the LDPC code word is represented by M, a 2+360×(i−1)-th column of the parity check matrix is obtained by a cyclic shift of a 1+360×(i−1)-th column of the parity check matrix indicating a position of an element 1 in the parity check matrix initial value table downward by q=M/360.

3. The transmitting device according to claim 2, wherein for the 1+360×(i−1)-th column of the parity check matrix,
  an i-th row of the parity check matrix initial value table represents a row number of the element 1 of the 1+360×(i−1)-th column of the parity check matrix, and
for each column from the 2+360×(i−1)-th column to a 360×i-th column being a column other than the 1+360×(i−1)-th column of the parity check matrix,
  an i-th row and j-th column value of the parity check matrix initial value table is represented as $h_{i,j}$ and the row number of a j-th element 1 of a w-th column of a parity check matrix H is represented as $H_{w-j}$,
  a row number $H_{w-j}$ of the element 1 of the w-th column being a column other than the 1+360×(i−1)-th column of the parity check matrix is represented by equation $$H_{w-j} = \mathrm{mod}(h_{i,j} + \mathrm{mod}((w-1), 360) \times M/360, M).$$

4. The transmitting device according to claim 1, wherein the parity check matrix has no cycle-4.

5. The transmitting device according to claim 1, wherein the parity check matrix of the LDPC code belongs to an ensemble in which a performance threshold being a ratio of signal power to noise power at which a bit error rate starts to decrease is a predetermined value or smaller is found by multi-edge type density evolution.

6. A method for generating a digital television broadcast signal and for decreasing a signal-to-noise power ratio of the generated digital television broadcast signal, the method comprising:
  receiving data to be transmitted in a digital television broadcast signal;
  performing low density parity check (LDPC) encoding, in an LDPC encoding circuitry, on input bits of the received data according to a parity check matrix of an LDPC code having a code length of 16200 bits and a code rate of 12/15 to generate an LDPC code word, the LDPC code enabling error correction processing to correct errors generated in a transmission path of the digital television broadcast signal;

wherein the LDPC code word includes information bits and parity bits, the parity bits being processed by a receiving device to recover information bits corrupted by transmission path errors, the parity check matrix includes an information matrix portion corresponding to the information bits and a parity matrix portion corresponding to the parity bits, the information matrix portion is represented by a parity check matrix initial value table, and the parity check matrix initial value table, having each row indicating positions of elements '1' in corresponding 360 columns of the information matrix portion corresponding to a subset of information bits used in calculating the parity bits in the LDPC encoding, is as follows:

3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060; and transmitting, by a broadcast transmitter, the digital television broadcast signal including the LDPC code word.

7. A receiving device for use in an environment where a signal-to-noise power ratio of a received digital television broadcast signal can be reduced, the receiving device comprising:

a receiver configured to receive a digital television broadcast signal including a low density parity check (LDPC) code word; and circuitry configured to:
decode the LDPC code word; and
process the decoded LDPC code word for presentation of the digital television broadcast signal, wherein
input bits of data to be transmitted in the digital television broadcast signal are LDPC encoded according to
a parity check matrix initial value table of an LDPC code having a code length of 16200 bits and a code rate of 12/15 to generate the LDPC code word, the LDPC code enabling error correction processing to correct errors generated in a transmission path of the digital television broadcast signal,
the LDDC code word includes information bits and parity bits, the parity bits being processed by the receiving device to recover information bits corrupted by transmission path errors,
wherein the parity check matrix initial value table of the LDPC code according to which the input bits are LDPC encoded is as follows, 3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060.

8. The receiving device according to claim 7, wherein
the LDPC code word is encoded based on a parity check matrix of the LDPC code,
the parity check matrix includes an information matrix part corresponding to the information bits and a parity matrix part corresponding to the parity bits,
the information matrix part being represented by the parity check matrix initial value table, and
each row of the parity check matrix initial value table indicates positions of elements "1" in corresponding 360 columns of the information matrix part corresponding to a subset of information bits used in calculating the parity bits in the LDPC encoding.

9. The receiving device according to claim 8, wherein
a row of the parity check matrix initial value table is represented by i and a length of the parity bits of the LDPC code word is represented by M, a 2+360×(i−1)-th column of the parity check matrix is obtained by a cyclic shift of a 1+360×(i−1)-th column of the parity check matrix indicating a position of an element 1 in the parity check matrix initial value table downward by q=M360.

10. The receiving device according to claim 9, wherein
for the 1+360×(i−1)-th column of the parity check matrix,
an i-th row of the parity check matrix initial value table represents a row number of the element 1 of the 1+360×(i−1)-th column of the parity check matrix, and
for each column from the 2+360×(i−1)-th column to a 360×i-th column being a column other than the 1+360×(i−1)-th column of the parity check matrix,
an i-th row and j-th column value of the parity check matrix value table is represented as $h_{i,j}$ and a row number of a j-th element 1 of a w-th column of a parity check matrix H is represented as $H_{w-j}$,
a row number $H_{w-j}$ of the element 1 of the w-th column being a column other than the 1+360×(i−1)-th column of the parity check matrix is represented by equation $$H_{w-j}=\mod(h_{i,j}+\mod((w-1), 360)\times M/360, M).$$

11. The receiving device according to claim 7, wherein the circuitry is further configured to:
interleave only parity bits of the LDPC code word.

12. The receiving device according to claim 7, wherein the parity check matrix has no cycle-4.

13. The receiving device according to claim 7, wherein the parity check matrix of the LDPC code belongs to an ensemble in which a performance threshold being a ratio of signal power to noise power at which a bit error rate starts to decrease is a predetermined value or smaller is found by multi-edge type density evolution.

14. A method for use by a receiving device in an environment where a signal-to-noise power ratio of a digital television broadcast signal can be reduced, the method comprising:
receiving a digital television broadcast signal including an LDPC (low density parity check) code word;
decoding, by decoding circuitry, the LDPC code word; and
processing the decoded LDPC code word for presentation of the digital television broadcast signal, wherein
input bits of data to be transmitted in the digital television broadcast signal are LDPC encoded according to a parity check matrix initial value table of an LDPC code having a code length N of 16200 bits and a code rate r of 12/15 to generate the LDPC code word, the LDPC code enabling error correction processing to correct errors generated in a transmission path of the digital television broadcast signal,
the LDPC code word includes information bits and parity bits, the parity bits being processed by the receiving device to recover information bits corrupted by transmission path errors,
the parity check matrix initial value table of the LDPC code according to which the input bits are LDPC encoded is as follows,
3 394 1014 1214 1361 1477 1534 1660 1856 2745 2987 2991 3124 3155
59 136 528 781 803 928 1293 1489 1944 2041 2200 2613 2690 2847
155 245 311 621 1114 1269 1281 1783 1995 2047 2672 2803 2885 3014
79 870 974 1326 1449 1531 2077 2317 2467 2627 2811 3083 3101 3132
4 582 660 902 1048 1482 1697 1744 1928 2628 2699 2728 3045 3104
175 395 429 1027 1061 1068 1154 1168 1175 2147 2359 2376 2613 2682
1388 2241 3118 3148
143 506 2067 3148
1594 2217 2705
398 988 2551
1149 2588 2654
678 2844 3115
1508 1547 1954
1199 1267 1710
2589 3163 3207
1 2583 2974
2766 2897 3166
929 1823 2742
1113 3007 3239
1753 2478 3127
0 509 1811
1672 2646 2984
965 1462 3230
3 1077 2917
1183 1316 1662
968 1593 3239
64 1996 2226
1442 2058 3181
513 973 1058
1263 3185 3229
681 1394 3017
419 2853 3217
3 2404 3175
2417 2792 2854
1879 2940 3235
647 1704 3060.

15. The method according to claim 14, wherein
the LDPC code word is encoded based on a parity check matrix of the LDPC code,
the parity check matrix includes an information matrix part corresponding to the information bits and a parity matrix part corresponding to the parity bits,
the information matrix part being represented by the parity check matrix initial value table, and
each roe of the parity check matrix initial value table indicates positions of elements "1 " in corresponding 360 columns of the information matrix part corresponding to a subset of information bits used in calculating the parity bits in the LDPC encoding.

16. The method according to claim 15, wherein a row of the parity check matrix initial value table is represented by i and a length of the parity bits of the LDPC code word is represented by M, a 2+360×(i−1)-th column of the parity check matrix is obtained by a cyclic shift of a 1+360×(i−1)-th column of the parity check matrix indicating a position of an element 1 in the parity check matrix initial value table downward by q=M/360.

17. The method according to claim 16, wherein for the 1+360×(i−1)-th column of the parity check matrix,
an i-th row of the parity check matrix initial value table represents a row number of the element 1 of the 1+360×(i−1)-th column of the parity check matrix, and for each column from the 2+360×(i−1)-th column to a 360×i-th column being a column other than the 1+360×(i−1)-th column of the parity check matrix, an i-th row and j-th column value of the parity check matrix initial value table is represented as $h_{i,j}$ and a row number of a j-th element 1 of a w-th column of a parity check matrix H is represented as $H_{w\text{-}j}$, a row number $H_{w\text{-}j}$ of the element 1 of the w-th column being a column other than the 1+360×(i−1)-th column of the parity check matrix is represented by equation $$H_{w\text{-}j} = \mathrm{mod}(h_{i,j} + \mathrm{mod}((w-1),\ 360) \times M/360,\ M).$$

18. The method according to claim 14, wherein
the parity check matrix has no cycle- 4.

19. The method according to claim 14, wherein
the parity check matrix of the LDPC code belongs to an ensemble in which a performance threshold being signal power/noise power at which a bit error rate starts to decrease is a predetermined value or smaller is found by multi-edge type density evolution.

\* \* \* \* \*

UNITED STATES PATENT AND TRADEMARK OFFICE
CERTIFICATE OF CORRECTION

PATENT NO. : 10,432,225 B2
APPLICATION NO. : 15/965444
DATED : October 1, 2019
INVENTOR(S) : Yuji Shinohara and Makiko Yamamoto It is certified that error appears in the above-identified patent and that said Letters Patent is hereby corrected as shown below:

In the Claims

At Column 64, Line 17, in Claim 7, replace "LDDC" with --LDPC--

At Column 65, Line 22, in Claim 9, replace "q=M360." with --q=M/360.--

At Column 65, Line 33, in Claim 10, replace "matrix value" with --matrix initial value--

At Column 66, Line 63, in Claim 15, replace "roe" with --row--

At Column 66, Line 64, in Claim 15, replace ""1 "" with --"1"--

Signed and Sealed this
Eighteenth Day of April, 2023

Katherine Kelly Vidal
*Director of the United States Patent and Trademark Office*